United States Patent
Eom et al.

(10) Patent No.: US 10,566,521 B2
(45) Date of Patent: Feb. 18, 2020

(54) MAGNETIC MEMORY DEVICES BASED ON 4D AND 5D TRANSITION METAL PEROVSKITES

(71) Applicant: Wisconsin Alumni Research Foundation, Madison, WI (US)

(72) Inventors: Chang-Beom Eom, Madison, WI (US); Tianxiang Nan, Madison, WI (US); Trevor Jeffrey Anderson, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 16/019,831

(22) Filed: Jun. 27, 2018

(65) Prior Publication Data

US 2019/0006581 A1  Jan. 3, 2019

Related U.S. Application Data

(60) Provisional application No. 62/525,885, filed on Jun. 28, 2017.

(51) Int. Cl.
| | |
|---|---|
| *G11C 11/00* | (2006.01) |
| *H01L 43/04* | (2006.01) |
| *H01L 43/10* | (2006.01) |
| *G11C 11/16* | (2006.01) |
| *G11C 11/18* | (2006.01) |
| *H01L 43/14* | (2006.01) |
| *H01L 43/08* | (2006.01) |

(52) U.S. Cl.
CPC ............ *H01L 43/04* (2013.01); *G11C 11/161* (2013.01); *G11C 11/165* (2013.01); *G11C 11/18* (2013.01); *H01L 43/08* (2013.01); *H01L 43/10* (2013.01); *H01L 43/14* (2013.01)

(58) Field of Classification Search
CPC ......... H01L 43/04; H01L 43/08; H01L 43/10; H01L 43/14; G11C 11/18; G11C 11/161; G11C 11/165
USPC ........................................................ 365/158
See application file for complete search history.

(56) References Cited

U.S. PATENT DOCUMENTS

| | | | |
|---|---|---|---|
| 5,695,864 A | 12/1997 | Slonczewski | |
| 6,051,441 A * | 4/2000 | McDowell | ............... G11C 11/14 257/427 |

(Continued)

FOREIGN PATENT DOCUMENTS

WO    WO2015/116414    8/2015

OTHER PUBLICATIONS

Johnsson et al, Crystallography and Chemistry of Perovskites, arxiv.org/pdf/cond-mat/0506606, 2005, pp. 1-11.

(Continued)

*Primary Examiner* — Tha-O H Bui
(74) *Attorney, Agent, or Firm* — Bell & Manning, LLC; Michelle Manning

(57) ABSTRACT

Magnetic switching devices, including magnetic memory devices, are provided. The devices use high-quality crystalline films of 4d or 5d transition metal perovskite having a strong spin-orbit coupling (SOC) to produce spin-orbit torque in adjacent ferromagnetic materials via a strong spin-Hall effect. Spin-orbit torque can be generated by the devices with a high efficiency, even at or near room temperature.

13 Claims, 44 Drawing Sheets

(56) References Cited

U.S. PATENT DOCUMENTS

| | | | |
|---|---|---|---|
| 7,778,063 B2* | 8/2010 | Brubaker | H01L 27/2409 365/148 |
| 9,384,811 B2 | 7/2016 | Apalkov et al. | |
| 9,400,316 B2 | 7/2016 | Fujiwara et al. | |
| 9,627,490 B1* | 4/2017 | Eom | H01L 21/02488 |
| 2005/0106810 A1 | 5/2005 | Pakala et al. | |
| 2007/0269683 A1 | 11/2007 | Chen et al. | |
| 2015/0129995 A1 | 5/2015 | Wang et al. | |
| 2016/0019917 A1 | 1/2016 | Du et al. | |
| 2016/0276574 A1 | 9/2016 | Ohsawa et al. | |
| 2016/0336508 A1 | 11/2016 | Guo | |
| 2017/0179372 A1 | 6/2017 | Braganca | |

OTHER PUBLICATIONS

Kawasaki et al., Evolution of electronic correlations across the rutile, perovskite, and Ruddelsden-Popper iridates with octahedral connectivity, Physical Review B 94 2016, pp. 121104-1 through 121104-6.

Patri et al., Theory of Large Intrinsic Spin Hall Effect in Iridate Semimetals, Scientific Reports, May 23, 2018, pp. 1-10.

Shitade et al., Quantum spin Hall effect in a transition metal oxide Na2IrO3, arXiv:0809.1317v2, Jun. 25, 2009, pp. 1-5.

Nan et al., Anisotropic spin-orbit torque generation in epitaxisl SrIrO3 by symmetry design, arXiv:1808.06650, Aug. 20, 2018, pp. 1-9.

Campbell et al, E23.00015 : Strain Effect on Low Temperature Hall Measurements of Thin Film SrIrO3* (abstract only), Bulletin of the American Physical Society, Mar. 2018, pp. 1 page.

Zhang et al, TEM study of SrIrO3thin films with various thicknesses grown on (0 0 1) SrTiO3substrates synthesized by pulsed laser deposition, Applied Science, 2013, pp. 1-5.

Biswas et al., Growth and engineering of perovskite SrIrO3 thin films, Current Applied Physics, vol. 17, Issue 5, May 2017, pp. 605-614.

Yi et al., Atomic-scale control of magnetic anisotropy via novel spin-orbit coupling effect in La2/3Sr1/3MnO3/SrIrO3 superlattices, PNAS, vol. 113, No. 23, Jun. 7, 2016, pp. 6397-6402.

International Search Report and Written Opinion issued on PCT/US2018/039696, dated Sep. 13, 2018.

* cited by examiner

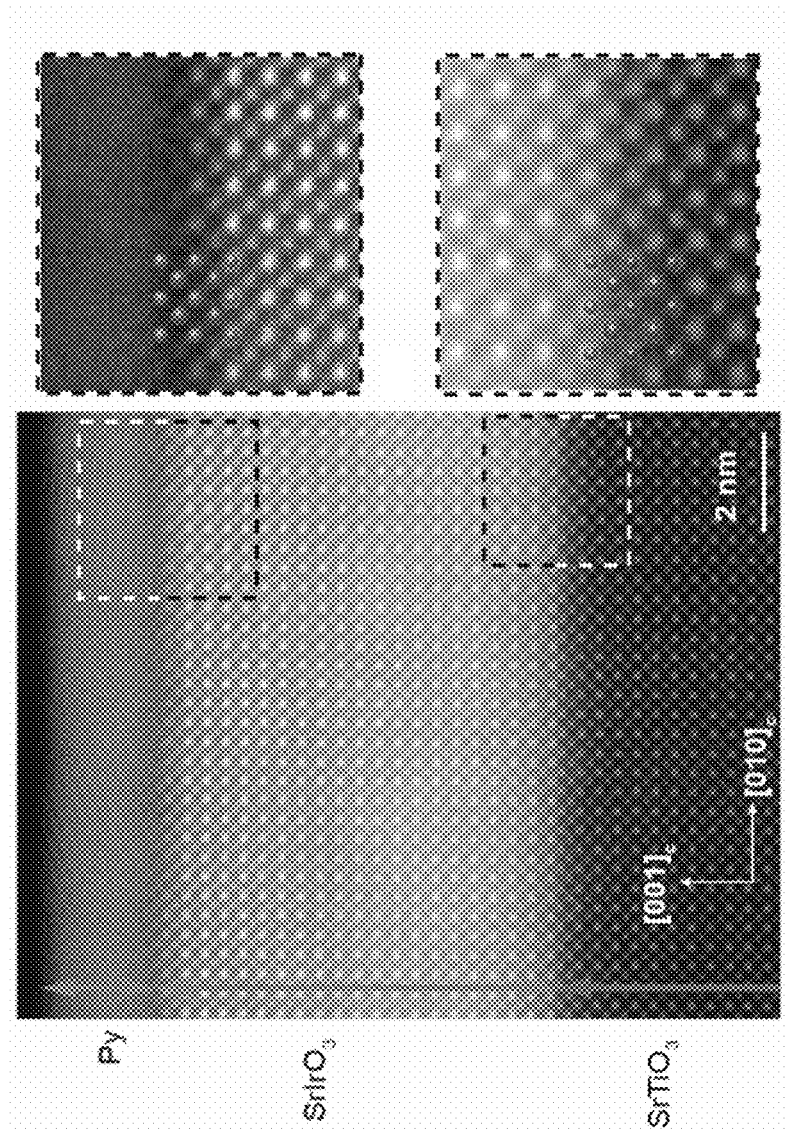
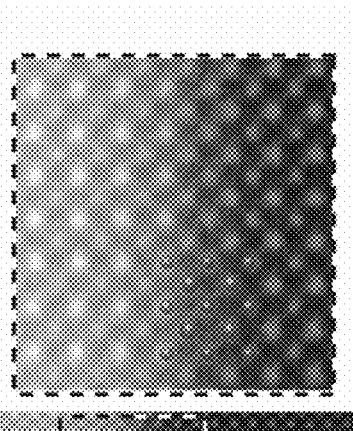
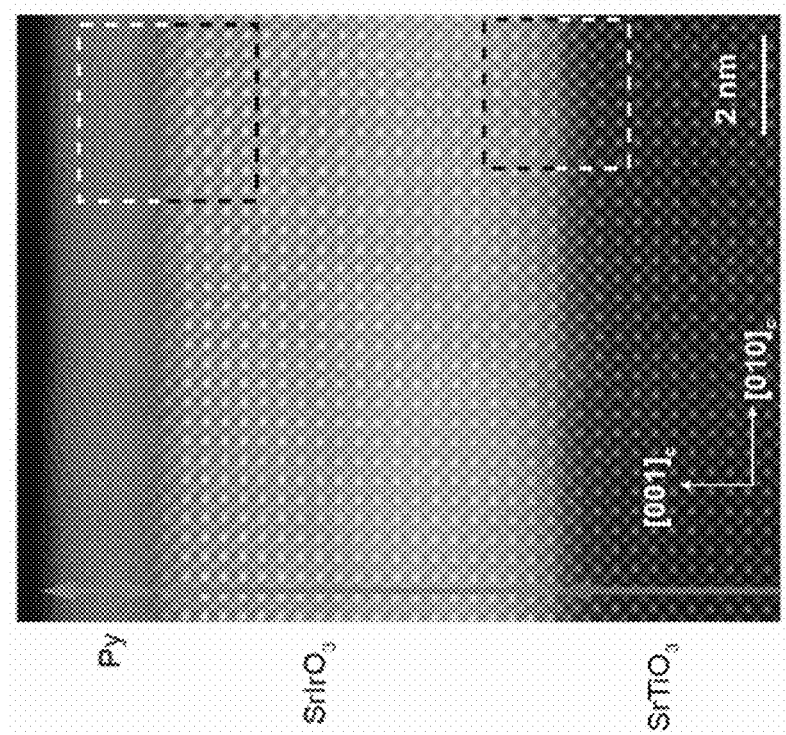
FIG. 1E
FIG. 1F
FIG. 1D

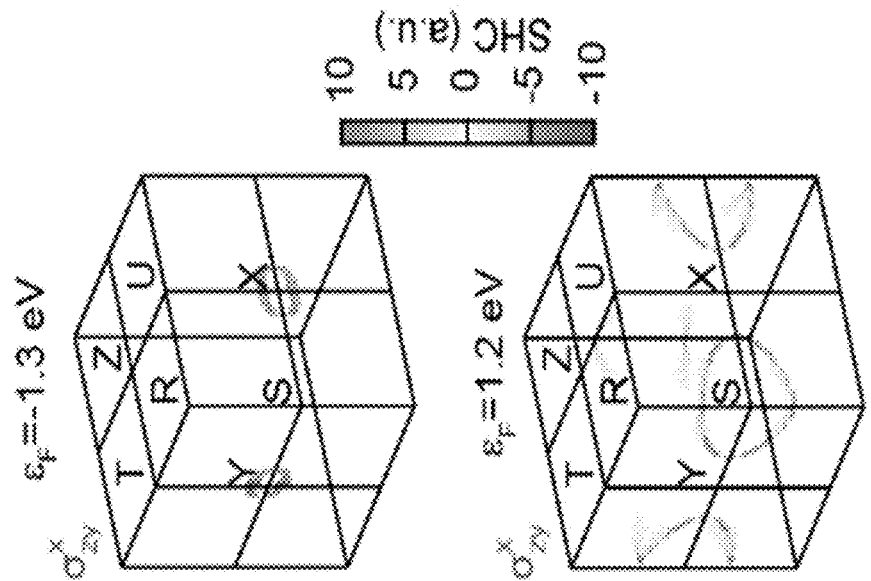
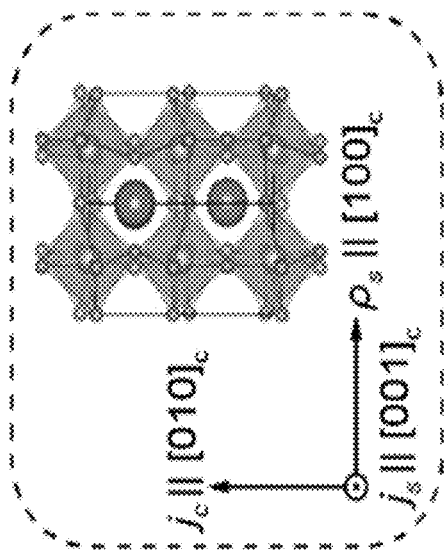
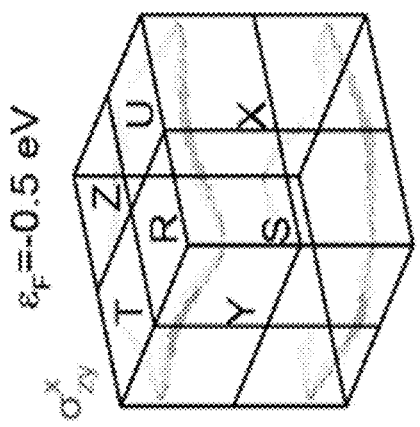
FIG. 4F  FIG. 4H  FIG. 4E  FIG. 4G

MAGNETIC MEMORY DEVICES BASED ON 4D AND 5D TRANSITION METAL PEROVSKITES

CROSS-REFERENCE TO RELATED APPLICATIONS

The present application claims priority to U.S. provisional patent application No. 62/525,885, filed on Jun. 28, 2017, the entire contents of which are hereby incorporated herein by reference.

REFERENCE TO GOVERNMENT RIGHTS

This invention was made with government support under DMR1234096 awarded by the National Science Foundation. The government has certain rights in the invention.

BACKGROUND

Current-induced spin-torque originating from spin-orbit effects offers an energy-efficient scheme for the electrical manipulation of magnetic devices. A large spin-orbit torque ratio, the figure of merit of spin-orbit torque generation, is highly-desirable for enabling broad applications in spintronics. Great effort has been focused on semiconductors, heavy metals, oxides and, more recently, topological insulators with a spin-momentum locked surface state.

SUMMARY

Magnetic switching devices, including magnetic memory devices, are provided. Also provided are methods of switching the magnetic moment of a layer of ferromagnetic material in a magnetic switching device and methods of reading and writing memory in a spin-torque magnetoresistance random access memory cell.

One embodiment of a magnetic switching device includes: a substrate; a layer of electrically conductive, epitaxial, single-crystalline 4d or 5d transition metal perovskite on the substrate, wherein the substrate induces a compressive or tensile strain in the layer of electrically conductive, epitaxial, single-crystalline 4d or 5d transition metal perovskite; a layer of ferromagnetic material on the layer of electrically conductive, epitaxial, single-crystalline 4d or 5d transition metal perovskite; a first electrode in electrical communication with the layer of electrically conductive, epitaxial, single-crystalline 4d or 5d transition metal perovskite; and a second electrode in electrical communication with the layer of electrically conductive, epitaxial, single-crystalline 4d or 5d transition metal perovskite. The first electrode and the second electrode are configured to pass a charge current through the layer of electrically conductive, epitaxial, single-crystalline 4d or 5d transition metal perovskite.

One embodiment of a method of switching the magnetic moment of a layer of ferromagnetic material in a magnetic switching device of the type described herein includes passing a charge current through the layer of electrically conductive, epitaxial, single-crystalline 4d or 5d transition metal perovskite, whereby a perpendicular spin polarized current is generated in the layer of electrically conductive, epitaxial, single-crystalline 4d or 5d transition metal perovskite and directed into the layer of ferromagnetic material, producing a spin-orbit torque in the ferromagnetic material that switches the magnetic moment of the ferromagnetic material.

One embodiment a spin-torque magnetoresistance random access memory cell includes: a substrate; a layer of electrically conductive, epitaxial, single-crystalline 4d or 5d transition metal perovskite on the substrate, wherein the substrate induces a compressive or tensile strain in the layer of electrically conductive, epitaxial, single-crystalline 4d or 5d transition metal perovskite; and a magnetic tunnel junction on the layer of electrically conductive, epitaxial, single-crystalline 4d or 5d transition metal perovskite. The magnetic tunnel junction includes: a free layer interfaced with the layer of electrically conductive, epitaxial, single-crystalline 4d or 5d transition metal perovskite, the free layer comprising an epitaxial layer of ferromagnetic material; a dielectric spacer layer on the free layer; and a fixed layer comprising a ferromagnetic material on the dielectric spacer layer.

One embodiment of a method of reading and writing memory in a spin-torque magnetoresistance random access memory cell of the type described here entails passing an in-plane charge current through the layer of electrically conductive, epitaxial, single-crystalline 4d or 5d transition metal perovskite, whereby a perpendicular spin polarized current is generated in the layer of electrically conductive, epitaxial, single-crystalline 4d or 5d transition metal perovskite and directed into the free layer, producing a spin-orbit torque in the free layer that switches the magnetic moment of the free layer; and measuring the resistance of the magnetic tunnel junction.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 1A-1F show the mechanism of the spin-Hall effect in $SrIrO_3$ and the structural characterization of the $Py/SrIrO_3/SrTiO_3$ system. FIG. 1A shows the electron band structure of the bulk orthorhombic perovskite $SrIrO_3$. FIG. 1B depicts energy dispersion for the bulk $SrIrO_3$ and momentum-resolved spin-Hall conductivity at the $k_b=\pi$ plane. The arcs at the bottom represent the momentum-resolved spin-Hall conductivity, which is the net Berry curvature summed over occupied electron levels below a given Fermi level. FIG. 1C shows the $SrIrO_3$ crystal structure. FIG. 1D depicts a scanning transmission electron microscope image of $Py/SrIrO_3/SrTiO_3$. FIG. 1E shows an expanded image of the top $Py/SrIrO_3$ interface, showing the high quality $SrIrO_3$ film with atomically-sharp interfaces. FIG. 1F shows an expanded image of the bottom $SrIrO_3/SrTiO_3$ interface, showing the high quality $SrIrO_3$ film with atomically-sharp interfaces. The stacking of the atomic constituents is highlighted in the blown-up images by the superimposed filled dots with different shades.

FIG. 2A is a schematic of a $Py/SrIrO_3$ bilayer on $SrTiO_3$ (001) and the current-induced torque geometries (left); and the atomic structure of the $Py/SrIrO_3/SrTiO_3$ (right). FIG. 2B shows the ST-FMR spectrum (fitted to a Lorentzian function, solid line) for a 3.5 nm Py/8 nm (20 uc) $SrIrO_3$ sample with microwave current applied along the $[010]_c$ axis. The dashed lines represent the fits of the symmetric and antisymmetric components. The external magnetic field is oriented at an angle $\varphi=-45°$ with respect to the current axis. The applied microwave frequency and power are 5.5 GHz and 12 dBm. The $V_{mix}$ across the device bar is acquired by a dc voltage meter. FIG. 2C shows symmetric and antisymmetric resonance components as a function of the external magnetic field angle φ, which are fitted to sin 2φ cos φ. FIG. 2D shows in-plane crystallographic orientation (current applied along from $[100]_c$ to $[010]_c$ with reference to the substrate crystallographic directions) dependence of the measured spin-torque ratio. The external magnetic field angle is fixed at φ=45°. The solid line shows the fit to $\sin(\psi+\psi_0)$.

FIG. 3A shows resonance linewidth and effective magnetic damping as a function of dc current density in $SrIrO_3$ for $Py/SrIrO_3$. FIG. 3B shows resonance linewidth and effective magnetic damping as a function of dc current density in $Py/SrRuO_3$ with both positive and negative external magnetic field. The solid lines represent linear fitting.

FIGS. 4A-4H depict control of spin-Hall conductivity with lattice symmetry stabilization and the calculations from linear response theory. FIG. 4A shows SHC $\sigma_\parallel$ of a $Py/SrIrO_3$ bilayer (with Py thickness fixed at 3.5 nm) as a function of $SrIrO_3$ thickness. FIG. 4B shows the thickness dependent orthorhombicity factor, defined as a/b, of $SrIrO_3$. The dashed line represents a trend for the $SrIrO_3$ crystalline symmetry transition. FIG. 4C shows schematic illustrations of the $SrIrO_3$ lattice symmetry change originating from the $IrO_6$ octahedral distortion that is dependent on thickness when grown on $SrTiO_3$. FIG. 4D shows bulk SHC calculated for three different measurement geometries ($\sigma_{zy}^x$, $\sigma_{zy}^y$, $\sigma_{zy'}^{y'}$,) as a function of Fermi energy $\in_F$. The measurement geometry is specified by the three indices of $\sigma_{\mu\nu}^{\rho s}$: υ (direction of external electric field), μ (direction of induced spin current), and $\rho_s$ (spin polarization direction). FIG. 4E is a schematic illustration of the $SrIrO_3$ lattice and the corresponding film experimental configuration of 3 orthogonal vectors. FIG. 4F shows momentum-resolved SHC $\Omega_{zy}^x(k)$ in the Brillouin zone at a Fermi level=−1.3 eV. FIG. 4G shows momentum-resolved SHC $\Omega_{zy}^x(k)$ in the Brillouin zone at a Fermi level=−0.5 eV. FIG. 4H shows momentum-resolved SHC $\Omega_{zy}^x(k)$ in the Brillouin zone at a Fermi level=1.2 eV. As the Fermi level increases, the distribution of $\Omega_{zy}^x(k)$ changes in accordance with the shape of the Fermi surface.

FIG. 5A shows RHEED intensity data of $SrIrO_3$ growth showing clear layer-by-layer growth of a 20 uc (8 nm) $SrIrO_3$ thin film on $SrTiO_3$ (001) substrate. The RHEED pattern at the end of the growth (right inset) indicates a high quality $SrIrO_3$ thin film with minimal surface roughening compared to that of the $SrTiO_3$ substrate (left inset). FIG. 5B depicts atomic force microscopy images of a treated $SrTiO_3$ substrate and subsequently deposited heterostructure of 1 nm $AlO_x$/3 nm Py/8 nm $SrIrO_3$ showing near preservation of the atomically smooth $SrTiO_3$ substrate surface.

FIG. 6A shows a 2θ-ω x-ray scan of 30 uc (12 nm) $SrIrO_3$ thin film on $SrTiO_3$ (001) substrate showing single-phase $SrIrO_3$ with thickness oscillations indicating a smooth surface and sharp interface with the substrate. FIG. 6B depicts a φ-scan of the $SrIrO_3$ film showing its equivalent pseudocubic epitaxial arrangement with the underlying $SrTiO_3$ substrate. FIG. 6C shows reciprocal space mapping around the (−103) $SrTiO_3$ substrate peak confirming the fully coherent in-plane lattice of the $SrIrO_3$ film on the $SrTiO_3$ substrate.

FIG. 7A shows integrated reciprocal space mappings around the {103} pseudocubic reflection of 8, 12, 16, and 20 uc $SrIrO_3$ films on $SrTiO_3$ (001) substrates. The separation of the (103) and (−103) film peak positions, which indicate an out-of-plane tilt of the $SrIrO_3$ film due to the coherent epitaxial strain from the substrate, is shown to decrease to zero from 20 uc to 8 uc, indicating a global $SrIrO_3$ suppression of the distorted orthorhombic tilt to a near tetragonal-like structure. FIG. 7B shows the intensity of the orthorhombic (221) $SrIrO_3$ peak, which decreases from 20 to 8 uc. FIG. 7C depicts an intensity comparison of the $SrIrO_3$ (103) pseudocubic and (221) orthorhombic peak intensities as a function of film thickness.

FIG. 8A shows microwave power dependence of the symmetric and antisymmetric components of the mixed voltage $V_{mix}$ for a 3.5 nm Py/20 uc $SrIrO_3$ bilayer sample (20 μm×40 μm) at f=5.5 GHz and φ=−135°. FIG. 8B shows the resistance R of the same device as a function of the external magnetic field angle φ. ΔR is fitted to cos(2φ) for extracting dR/dφ. FIG. 8C shows applied microwave power (squares) and dc current (circles) induced device resistance change due to Joule heating effect. FIG. 8D shows the frequency dependent spin torque ratio of a 20 uc $SrIrO_3$ sample determined from ST-FMR line shape (squares) and dc-tuned (circles) analysis.

FIG. 9A shows a ST-FMR spectra for a $Py/SrIrO_3$ sample at various f (4.5-6.5 GHz) and with the external magnetic field $H_{ext}$ angle of 45° and −135°. The inset shows an optical image of the device layout and ST-FMR measurement circuit. FIG. 9B shows dependence of the frequency f on the resonance magnetic field $H_{FMR}$. The data is fitted to the Kittel equation, which gives an effective magnetization of 0.85 T. FIG. 9C depicts frequency f dependence of the resonance linewidth W. The solid curve shows the fit to a linear function, which gives a Gilbert damping coefficient of 0.011.

FIG. 10A shows the change of resonance linewidth as a function of applied current and the corresponding current density in $SrIrO_3$ for the 3.5 nm $Py/SrIrO_3$ with the $SrIrO_3$ thickness of 8 uc. FIG. 10B shows the change of resonance linewidth as a function of applied current and the corresponding current density in $SrIrO_3$ for the 3.5 nm $Py/SrIrO_3$ with $SrIrO_3$ thickness of 12 uc. FIG. 10C shows the change of resonance linewidth as a function of applied current and the corresponding current density in $SrIrO_3$ for 3.5 nm $Py/SrIrO_3$ with $SrIrO_3$ thickness of 16 uc. FIG. 10D shows the change of resonance linewidth as a function of applied current and the corresponding current density in $SrIrO_3$ for 3.5 nm $Py/SrIrO_3$ with $SrIrO_3$ thickness of 20 uc. The solid lines represent linear fitting. All measurements were taken with the external magnetic field applied at φ=−135°. The microwave power is 12 dBm and the frequency was 5.5 GHz. FIG. 10E shows the $SrIrO_3$ thickness dependence of the spin orbit ratio $\theta_\parallel$ determined by the dc biased ST-FMR measurements. FIG. 10F shows the $SrIrO_3$ thickness dependence of the Gilbert damping parameter α determined by ST-FMR and broadband FMR measurements. The dashed curve represents the fit to the diffusive spin-pumping model.

FIG. 11A depicts an ST-FMR spectra for an in-situ (squares) and an ex-situ (circles) deposited sample. The microwave power is fixed at 12 dBm at a frequency of f=6 GHz. The external magnetic field $H_{ext}$ is oriented at an angle φ=45° with respect to the current axis. FIG. 11B shows an ST-FMR spectrum of a bare 10 nm Py control sample taken at φ=45° and f=5.5 GHz. The microwave power is fixed at 12 dBm.

FIG. 12A is ST-FMR spectra for the 4 nm Pt/4 nm Py/SrTiO$_3$ sample with different applied $I_{dc}$ at φ=−135°. The microwave power was fixed at 12 dBm and the frequency at 5.5 GHz. FIG. 12B shows the zoom-in view of the resonance peak shown in FIG. 12A. FIG. 12C shows resonance linewidth and effective magnetic damping as a function of applied current and the corresponding current density in Pt for the Pt/Py. The solid line represents linear fitting. FIG. 12D depicts spin torque ratio and the spin Hall conductivity of the Pt/Py bilayer measured at various microwave frequencies.

FIG. 13A shows the temperature dependence of the resistivity of the 20 uc SrIrO$_3$/SrTiO$_3$ sample with the current applied along both SrTiO$_3$ [100] and [010] directions. FIG. 13B shows SrIrO$_3$ the room temperature resistivity and the current fraction of the 3.5 nm Py/SrIrO$_3$/SrTiO$_3$ with various SrIrO$_3$ thicknesses.

DETAILED DESCRIPTION

Figure 1A:
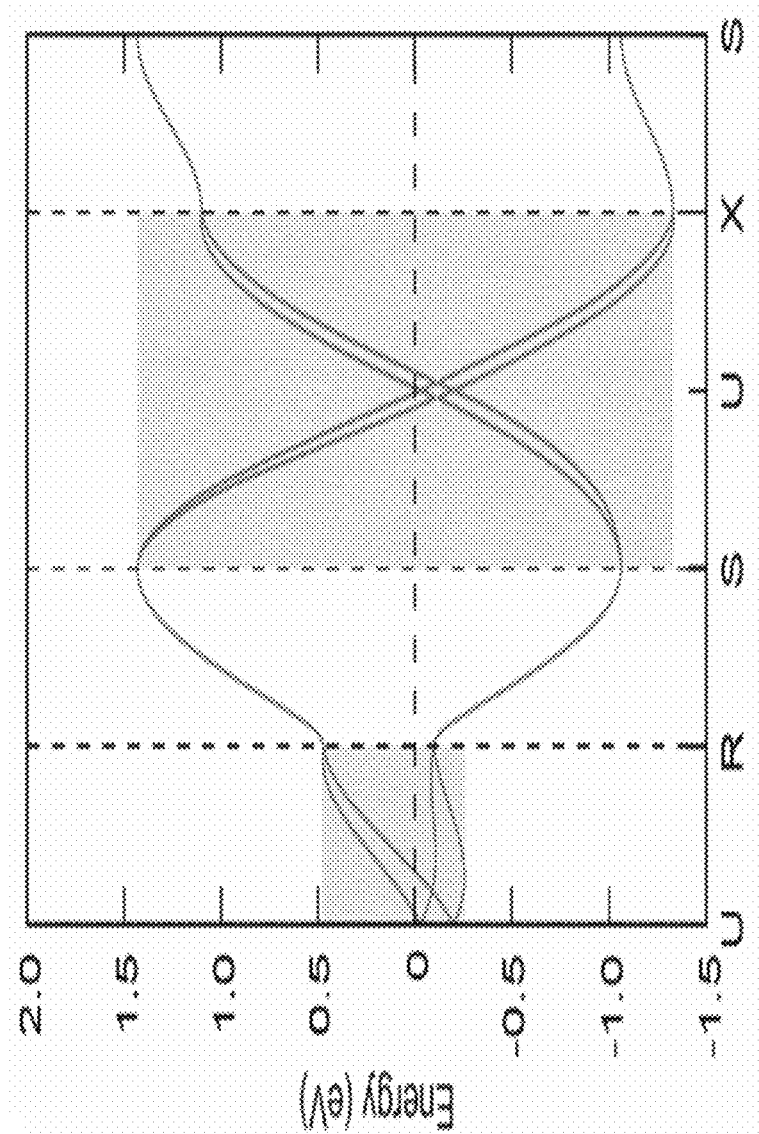

Magnetic switching devices, including magnetic memory devices, are provided. The devices use single-crystalline films of epitaxially grown 4d or 5d transition metal perovskites having a strong spin-orbit coupling (SOC) to produce spin-orbit torque in adjacent ferromagnetic materials via the spin-Hall effect. In embodiments of the devices, the spin-orbit torque can be generated with a high efficiency, even at or near room temperature (e.g., ~23° C.).

One embodiment of a magnetic switching device includes a substrate, a layer of electrically conductive, epitaxial, single-crystalline 4d or 5d transition metal perovskite on the substrate, and a layer of ferromagnetic material on the layer of electrically conductive, epitaxial, single-crystalline 4d or 5d transition metal perovskite. In the switching device, the magnetic moment of the ferromagnetic material can be switched by passing a charge current through the layer of electrically conductive, epitaxial, single-crystalline 4d or 5d transition metal perovskite, whereby a perpendicular spin polarized current is generated in the layer of electrically conductive, epitaxial, single-crystalline 4d or 5d transition metal perovskite and directed into the layer of ferromagnetic material. This produces a spin-orbit torque in the ferromagnetic material, which switches the spins of electrons in the ferromagnetic material.

4d or 5d transition metal perovskites are oxides having the formula ABO$_3$, where A is a first metal cation, such as an alkaline earth metal cation, and B is a 4d or 5d transition metal cation. The crystal structures of the perovskites are characterized by BO$_6$ octahedra having shared corners in a three-dimensional arrangement, with the A cations occupying sites between the octahedra. The 4d or 5d transition metal perovskites used in the present devices and methods are characterized by an octahedral connectivity in which BO$_6$ octahedral building blocks in the crystal structure are tilted with respect to an ideal cubic structure.

The octahedral tilt in the 4d or 5d transition metal perovskite can be achieved or enhanced by growing the perovskites epitaxially on a growth substrate that induces a compressive strain or a tensile strain on the perovskite film as a result of a lattice mismatch between the growth substrate and the growing perovskite. As a result, the BO$_6$ octahedra in the crystal structure become tilted. As illustrated in the Examples, these tilted octahedra can provide an enhanced spin-Hall effect in the film.

In some embodiments of the 4d or 5d transition metal perovskites, A is an alkaline earth metal, such as Sr or Ba. Examples include SrIrO$_3$ and SrRuO$_3$.

The 4d or 5d transition metal perovskites can be grown epitaxially as high-quality, single-crystalline films. Epitaxial single-crystalline films are characterized in that the single-crystal grows with a particular orientation determined by the single-crystal growth substrate upon which it is grown. The epitaxial films can form atomically sharp interfaces with their growth substrate and with an epitaxial ferromagnetic layer subsequently grown on the 4d or 5d transition metal perovskite. As used herein, the phrase single-crystalline film refers to films having perfect crystallinity and also to nearly perfect single-crystalline films having a small concentration of defects, such as dislocations, where the number of defects is low enough that the performance of a device incorporating the film is not significantly degraded. The atomically sharp interfaces provide for efficient spin current transmission and spin-orbit torque generation.

A variety of device configurations of the 4d or 5d transition metal perovskite films can be patterned along different in-plane crystallographic directions, using, for example, photolithography. By way of illustration, UV exposure and subsequent ion-milling can be used to provide a 4d transition metal perovskite film or a 5d transition metal perovskite film having a [010] in-plane crystallographic orientation (where [010] refers to the cubic substrate crystallographic direction). As illustrated in Example 1, this can give rise to a spin-orbit torque in an adjacent ferromagnetic material that is higher than the spin-orbit torques generated by different crystallographic directions, such as [100].

A variety of substrates can be used for epitaxial growth, provided they allow for the epitaxial growth of a perovskite layer up to a useful critical thickness. In some embodiments of the devices, a 4d or 5d transition metal perovskite film is grown to a thickness in the range from 1 nm to 50 nm. However, film thicknesses outside of this range can be used, since a high-quality film can be maintained for thicker films (>50 nm). However, for a given amount of current flow (i.e., same amount of Joule heating), the current density in thicker films may be lower than the current density in thinner films.

In other words, given the same efficiency (spin-Hall angle), devices based on thicker films consume more energy. For this reason, thinner films may be desirable for applications in which low energy consumption is important. Ultrathin perovskite films can be used. However, the film should not be so thin that it becomes insulating, which would suppress the spin-Hall effect in the material.

The growth substrate can be selected such that it has a small lattice mismatch with the 4d or 5d transition metal perovskite and, as a result, imparts a lattice-mismatch induced strain to the perovskite, which distorts the unit cell in the crystal structure of the perovskite. Perovskites, including oxide perovskites having the $ABO_3$ crystal structure, can be used as epitaxial growth substrates for other perovskites. One illustrative example of a growth substrate for a 4d or 5d transition metal perovskite, such as $SrIrO_3$, is the cubic perovskite $SrTiO_3$ (001). Other examples include $DyScO_3$, $GdScO_3$, $NdScO_3$, LSAT ($[LaAlO_3]_{0.3}[Sr_2AlTaO_6]_{0.7}$), $LaAlO_3$, and $NdGaO_3$ substrates. The epitaxial growth substrate may be a multilayered substrate comprised of a growth layer formed on an underlying base layer. For example, in some embodiments the substrate includes a growth layer that is grown or deposited onto an underlying silicon wafer.

The ferromagnetic material can be, for example, a metal, a metal alloy, including a Heusler alloy, or a metal oxide. Suitable transition metals and transition metal alloys include: Ni, Fe, Co and alloys thereof (for example, Ni—Fe alloys, Fe—Co alloys, Ni—Co alloys, Fe—Co—B alloys, Fe—Ga alloys, Co—Pd alloys, Co—Pt alloys, and Fe—Pd alloys). Heusler alloys include $Co_2MnSi$, $Co_2FeSi$, $Co_2FeAl$, $Co_2MnAl$, $Co_2MnGa$, and $Co_2FeGe$. Metal oxides include $Y_3Fe_5O_{12}$, $Fe_3O_4$, $ZnFe_2O_4$, $MgFe_2O_4$, $MnFe_2O_4$, $CoFe_2O$, $NiFe_2O_4$, $LaSrMnO_3$, $LaMnO_3$, $LaCaMnO_3$, $LaBaMnO_3$, $Sr_2FeMoO_6$, $Sr_2CrMoO_6$.

In some embodiments of the switching devices, the ferromagnetic material is grown epitaxially on the 4d or 5d transition metal perovskite layer. This is advantageous because it produces a high-quality, single-crystalline film with a sharp interface between the 4d or 5d transition metal perovskite and the ferromagnetic material, which allows for very efficient spin current transmission. However, the ferromagnetic material can also be formed by other means. For example, metal layers and metal alloy layers, can be deposited via sputter deposition as polycrystalline layers comprising randomly oriented grains. In some devices, the ferromagnetic material is provided as one layer in a multilayered structure, such as a magnetic tunnel junction (MTJ). In an MTJ, the layer of ferromagnetic material that forms an interface with the 4d or 5d transition metal perovskite film provides a first ferromagnetic layer (a free layer) that is separated from a second, generally thicker, ferromagnetic layer (a fixed layer) by a thin layer of a non-magnetic material (a spacer layer), as described in greater detail with respect to FIG. 15A, below. A capping layer can be provided over any exposed surfaces of the ferromagnetic materials to prevent or reduce the oxidation of those materials. Metal oxides, such an $Al_2O_3$, can be used as a capping layer.

The magnetic switching devices can be used for a variety of spin-orbit torque-based switching applications, including logic and memory devices. In a basic embodiment of a magnetic memory device a pair of electrodes is configured to pass a charge current through the 4d or 5d transition metal perovskite layer. This generates a spin current in the 4d or 5d transition metal perovskite, which is passed into the adjacent layer of ferromagnetic material. As a result, a spin-orbit torque is produced and the spins of electrons in the material are flipped. This spin-orbit torque can be very high. For example, in some embodiments of the devices, the spin-orbit torque is at least 1, as measured by spin-torque ferromagnetic resonance (ST-FMR). Methods for measuring spin-orbit torque via ST-FMR are described in the Examples.

Figure 15A:
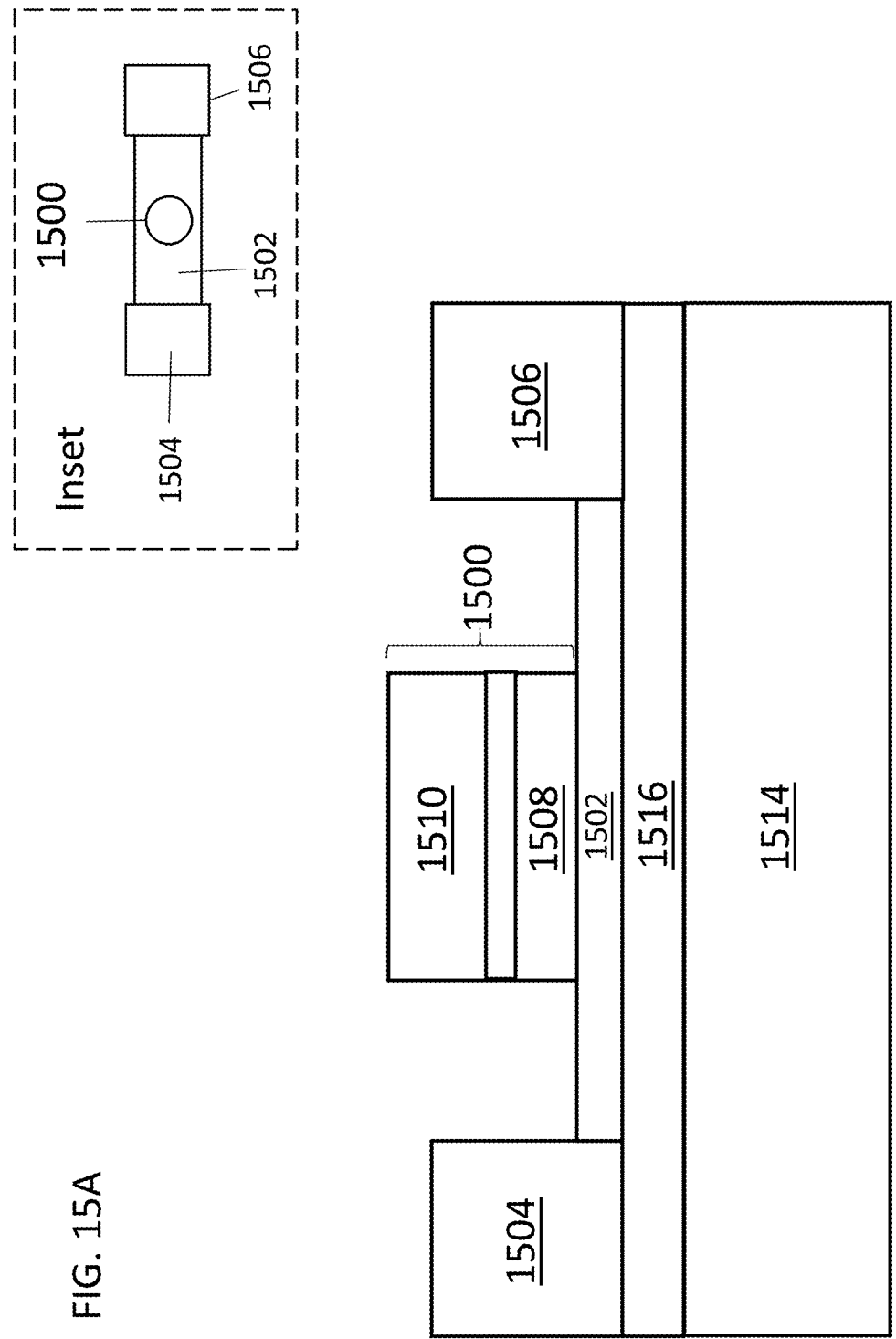
FIG. 15A is a schematic diagram of a spin-torque magnetoresistance random access memory cell.
Figure 15B:
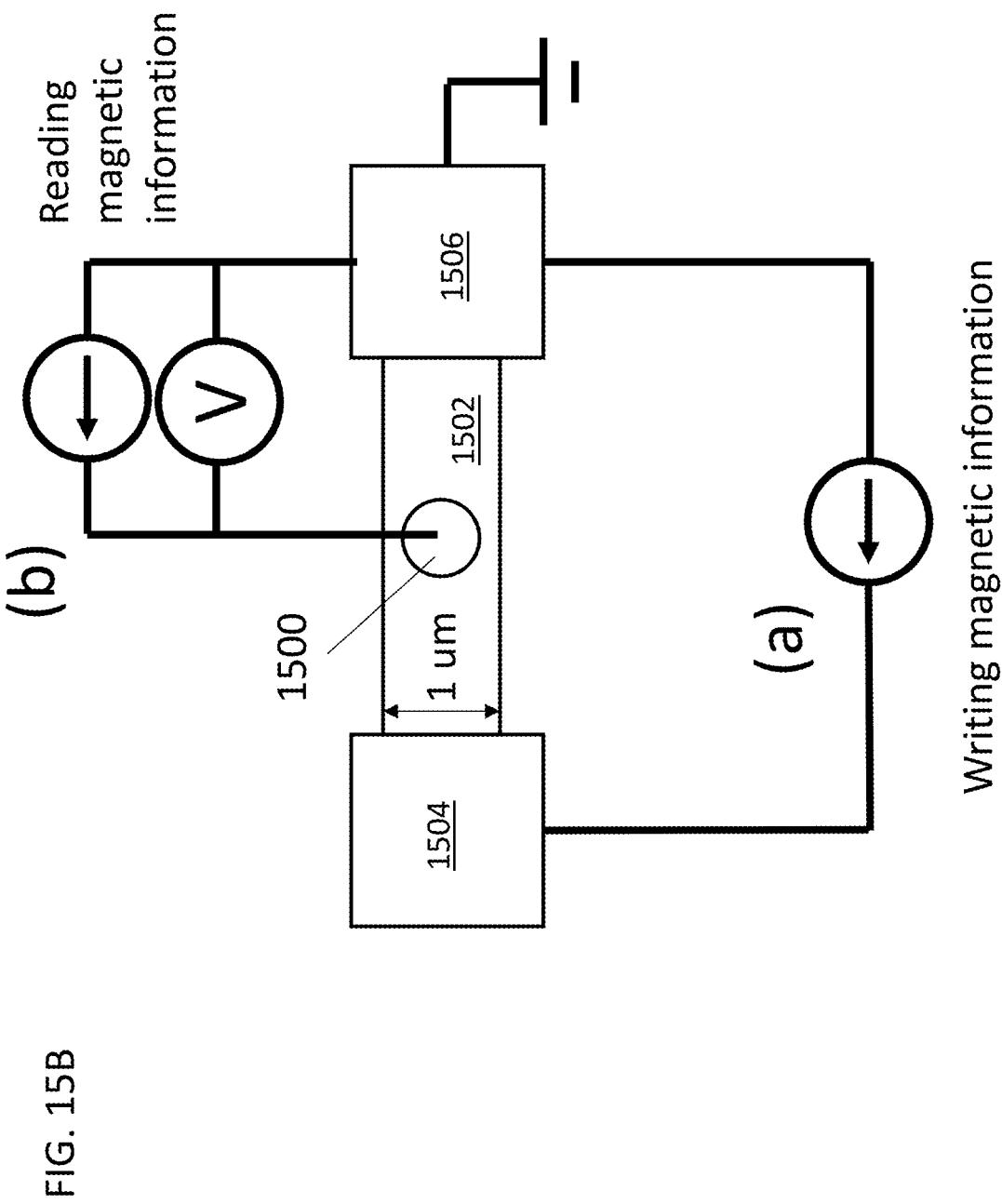
FIG. 15B shows a circuit configuration for the memory cell of FIG. 15B.

FIG. 15A is a schematic diagram of a top view of a spin-torque magnetoresistance random access memory (ST-MRAM) cell. A side view is provided in the inset. FIG. 15B shows a circuit configuration for the STT-MRAM cell. This embodiment of a three terminal STT-MRAM cell includes a magnetic tunnel junction (MTJ) 1500 on the layer of 4d or 5d transition metal perovskite 1502, such as $SrIrO_3$, which provides a spin-Hall layer. A first electrode 1504 and a second electrode 1506 are positioned in electrical communication (direct or indirect) with layer of 4d or 5d transition metal perovskite 1502, such that they are configured to pass an in-plane charge current through that layer, as illustrated in FIG. 15B. The electrodes may be a metal, such as gold or copper. The MTJ includes a lower ferromagnetic layer (the free layer) 1508 interfaced with layer of 4d or 5d transition metal perovskite 1502, a thicker, upper ferromagnetic layer (the fixed layer) 1510, and a dielectric spacer layer 1512 that serves as a tunnel barrier between lower and upper ferromagnetic layers 1508, 1510. A variety of ferromagnetic materials and non-magnetic materials can be used for the layers of ferromagnetic material and the spacer layer, respectively. By way of illustration, the upper and lower ferromagnetic layers can be $LaSrMnO_3$ layers and the spacer layer can be an oxide, such as $SrTiO_3$. The structure can be grown epitaxially on top of a growth substrate, which, in this embodiment, includes a base layer 1514 and a growth layer 1516. These may be, for example, a silicon base layer and a $SrTiO_3$ growth layer. In order to achieve a high current density, layer of 4d or 5d transition metal perovskite 1502 can be made with a low width and the MTJ can be fabricated with a small diameter. For example, in some embodiments of memory cells, the layer of 4d or 5d transition metal perovskite has a width of no greater than 2 μm, including embodiments in which the layer of 4d or 5d transition metal perovskite has a width of no greater than 1 μm. In some embodiments of the memory cells, the MTJ has a diameter of no greater than 1 μm, including embodiments in which the MTJ has a diameter of no greater than 500 nm.

When the memory cell carries out a write operation, the in-plane charge current flow through the layer of 4d or 5d transition metal perovskite gives rise to a perpendicular spin current in the free layer of the MTJ via the spin-Hall effect. This switches the magnetic moment of the free layer and modulates the resistance of the MTJ. Generally, the MTJ will be in a low resistance state when the magnetization of the free layer is aligned with the magnetization of the fixed layer. The memory cell can be read by measuring the resistance of the MTJ using a resistance measuring device. This can be done by, for example, sending a small sensing current to the tunnel junction to generate a sensing voltage, which can be detected (e.g., by a voltmeter) and used to measure the resistance, as illustrated in FIG. 15B.

Figure 16A:
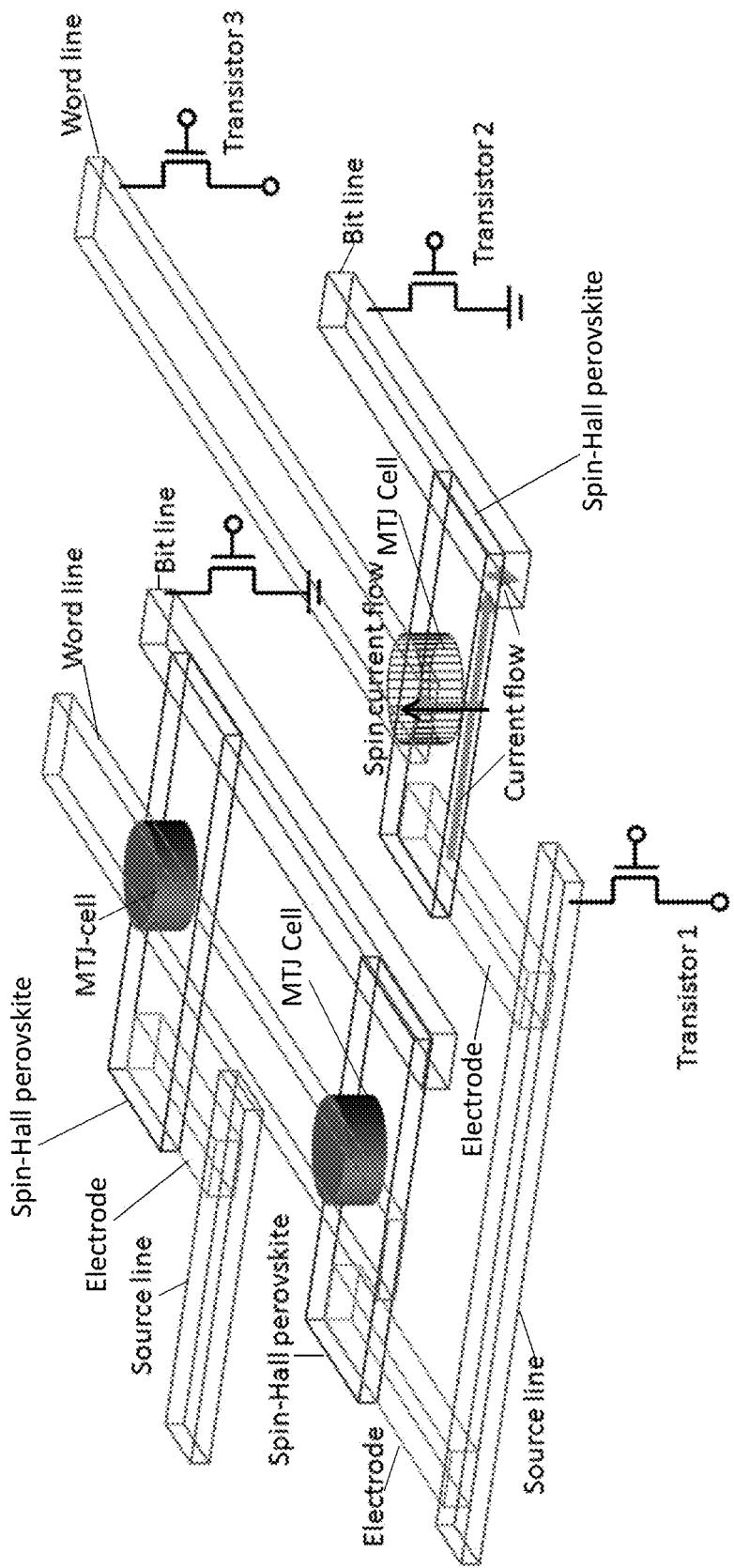
FIG. 16A is a schematic diagram showing a three-dimensional view of a magnetic memory cell array.
Figure 16B:
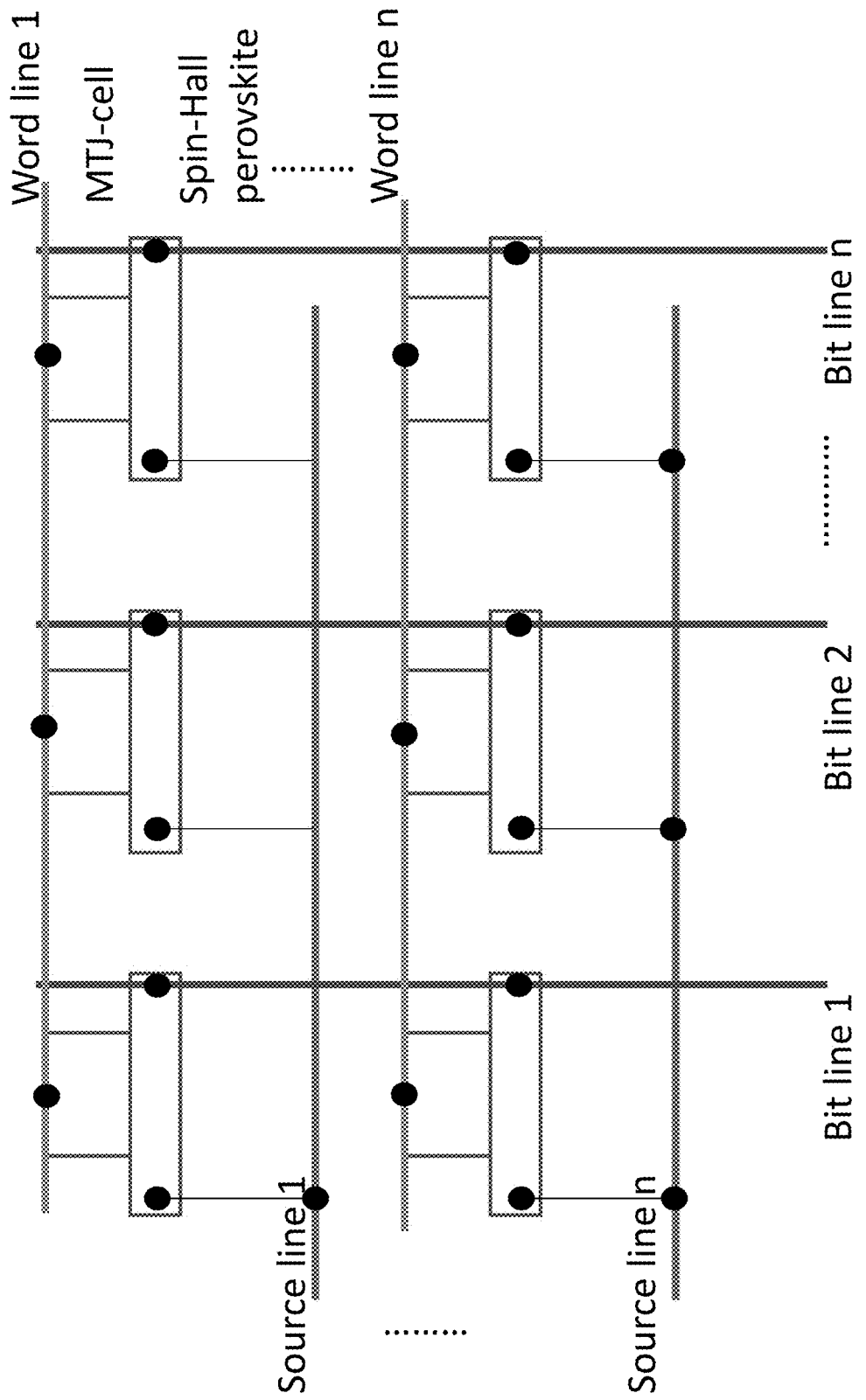
FIG. 16B is a schematic diagram showing a two-dimensional view of a magnetic memory cell array.

A magnetic memory device can be constructed by connecting a plurality of the magnetic memory cells in an array. One embodiment of such an array is shown schematically in FIG. 16A (3D view) and FIG. 16B (2D view). In the array, the MTJ cells and their respective 4d or 5d transition metal perovskite layers (spin-Hall layers) serve as memory elements, which are connected by a grid of source lines, bit lines and word lines, with electrodes connecting the source lines to the spin-Hall layers. The various lines and electrodes are made of electrically conductive materials, such as metals (e.g., Au, Cu, and the like). The array operates as follows: to write a target bit, transistors 1 and 2 on the bit's source line and bit line, respectively, are turned on to create a charge current flow into the target spin-Hall 4d or 5d transition metal perovskite. The source line sources a large charge current (which can be several milliamps, depending on the critical current for magnetization switching). The charge current generates a transverse spin current in the MTJ cell and switches the magnetization of the free layer in the MTJ cell. To read a target bit, transistors 2 and 3 on the bit's bit line and word line, respectively, are turned on. The word line sources a small current for detecting the resistance of MTJ cell.

EXAMPLES

Example 1

Figure 1B:
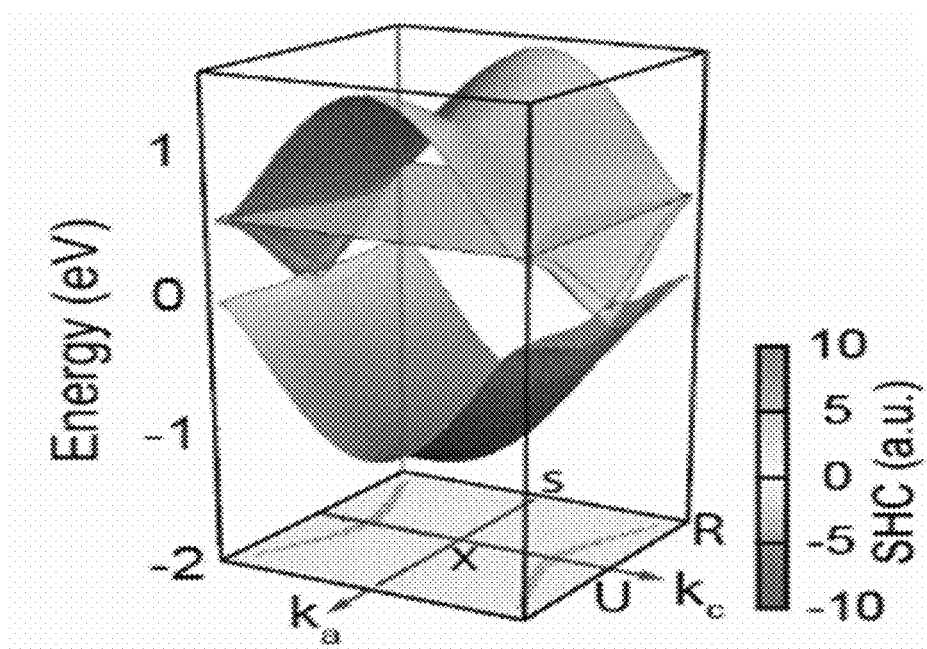
Figure 1C:
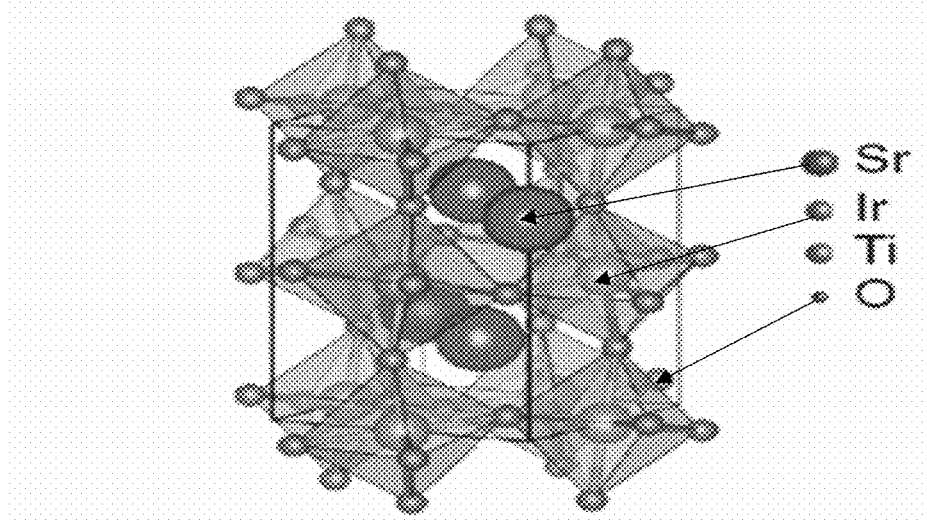

In this example, it is theoretically predicted that large spin-Hall effect is present in the $SrIrO_3$ (FIG. 1C) 3D bulk semi-metallic electronic band structure arising from the intrinsic Berry curvature (see FIGS. 1A and 1B). An unexpectedly large spin-Hall conductivity (SHC) is obtained from a linear response theory for the bulk system. Such a large response originates from the characteristic structure of nearly degenerate energy bands (shaded in FIG. 1A) occurring as a combined effect of spin-orbit coupling and oxygen octahedral tilting in the bulk system. Surprisingly, an even larger SHC was found from experiments on $SrIrO_3$ films than predicted by theory, in which the observed SHC was comparable to the topological insulators at room temperature.

High-quality single-crystal $SrIrO_3$ thin films were synthesized on $SrTiO_3$ (001) substrates by pulsed laser deposition. Ferromagnetic Permalloy $Ni_{81}Fe_{19}$(Py) thin films were then sputtered on $SrIrO_3$ in the same chamber without breaking the vacuum. This in situ synthesis preserves the interface transparency for the spin-current transmission and the efficiency of SOT generation. The bilayers were then capped with ~1 nm $Al_2O_3$ to prevent oxidation of Py. A reference control sample with a non-perfect Py/$SrIrO_3$ interface created by breaking the vacuum before Py deposition showed a much smaller SOT generation. Atomic force microscopy images of the 1 nm $Al_2O_3$/3.5 nm Py/8 nm (20 unit cell, uc) $SrIrO_3$ surface revealed an atomically-smooth surface preserving the substrate step-terrace. In FIG. 1D, the cross-sectional filtered STEM-HAADF image of a 20 uc $SrIrO_3$ film on (001) $SrTiO_3$ capped with 2.5 nm Py is shown. Here, the contrast of the image is approximately proportional to the atomic number Z where brighter colors represent heavier elements (heaviest atom in this case being Ir). From the image, it was determined that the $SrIrO_3$ shares the same pseudocubic epitaxial arrangement as the $SrTiO_3$ substrate, with sharp interfaces between both the $SrTiO_3$/$SrIrO_3$ interface and the $SrIrO_3$/Py interface. The $SrTiO_3$ substrates were treated to ensure that they were $TiO_2$ surface terminated, which means $IrO_2$-termination for the $SrIrO_3$ films is expected, which is observed in the image (FIGS. 1E and 1F).

Figure 2A:
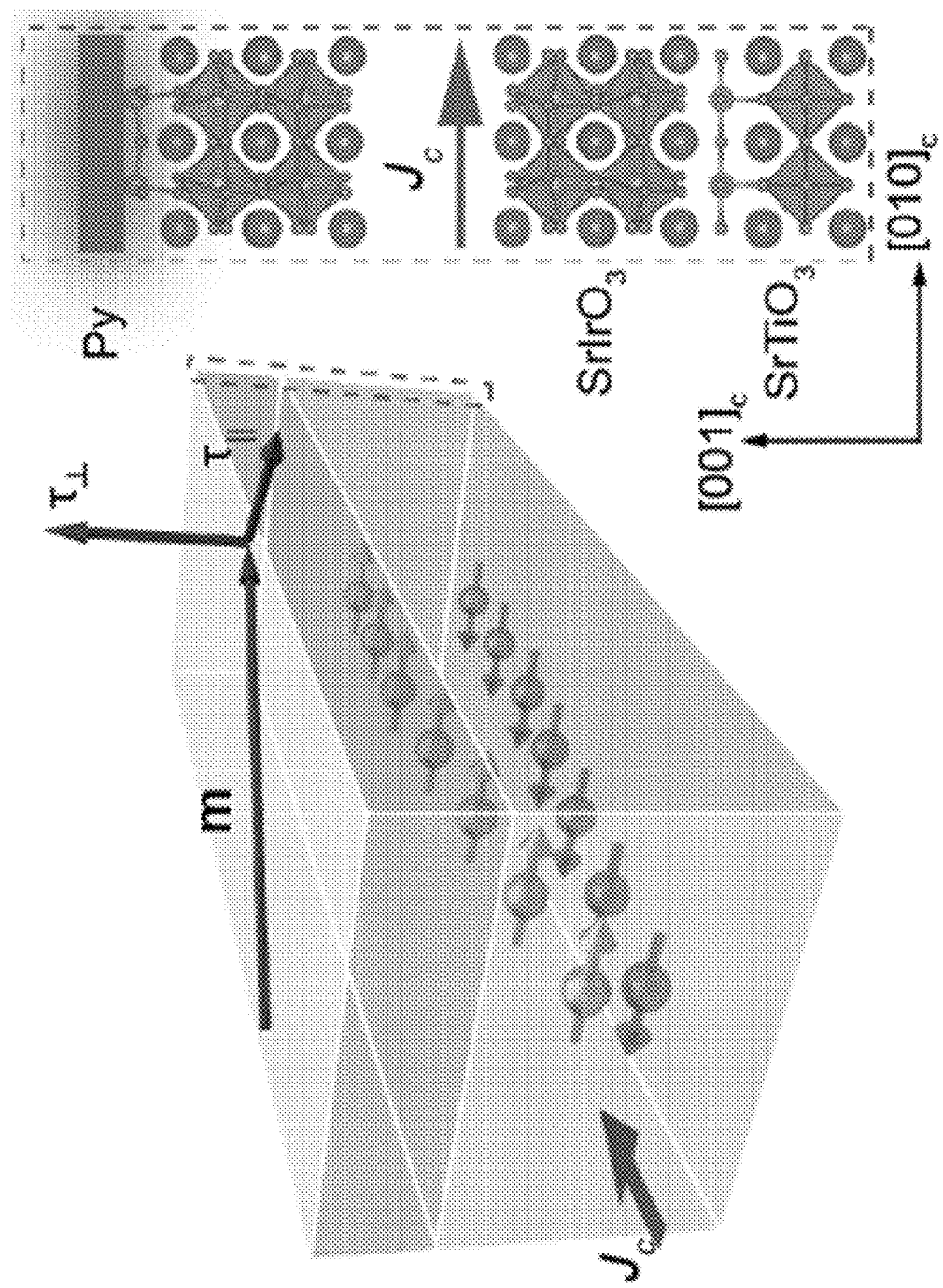
FIGS. 2A-2D show ST-FMR measurements and a line shape analysis.

The spin-Hall effect in $SrIrO_3$ was probed by measuring the spin-orbit torques in the adjacent Py layer by using the spin-torque ferromagnetic resonance (ST-FMR) technique, as illustrated in the schematic of the Py/$SrIrO_3$ bilayer system (FIG. 2A). (See, Liu, L., et al., Spin-torque ferromagnetic resonance induced by the spin Hall effect. *Phys. Rev. Lett.* 106, 036601 (2011); Mellnik, A. R. et al., Spin-transfer torque generated by a topological insulator. *Nature* 511, 449-451 (2014); Nan, T. et al. Comparison of spin-orbit torques and spin pumping across NiFe/Pt and NiFe/Cu/Pt interfaces. *Phys. Rev. B* 91, 214416 (2015).) When an alternating charge current flowed in $SrIrO_3$, due to the spin-Hall effect, spin accumulated at the interfaces and induced a spin current that flows into Py. This spin current exerted torque on the Py and excited the magnetic moment into precession, generating an alternating change of the resistance due to the anisotropic magnetoresistance (AMR) in Py. A dc voltage signal $V_{mix}$ was measured across the device bar that arose from the mixing between the alternating current and changes in the device resistance. The resonance spectrum was obtained at a fixed microwave frequency, and with an in-plane external magnetic field swept through the ferromagnetic resonance condition in Py.

Figure 2B:
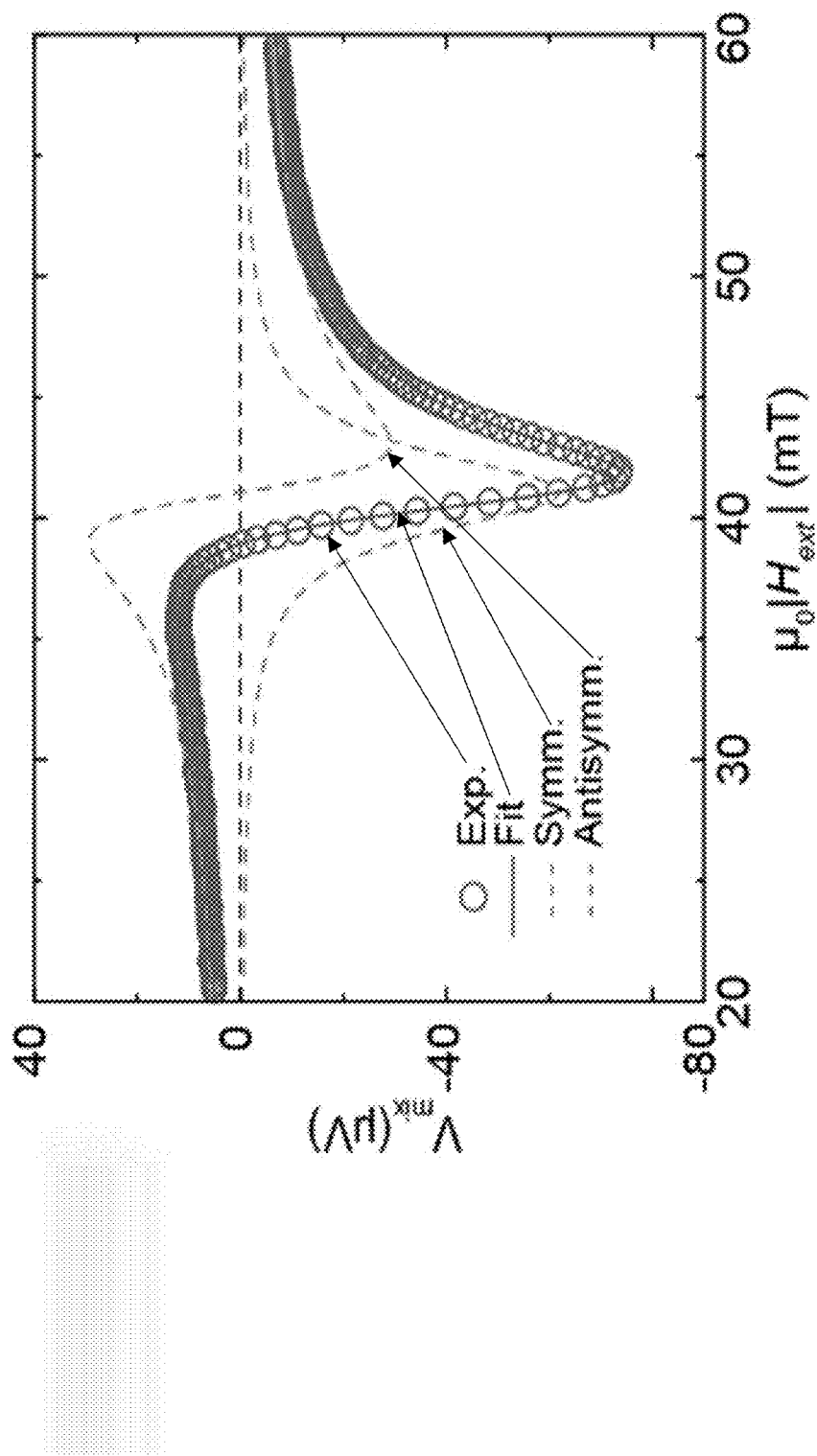
Figure 2C:
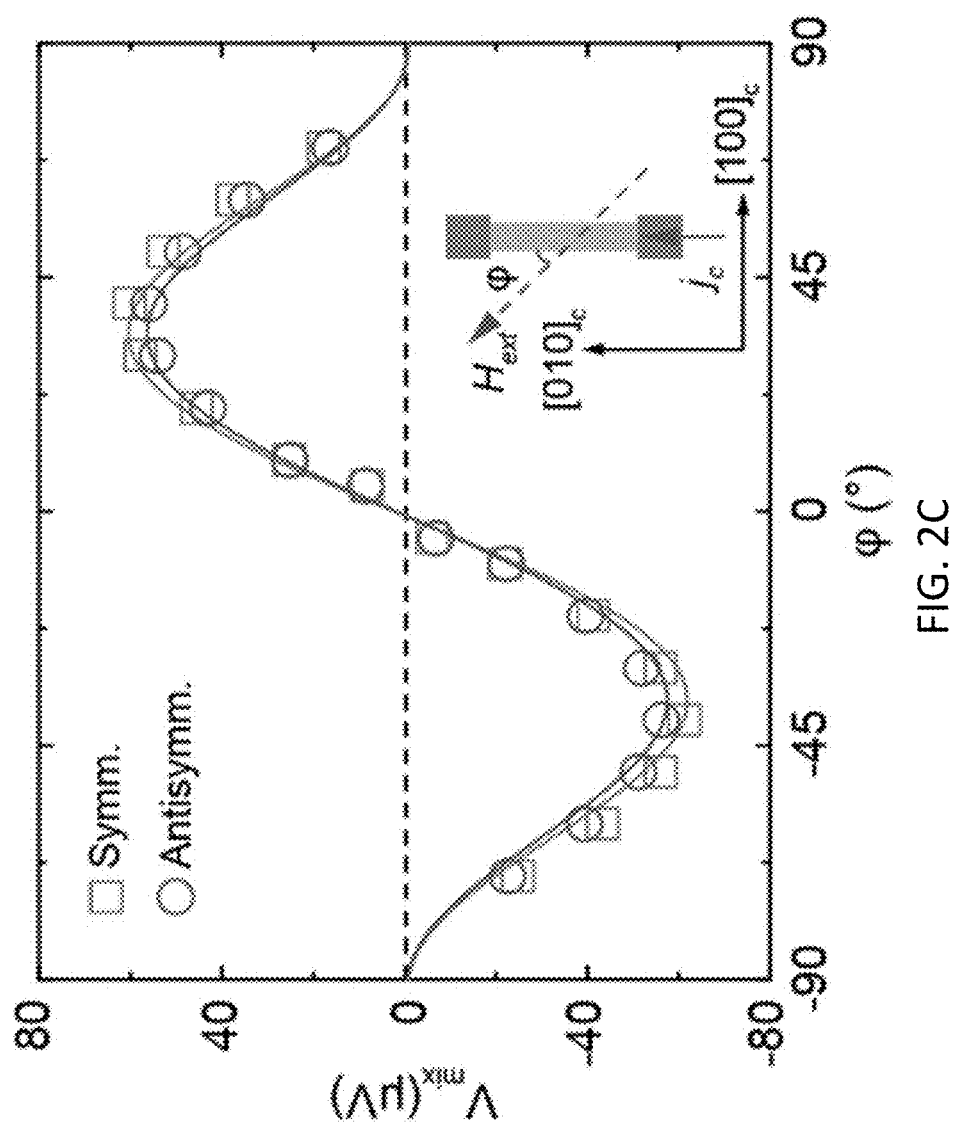

FIG. 2B shows a typical ST-FMR spectrum for a 3.5 nm Py/8 nm (20 uc) $SrIrO_3$ sample (20 µm×40 µm) with a microwave current applied along the substrate $[010]_c$ axis (subscript c for pseudocubic notation). The in-plane magnetic field is swept at an angle $\varphi=-45°$ with respect to the current axis. The resonance line shape is well fitted to a sum of symmetric and antisymmetric Lorentzian components (dark and light dashed curves), where the anti-damping (in-plane, $\tau_\parallel$) and field torque (out-of-plane, $\tau_\perp$) components are proportional to the amplitudes of the symmetric and antisymmetric line shape, respectively. As shown in FIG. 2C, the symmetric and antisymmetric components both depend on $\varphi$ according to the form $\sin(2\varphi)\cos\varphi$, which can be interpreted as the product of the contributions from AMR in Py [$dR/d\varphi \propto \sin(2\varphi)$] and the current-induced torque ($\tau \propto \cos\varphi$). (See, Liu, L., et al., Spin-torque ferromagnetic resonance induced by the spin Hall effect. *Phys. Rev. Lett.* 106, 036601 (2011); Mellnik, A. R. et al., Spin-transfer torque generated by a topological insulator. *Nature* 511, 449-451 (2014).) From the symmetric and antisymmetric amplitudes, it was found that the in-plane $\sigma_\parallel$ and out-of-plane torque conductivity $\sigma_\perp$ (torque per unit electric field) was $(1.4\pm0.2)\times10^5$ $\hbar/2e$ $\Omega^{-1}$ $m^{-1}$ and $(2.9\pm0.5)\times10^4$ $\hbar/2e$ $\Omega^{-1}$ $m^{-1}$, respectively, by averaging different measurement frequencies (4.5 to 7 GHz). The sign for $\sigma_\parallel$ was consistent with the first-principle calculations for bulk $SrIrO_3$ and that of the heavy metal Pt. The magnitude of $\sigma_\parallel$ was comparable to that of Pt which has a much larger charge conductivity $\sigma$ than $SrIrO_3$. This indicated a large value for the spin-torque ratio $\theta_\parallel (=2e/\hbar \sigma_\parallel/\sigma)$, figure of merit (generation of anti-damping torque per unit charge current density), for $SrIrO_3$ of 0.55±0.08, which is about one order of magnitude higher than that reported for Pt thin films. (See, Sinova, J., et al., Spin Hall effects. *Rev. Mod. Phys.* 87, 1213-1260 (2015).) From the sign of $\sigma_\perp$, the out-of-plane field-like torque was oriented in the same direction as the torque from the Oersted field that comes from the current in $SrIrO_3$. However, the value for $\sigma_\perp$ was larger than the expected Oersted field $\sigma_{Oe}=1.3\times10^4$ $\hbar/2e$ $\Omega^{-1}m^{-1}$ estimated by Ampere's law. Besides the strong spin-Hall effect from $SrIrO_3$, the Rashba-Edelsein effect at the Py/$SrIrO_3$ interface could also contribute to the observed field-like torque.

Figure 2D:
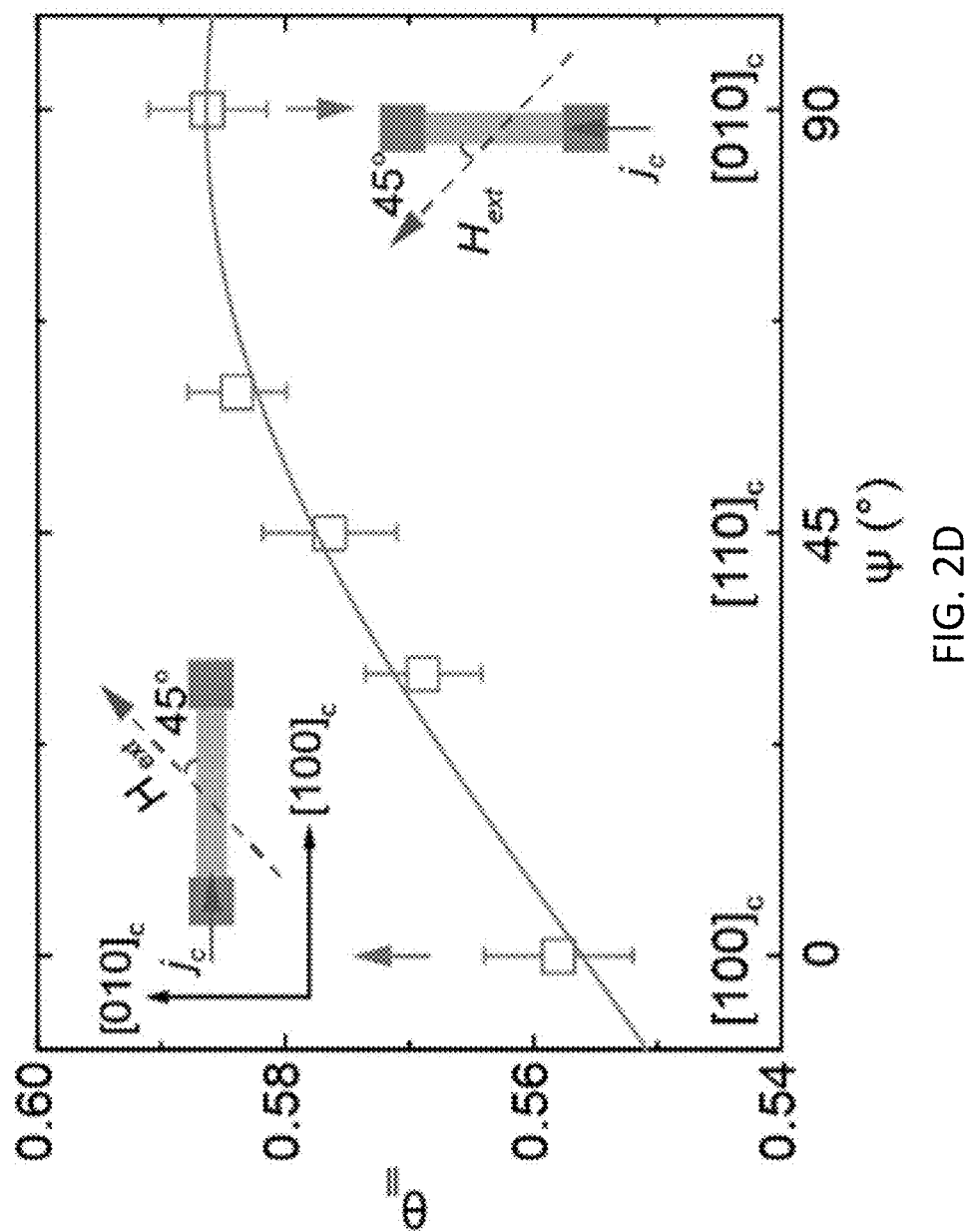

The crystal orientation dependence of the spin-torque ratio as shown in FIG. 2D was also investigated. The ST-FMR measurements were performed on devices patterned along various in-plane crystal orientations from the $[100]_c$ axis or $[-110]_o$ (subscript o for orthorhombic notation) to $[010]_c$ or $[001]_o$ while keeping the magnetic field angle at $\varphi=45°$. The crystal orientation dependent $\Delta\theta_\parallel$ could be fitted to $\sin(\psi-\psi_0)$, where $\psi$ is the angle between the $[100]_c$ and the current axis, and $\psi_0$ accounts for the misalignment between the device pattern and the crystal orientation. Note that the higher $\theta_\parallel$ axis along the $[010]_c$ coincided with the lower resistivity axis of the $SrIrO_3$ thin.

Figure 3A:
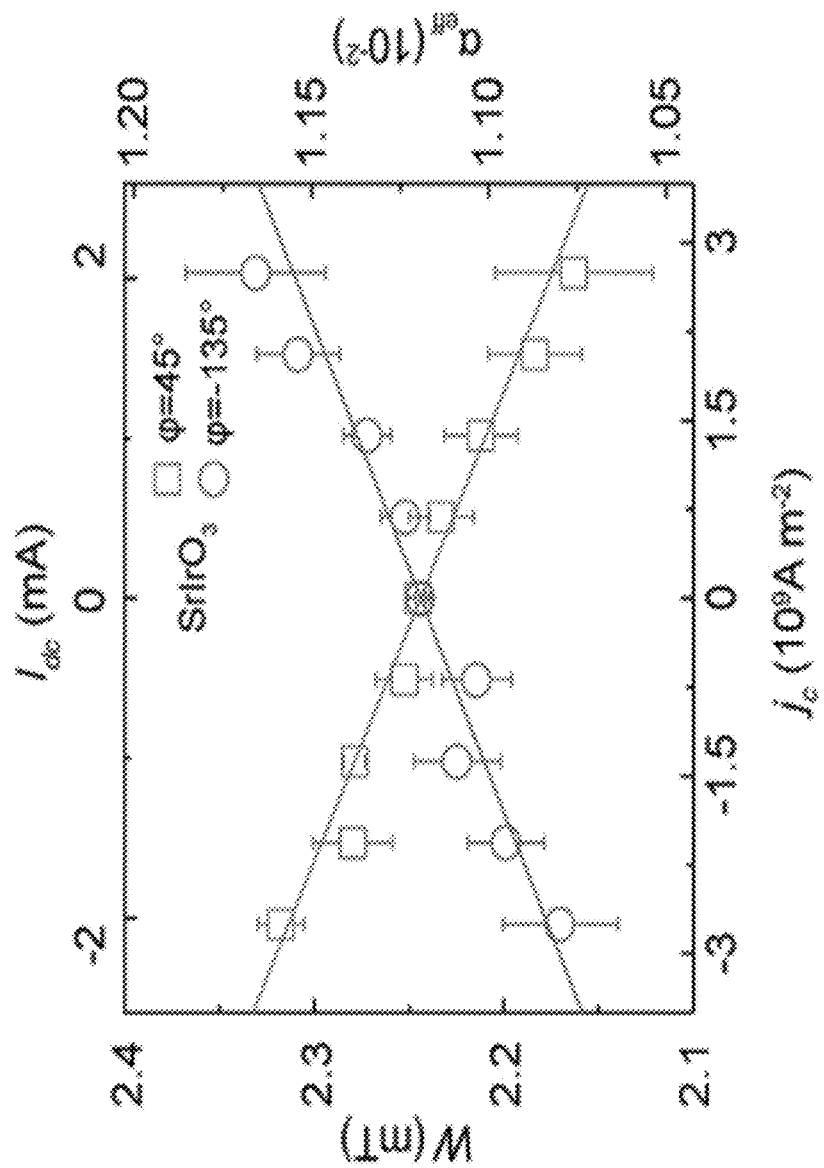
FIGS. 3A and 3B show ST-FMR measurements with dc-biased currents.
Figure 3B:
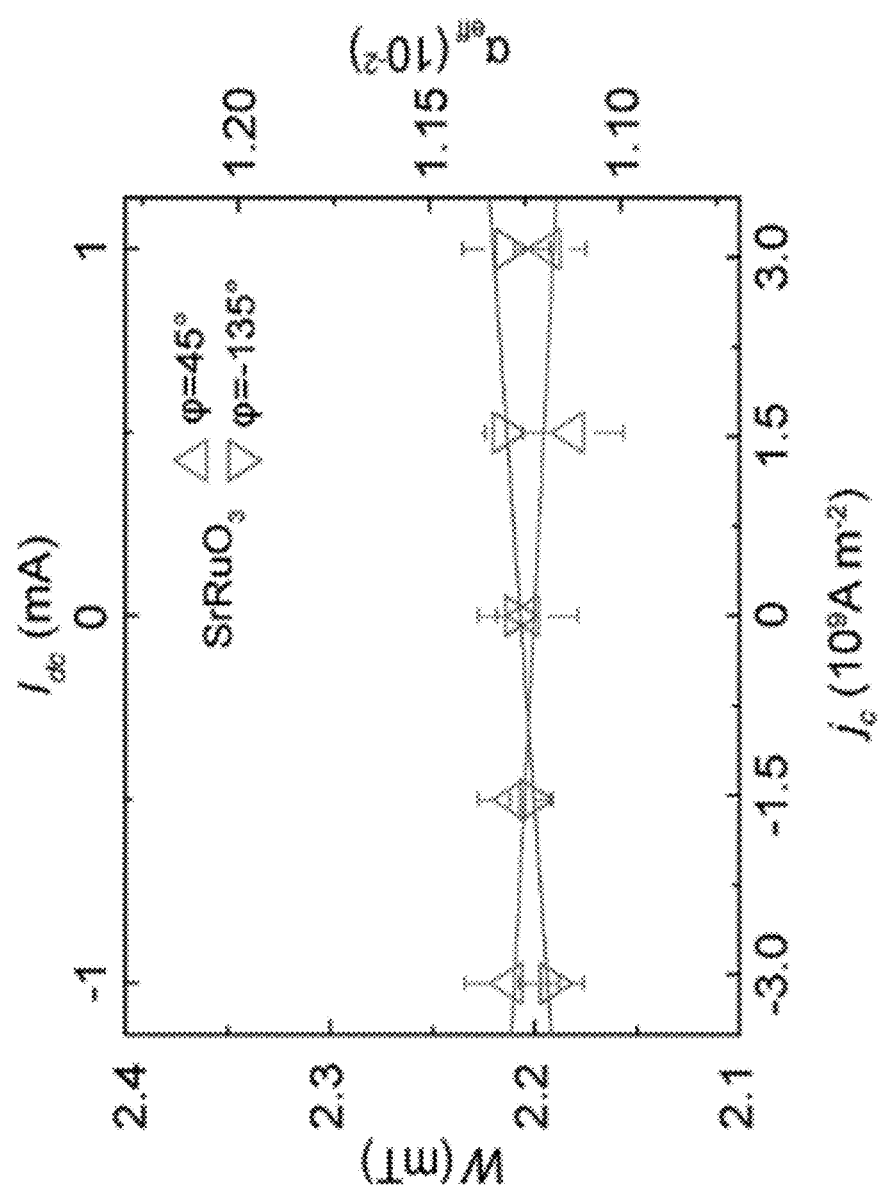
Figure 3C:
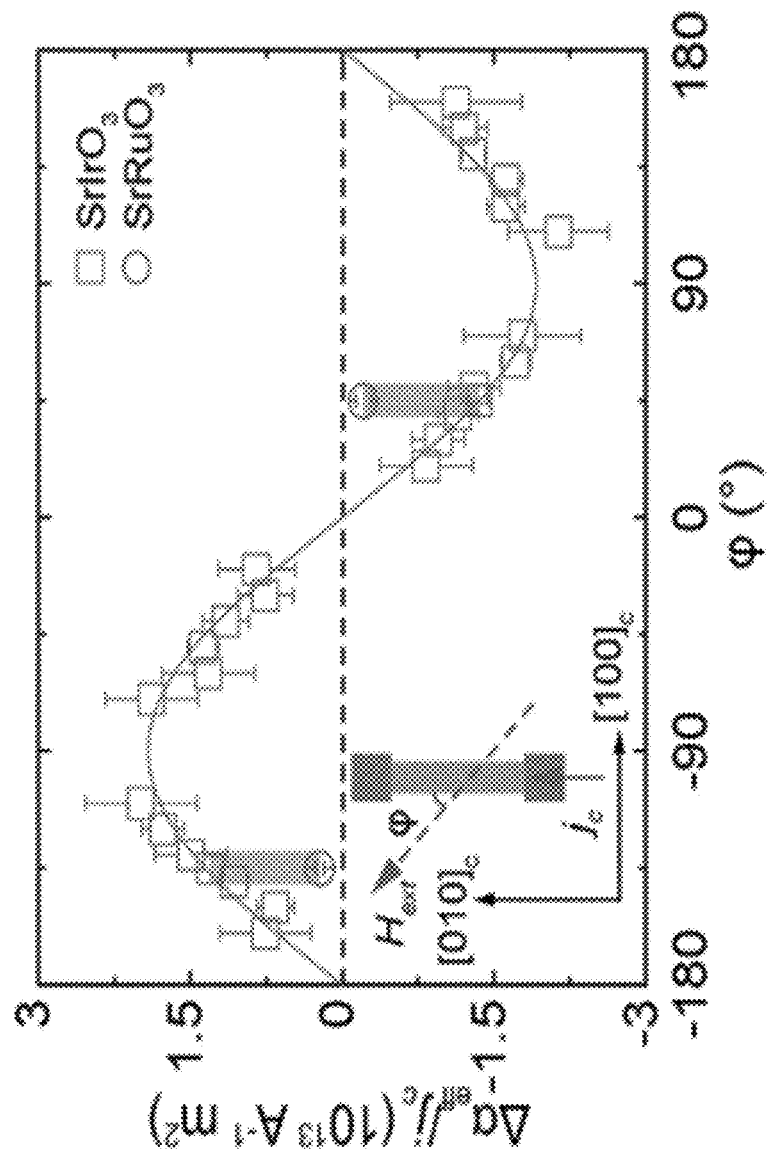
FIG. 3C shows current-induced modulation of Py effective damping as a function of external magnetic field angle for the $Py/SrIrO_3$ sample. The solid line shows the fit to sin φ. The $Py/SrRuO_3$ data points are taken at φ=45° and −135°.

The exceptionally large spin-torque ratio in SrIrO$_3$ was further confirmed by measuring the dc current-induced transformation of the ST-FMR resonance. (See, Liu, L., et al., Spin-torque ferromagnetic resonance induced by the spin Hall effect. *Phys. Rev. Lett.* 106, 036601 (2011); Nan, T. et al. Comparison of spin-orbit torques and spin pumping across NiFe/Pt and NiFe/Cu/Pt interfaces. *Phys. Rev. B* 91, 214416 (2015).) The injection of the dc current exerted an additional dc spin-torque on the adjacent Py. The dc in-plane torque component modified the relaxation of the Py magnetization precession, modulating its resonance linewidth, as this torque component was parallel or antiparallel to the Gilbert damping torque depending on the relative orientation between the current and magnetic field. ST-FMR measurements were performed on the Py/SrIrO$_3$ bilayer device patterned along $[010]_c$ axis (20 μm×40 μm) with applied dc current by using a lock-in amplifier. A quantitative analysis of the $\theta_\parallel$ is shown in FIG. 3A, where resonance linewidth W scales linearly with the applied dc current. The magnitude of the in-plane torque was proportional to the change of the effective Gilbert damping $\alpha_{eff}$ over the current density $j_c$ in SrIrO$_3$. It was found that the sign and magnitude of $\theta_\parallel$ (=0.52±0.07, averaged by different frequencies and devices) measured by the dc biased ST-FMR was in good agreement with the ST-FMR line shape analysis. To investigate the importance of SOC on the spin-orbit torques, a control experiment was also performed on a 3.5 nm Py/7 nm SrRuO$_3$ bilayer. While SrRuO$_3$ assumes a similar crystal structure as SrIrO$_3$, the Ru atom hosts 4d electrons with relatively weak spin-orbit coupling compared to the Ir in SrIrO$_3$. It was shown that the ruthenate control sample yields a much smaller current-induced change in $\alpha_{eff}$, which corresponds to a $\theta_\parallel$ of 0.09±0.05 (FIG. 3B). FIG. 3C shows the in-plane magnetic field angle φ dependent current-induced change in the effective damping $\Delta\alpha_{eff}/j_c$ (slope of the linear fit in FIGS. 3A and 3B), which can be well-fitted to sin φ. This is consistent with the symmetry of the current-induced torque, again suggesting that the large spin-torque ratio in SrIrO$_3$ was free from any spurious microwave rectification or thermoelectric effects.

Figure 4A:
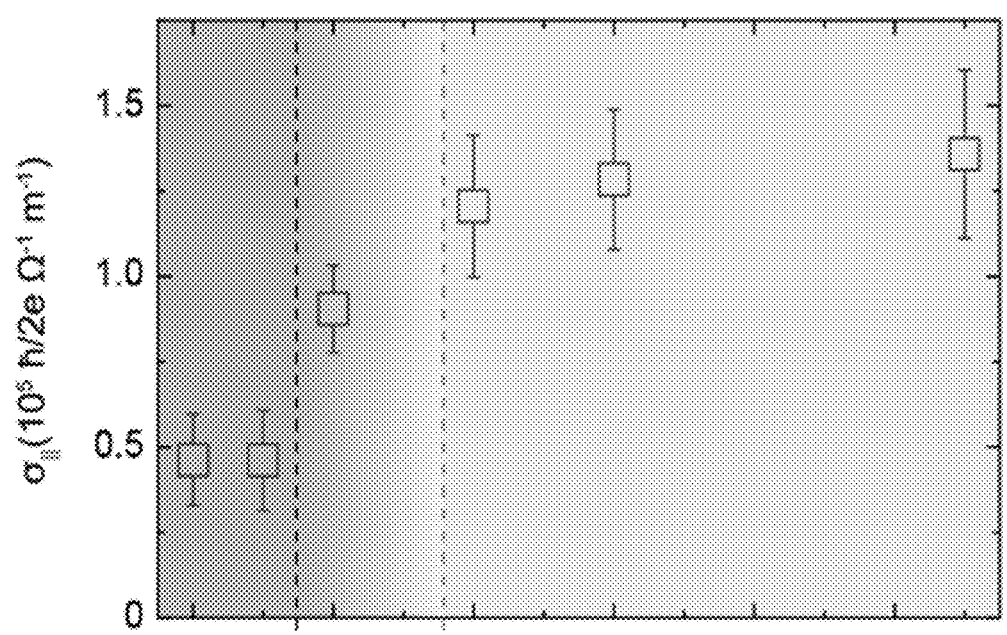
Figure 4B:
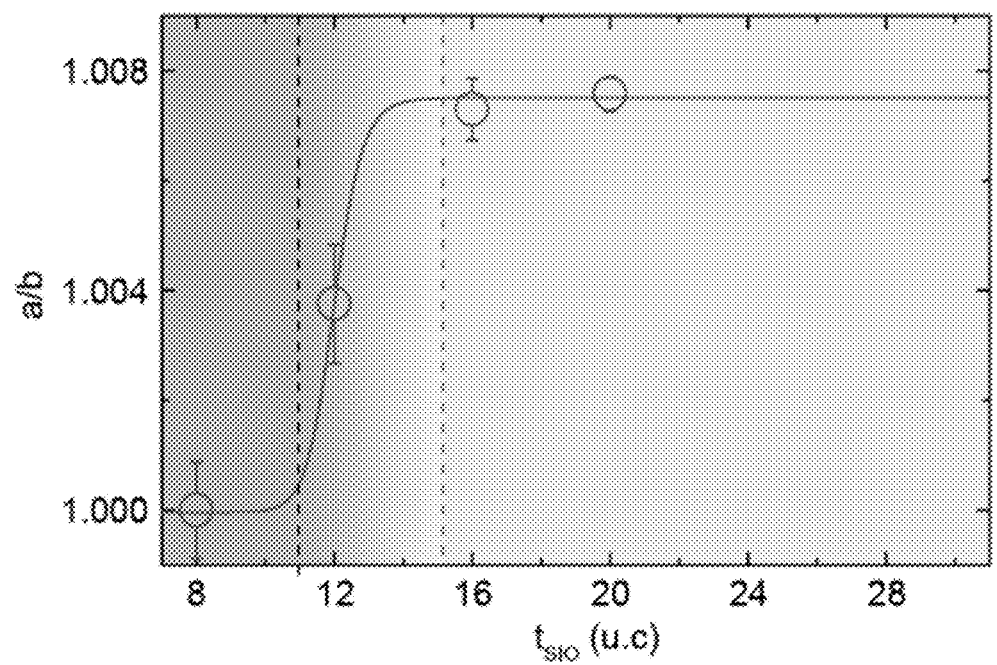
Figure 4C:
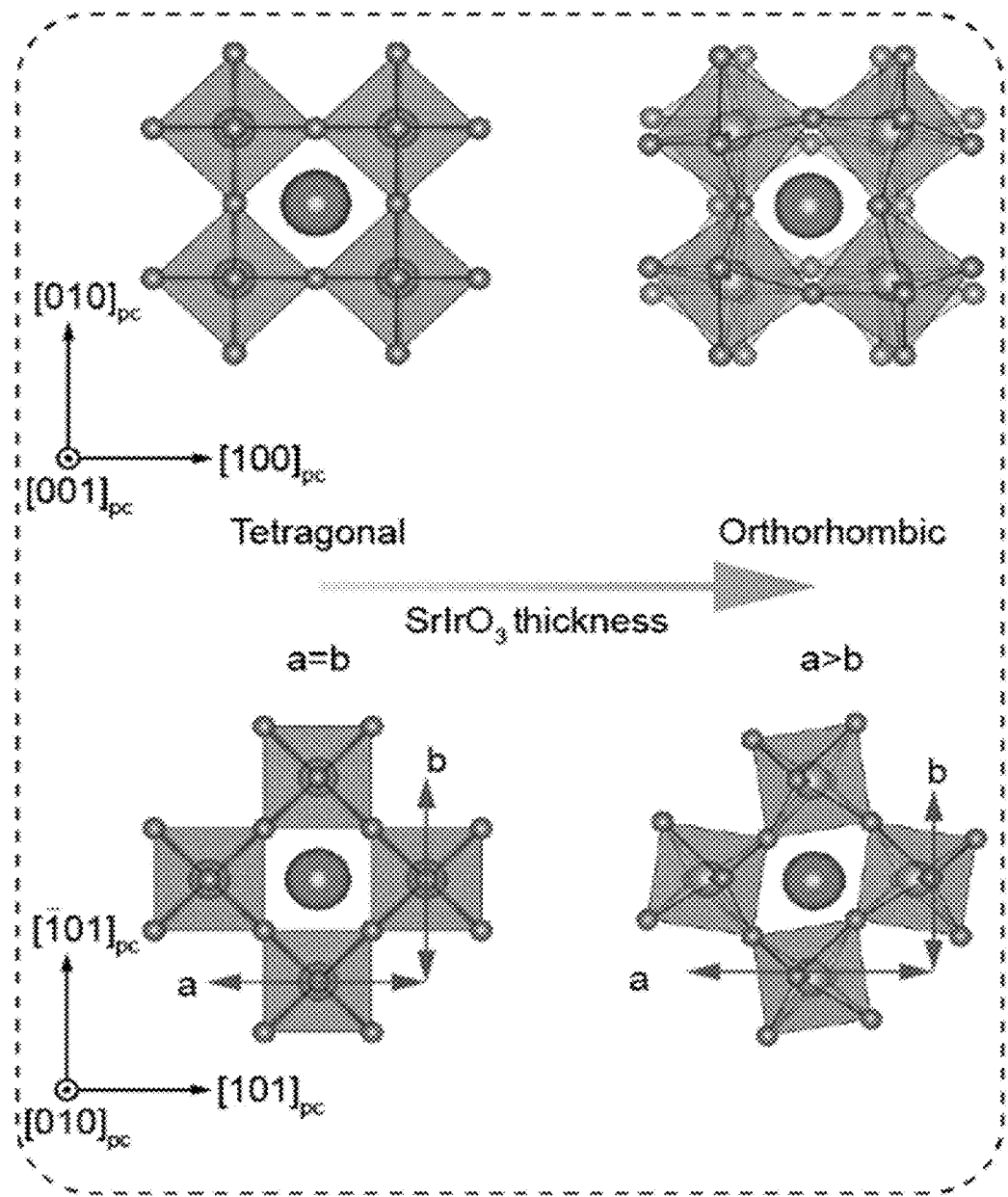

Having established a large spin-torque efficiency in the 20 uc SrIrO$_3$ films, the effect of structural variation on the spin-torque efficiency was next investigated. A study was performed on a series of SrIrO$_3$/Py bilayers where the SrIrO$_3$ thickness was varied from 8 uc to 20 uc (with the Py thickness fixed), combining the dc-biased ST-FMR results with x-ray measurements at the synchrotron to determine the SrIrO$_3$ symmetry at each thickness. It was found that a structural change from tetragonal to orthorhombic symmetry indeed occurred. As shown in FIG. 4A, $\sigma_\parallel$ increased sharply and saturated at the thickness $t_{SIO}$ of 16 uc from a nearly constant value when $t_{SIO} \leq 10$ uc. This abrupt change cannot be explained simply by standard spin-diffusion theory, as the SrIrO$_3$ shows a short spin-diffusion length of ~1.5 nm determined from its resonance linewidth broadening. However, the suppression of $\sigma_\parallel$ can be closely related to the global SrIrO$_3$ lattice symmetry transition (from orthorhombic to tetragonal) with the decreasing $t_{SIO}$ as shown in FIG. 4B, where the orthorhombicity a/b is the ratio between the SrIrO$_3$ orthorhombic lattice parameters whose components line along the in-plane $[100]_c$ and out-of-plane $[001]_c$ substrate directions. Such orthorhombic distortions (a/b>1) originate from the IrO$_6$ octahedral tilt, which is suppressed below a critical thickness of ~12 uc likely due to the structural imprint of the underlying cubic SrTiO$_3$ substrate that does not exhibit TiO$_6$ tilt. This yields a strained tetragonal SrIrO$_3$ structure (FIG. 4C). It should be noted here that the RHEED and synchrotron work show that small domains with orthorhombic distortion persisted even in the thinnest sample. Nonetheless, the global crystal structure of the SrIrO$_3$ films trended towards an undistorted tetragonal. Since the degree of rotation and distortion of the octahedra in perovskites can dramatically change the band structure of the material, it was expected that this structural transition explains the observation of suppressed spin-torque efficiency. This strong dependency of a on lattice symmetry points out a direct connection between the SrIrO$_3$ crystal structure and its spin-torque efficiency. By tuning the crystal structure of epitaxial SrIrO$_3$ through strain, it was demonstrated that the SrIrO$_3$ SHC produced characteristic signatures of an intrinsic spin-Hall effect.

Figure 4D:
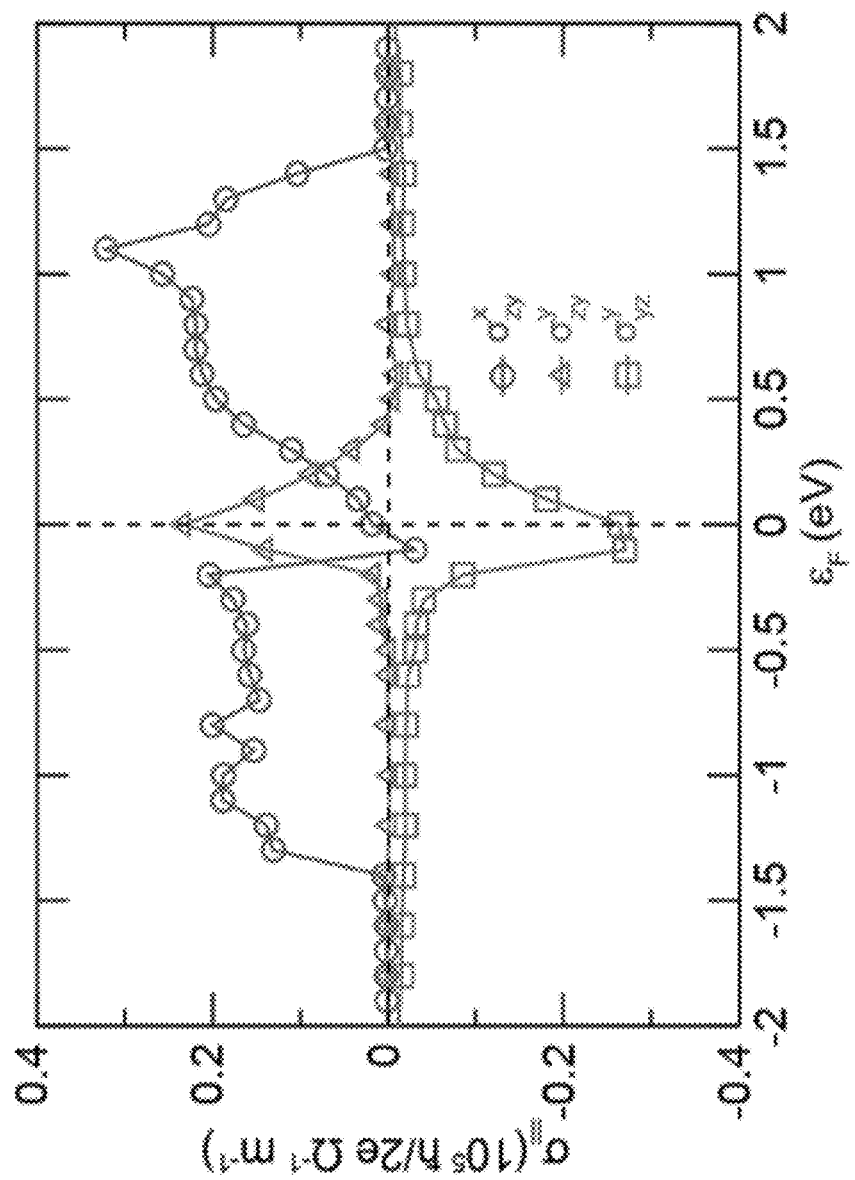

To get an insight about the intrinsic origin of the observed spin-Hall effect, the SHC was theoretically investigated based on the Berry curvature mechanism. (See, Sinova, J., et al., Spin Hall effects. *Rev. Mod. Phys.* 87, 1213-1260 (2015); Guo, G. Y., et al., Intrinsic spin hall effect in platinum: First-principles calculations. *Phys. Rev. Lett.* 100, 096401 (2008).) It is important to note that the intrinsic effects encoded in the electron bands were generated by the interplay of spin-orbit coupling and tilted oxygen octahedra. For the electron band structure of SrIrO$_3$, an effective tight-binding model constructed for the bulk orthorhombic perovskite structure was employed (see FIGS. 1A and 1B for the band structure). (See, Carter, J. M., et al., Semimetal and topological insulator in perovskite iridates. *Phys. Rev. B* 85, 115105 (2012); Chen, Y., et al., Topological crystalline metal in orthorhombic perovskite iridates. *Nat. Commun.* 6, 6593 (2015).) (The model incorporates various spin-dependent hopping channels for Ir electrons generated by oxygen octahedron tilting in the bulk structure. Using the Kubo formula for the intrinsic spin-Hall effect (Methods), the SHC $\sigma_{\mu\nu}^{\rho s}$ was calculated, where a charge current applied along the υ direction generates a spin current along the μ direction with the spin polarization along $\rho_s$. The SHC is a sum of the Berry curvatures of occupied electron states below the Fermi level $\epsilon_F$. The SHC computed for the bulk system had significantly large values as shown in FIG. 4D. Specifically, $\sigma_{zy}^x$ (where the spin current flows along the bulk c axis, circles curve) shows large and positive SHC over an extended region except around the zero energy. Nonzero SHCs were even observed in the configurations, in which ν, μ, $\rho_s$ were not orthogonal to each other: $\sigma_{zy}^y$ (triangles) and $\sigma_{yz}^y$ (squares) peak around the zero energy with an opposite sign.

Such large spin-Hall effects mainly originated from the nearly degenerate energy bands marked by gray in FIG. 1B as revealed by the momentum-resolved SHC $[\sigma_{\mu\nu}^\rho = \Sigma_k \Omega_{\mu\nu}^\rho(k)]$ in FIGS. 4F-4H. In particular, FIGS. 4F, 4G, and 4H demonstrate how the distribution of $\Omega_{zy}^x(k)$ changed within the Brillouin zone as the Fermi level increased. High intensity of $\Omega_{zy}^x(k)$ appeared around the k points where the Fermi level crossed the nearly degenerate bands (FIG. 1A). Remarkably, the high intensity points occurred with the same sign in the form of loops extended over zone boundaries. Such cooperative contributions from many k points were also observed in $\Omega_{zy}^y(k)$ and $\Omega_{yz}^y(k)$. These patterns contrast SrIrO$_3$ with Pt where SHC is dominated by a few high symmetry points. (See, Guo, G. Y., et al., Intrinsic spin hall effect in platinum: First-principles calculations. *Phys. Rev. Lett.* 100, 096401 (2008).)

The experimental geometry used is shown in FIG. 4E, where the charge current is passed along either orthogonal in-plane surface direction and the spin current is normal to surface. The bulk calculation that is closest to this setup is the $\sigma_{zy}^x$ (circles) configuration. The bulk calculation predicted a large intrinsic SHC, but one order of magnitude smaller compared to the experimental results on the thin films. From this theoretical investigation, an unusually large SHC for the bulk system was found that is qualitatively consistent with the experimental results and also illustrates the intrinsic origin of the large spin-Hall effect in $SrIrO_3$.

In summary, a new material candidate has been discovered for spin-orbit torque applications in a transition metal perovskite with spin-orbit coupled 5d electrons in which SOC and the crystal structure combine to produce the largest spin-torque efficiency in a bulk system to date. From the application point of view, less current was shunted through the adjacent metallic ferromagnets (due to the semimetallic nature of $SrIrO_3$) compared to the surface driven mechanisms which show a comparable efficiency. This material also acted as an ideal building block for oxide spintronics, since a broad range of ferromagnetic perovskites could be easily integrated in an epitaxial heterostructure with atomically sharp interfaces for efficient spin current transmission. Furthermore, the extended nature of 5d orbitals allowed sensitive response of the electronic band structure to an externally manipulated lattice structure. This was, for example, manifested in the strong dependency of the SHC on the octahedral tilting and rotation. Such intricate coupling between the electronic and lattice degrees of freedom enable a new avenue to engineer spin-orbit torques by tailoring the lattice symmetry.

Methods

Sample Growth, Fabrication and Characterization.

$SrIrO_3$ films were epitaxially synthesized on (001) $SrTiO_3$ substrates using pulsed laser deposition (PLD). During the growth, layer-by-layer deposition was observed by in situ reflection high energy electron diffraction (RHEED). Before the growth, the $SrTiO_3$ (001) substrates were chemically etched and annealed to ensure $TiO_2$ surface termination. The substrates were first immersed in buffered hydrofluoric acid for 60 seconds before being annealed at 900° C. for 6 hours in an $O_2$-rich environment. After annealing, the substrates were etched again in buffered hydrofluoric acid to remove any leftover SrO on the surface. The PLD growth was conducted at a substrate temperature of 600° C. and an oxygen partial pressure of 75 mTorr. The laser fluence at the $SrIrO_3$ target surface was ~1 J/cm$^2$ and the pulse repetition was 10 Hz. The working distance between target and substrate was ~58 mm. After the $SrIrO_3$ growth, the sample was cooled down in an oxygen rich atmosphere. The chamber was re-evacuated at room temperature and Py was sputter deposited at an Ar pressure of 3 mTorr with a background pressure <5×10$^{-8}$ Torr, followed by a 1 nm Al passivation layer. The Py film is shown to be polycrystalline, which was confirmed by the observation of RHEED diffraction rings after deposition. The atomically flat Py surface on top of $SrIrO_3$ was verified using atomic force microscopy. The thickness, epitaxial arrangement, and coherence of the $SrIrO_3$ films was confirmed using x-ray reflectivity, x-ray diffraction, and reciprocal space mappings. The thickness of Py films was measured by using x-ray reflectivity. The actual Py ferromagnetic thickness excluding the magnetic dead layer was determined by measuring the saturation magnetization as a function of thickness. The Py thickness here refers to the actual ferromagnetic thickness.

The Py/$SrIrO_3$ sample was patterned by using photolithography followed by ion beam milling. Then 200 nm Pt/5 nm Ti electrodes were sputter deposited and defined by a lift-off procedure. Devices for ST-FMR were patterned into microstrips (20-50 µm wide and 40-100 µm long) with ground-signal-ground electrodes. Devices for electrical transport measurements were patterned into 100 µm wide and 500 µm long Hall bars.

STEM Measurements.

TEM specimens were prepared by a focused ion multi-beam system (JIB-4610F, JEOL, Japan). To protect the Py/$SrIrO_3$ films, an amorphous carbon layer was deposited on the top surface before the ion beam milling. A Ga$^+$ ion beam with an acceleration voltage of 30 kV was used to fabricate the thin TEM lamella. To minimize the surface damage induced by the Ga$^+$ ion beam milling, the sample was further milled by an Ar$^+$ ion beam (PIPS II, Gatan, USA) with an acceleration voltage of 100 meV for 4 min. HAADF-STEM images were taken by using a scanning transmission electron microscope (JEM-2100F, JEOL, Japan) at 200 kV with a spherical aberration corrector (CEOS GmbH, Germany). The optimum size of the electron probe was ~0.9 Å. The collection semi-angles of the HAADF detector were adjusted from 70 to 200 mrad in order to collect large-angle elastic scattering electrons for clear Z-sensitive images. The obtained raw images were processed with a band-pass Wiener filter with a local window to reduce background noise (HREM research Inc., Japan).

Synchrotron X-Ray Thin Film Diffraction.

Synchrotron X-ray diffraction measurements were carried out to precisely characterize the structural and lattice symmetry evolution as a function of thickness of $SrIrO_3$ thin films epitaxially grown on a (001) $SrTiO_3$ substrate. The thin film diffraction measurements were performed on a five-circle diffractometer with $\chi$-circle geometry, using an X-ray energy of 20 keV (wavelength $\lambda$=0.6197 Å) at sector 12-ID-D of the Advanced Photon Source, Argonne National Laboratory. The X-ray beam at the beamline 12-ID-D had a total flux of 4.0×10$^{12}$ photons/s and was vertically focused by beryllium compound refractive lenses down to a beam profile of ~50 µm. The L-scans along respective truncation rods {10L} were obtained by subtracting the diffuse background contributions using the two-dimensional images acquired with a pixel 2D array area detector (Dectris PILATUS-1 mm Si 100K). The separation of respective {103} film peak position in reciprocal space can be used to extract the out-of-plane tilt angle of the $SrIrO_3$ film with respect to a cubic perovskite lattice, so that the degree of orthorhombic distortion (a/b>1) can be obtained for each $SrIrO_3$ thin film as a function of thickness.

ST-FMR Measurements.

During ST-FMR measurements, a microwave current at a fixed frequency (4.5 to 7 GHz) was applied to the ac port of a bias-T and a RF ground-signal-ground probe tip. The microwave power output (8 to 14 dBm) was also fixed. For the applied powers, the line shape of the ST-FMR spectrum was within the linear region of small-angle precession. The in-plane magnetic fields (±0.12 T) were generated by a rotary electromagnet. For the line shape analysis, the rectified mixing voltage was detected by using a dc voltage meter through the dc port of the bias-T. For the dc-tuned analysis, the if current amplitude was modulated and the mixing voltage signal was measured by using a lock-in amplifier. The $j_c$ was carefully calibrated by measuring the 4-point-resistance for each layer with a parallel resistor model. For the crystalline orientation dependent measurement, devices were patterned on the same sample to minimize the possible variations on sample fabrication. The in-plane magnetic field angle was fixed at φ=45°, and the microwave frequency and power were 5.5 GHz and 12 dBm, respectively.

Theoretical Calculation.

For the spin-Hall conductivity calculations, a $j_{eff}=\frac{1}{2}$ tight-binding model constructed for the orthorhombic perovskite bulk structure was employed. (See, Carter, J. M., et al., Semimetal and topological insulator in perovskite iridates. *Phys. Rev. B* 85, 115105 (2012); Chen, Y., et al., Topological crystalline metal in orthorhombic perovskite iridates. *Nat. Commun.* 6, 6593 (2015).) The model Hamiltonian H consists of four doubly degenerate electron bands on account of four Ir sites in each unit cell.

$$H = \Sigma_k \psi_k^\dagger H_k \psi_k$$

Here, $\psi = (\psi_{1\uparrow}, \psi_{2\uparrow}, \psi_{3\uparrow}, \psi_{4\uparrow}, \psi_{1\downarrow}, \psi_{2\downarrow}, \psi_{3\downarrow}, \psi_{4\downarrow})^T$ are electron operators with the subscripts meaning the sub-lattice (1,2,3,4) and $j_{eff}=\frac{1}{2}$ pseudo-spin ($\uparrow$, $\downarrow$). The explicit form of $H_k$ and the values of hopping parameters can be found in Refs. 29 and 30. (See, Emori, S. et al. Spin transport and dynamics in all-oxide perovskite $La_{2/3}Sr_{1/3}MnO_3/SrRuO_3$ bilayers probed by ferromagnetic resonance. *Phys. Rev. B* 94, 224423 (2016); Chen, Y., et al., Topological crystalline metal in orthorhombic perovskite iridates. *Nat. Commun.* 6, 6593 (2015).) Then, the SHC $\sigma_{\mu\nu}^\rho$ is calculated by the Kubo formula:

$$\sigma_{\mu\nu}^\rho = \Sigma_k \Omega_{\mu\nu}^\rho(k)$$

where $$\Omega_{\mu\nu}^\rho(k) = \frac{2e\hbar}{V} \sum_{\epsilon_{nk}<\epsilon_F<\epsilon_{mk}} \text{Im}\left[\frac{\langle mk|\mathcal{J}_\mu^\rho|nk\rangle\langle nk|J_\nu|mk\rangle}{(\epsilon_{mk}-\epsilon_{nk})^2}\right]$$

(See, Sinova, J., et al., Spin Hall effects. *Rev. Mod. Phys.* 87, 1213-1260 (2015); Guo, G. Y., et al., Intrinsic spin hall effect in platinum: First-principles calculations. *Phys. Rev. Lett.* 100, 096401 (2008).)

Here, $$J_\nu\left(=\sum_k \psi_k^\dagger \frac{\partial H_k}{\partial k_\nu}\psi_k\right)$$

is charge current, and $\mathcal{J}_\mu^\rho(=\frac{1}{4}\{\sigma^\rho, J^\mu\})$ is spin current with the $j_{eff}=\frac{1}{2}$ spin represented by the Pauli matrix $\sigma^\rho$. In the above expression, V is the volume of the system, $\epsilon_F$ is the Fermi level, and $|mk\rangle$ represents a Bloch state of H with energy $\epsilon_{mk}$. The momentum-resolved SHC represented by $\Omega_{\mu\nu}^\rho(k)$ enables the tracing of the electron states responsible for the large spin-Hall effect. In these calculations, the pseudocubic axes were taken for the three indices $\{\rho, \mu, \nu\}$ representing a measurement geometry, and a 60×60×60 k-point mesh was used for the summation over momentum. (See, Carter, J. M., et al., Semimetal and topological insulator in perovskite iridates. *Phys. Rev. B* 85, 115105 (2012); Chen, Y., et al., Topological crystalline metal in orthorhombic perovskite iridates. *Nat. Commun.* 6, 6593 (2015).)

Growth and Characterization of $SrIrO_3/SrTiO_3$ (001) Heterostructure

Figure 5A:
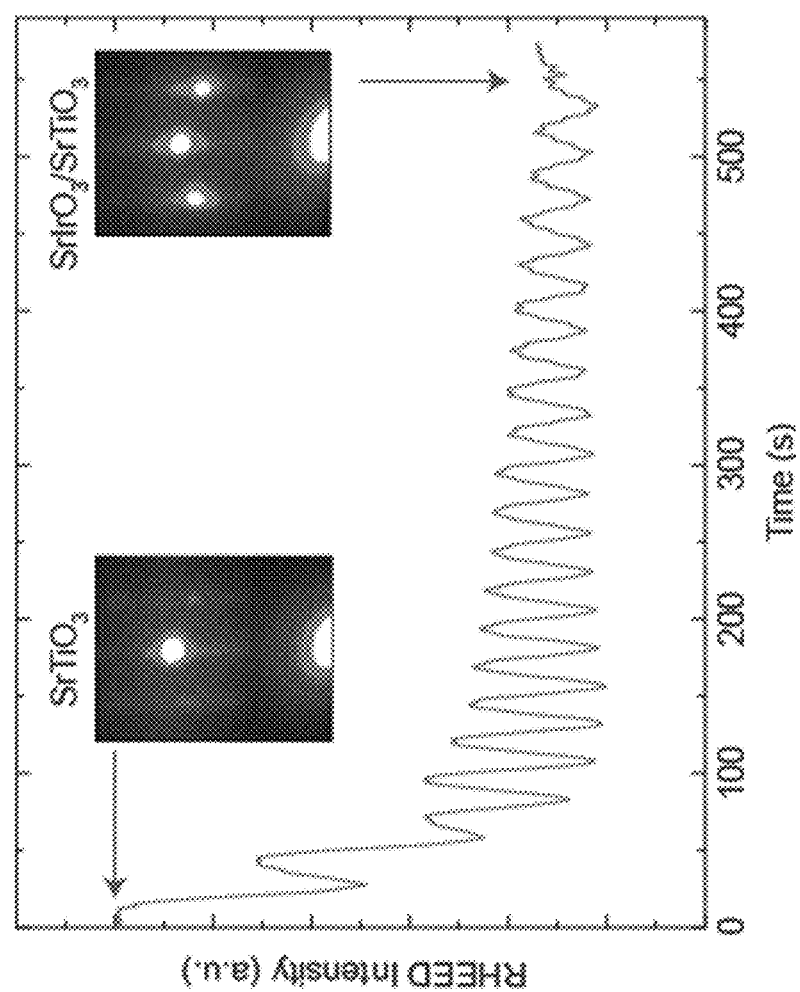
FIGS. 5A-5B show $SrIrO_3$ synthesis and heterostructure surface morphology.
Figure 5B:
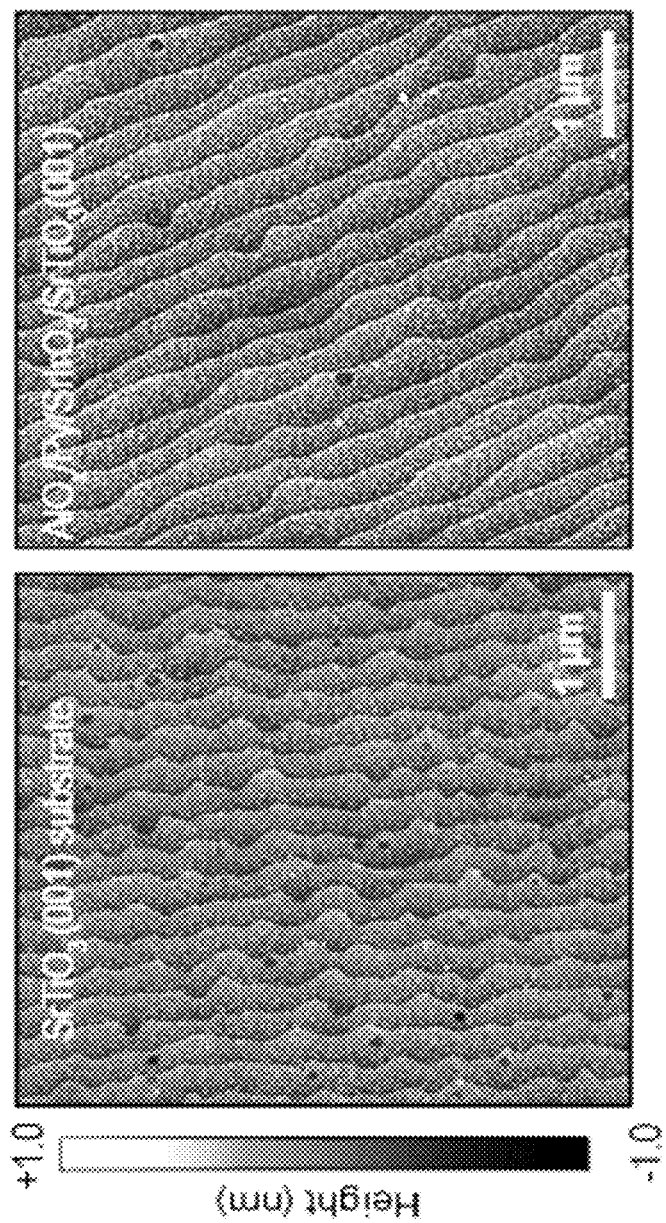

In FIG. 5A, the RHEED intensity spectrum of a 20 uc (8 nm) $SrIrO_3$ film on $SrTiO_3$ is plotted in which the intensity oscillations indicate layer-by-layer growth of the film. The RHEED pattern in the right inset indicates near preservation of the substrate RHEED pattern in the left inset. After deposition of Py onto the $SrIrO_3$ film, RHEED patterns of the Py surface showed faint rings, indicating a textured polycrystalline Py structure. After deposition of the in situ $Al_2O_3$/Py deposition, atomic force microscopy images were taken. As can be seen in FIG. 5B, the final surface of the $Al_2O_3/Py/SrIrO_3/SrTiO_3$ (001) surface retained the step-terrace features of the chemically and thermally treated $TiO_2$-terminated $SrTiO_3$ substrate in FIG. 5B.

Figure 6A:
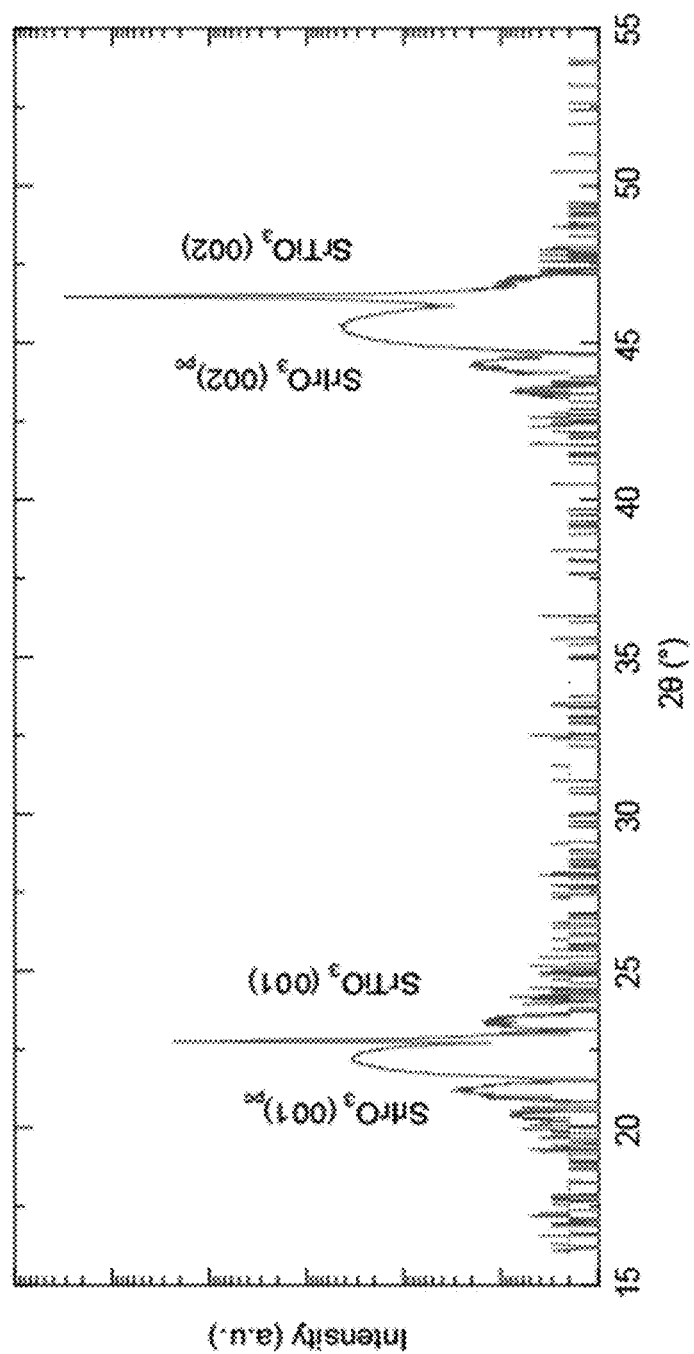
FIGS. 6A-6C show the epitaxial structure and coherence of $SrIrO_3$ thin films from x-ray diffraction.
Figure 6B:
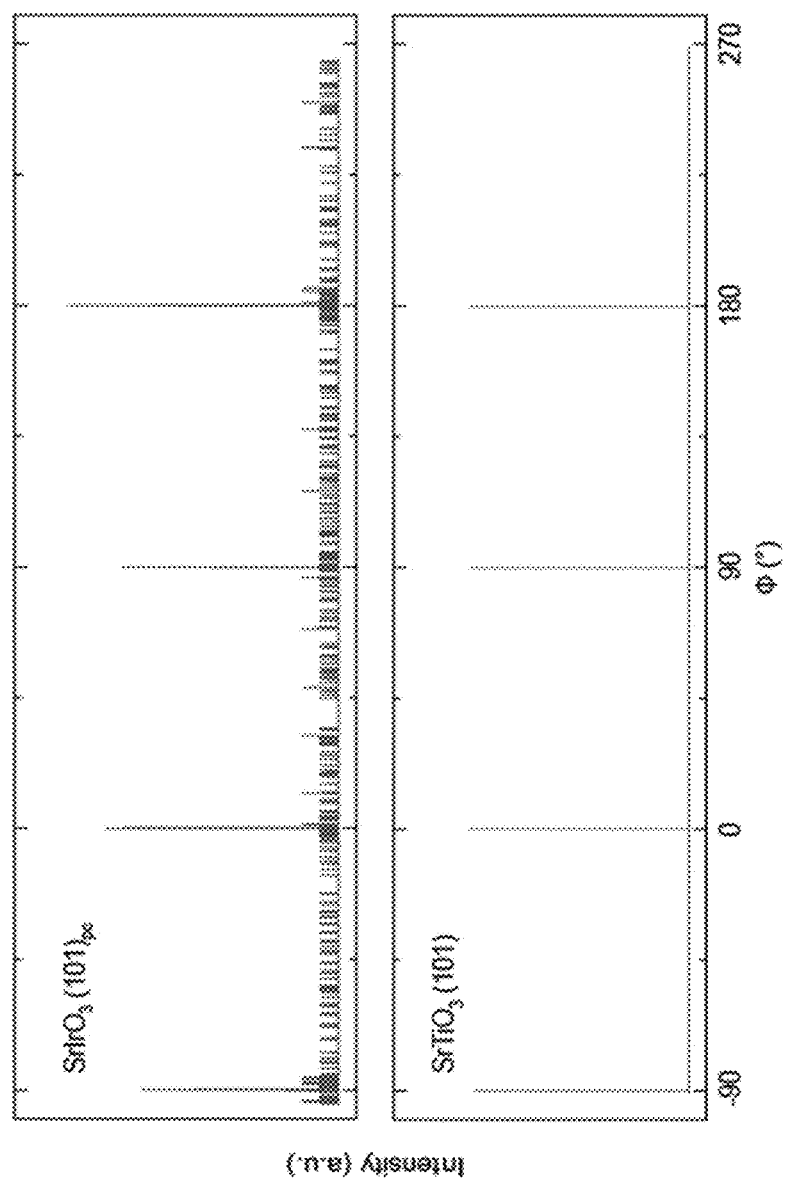
Figure 6C:
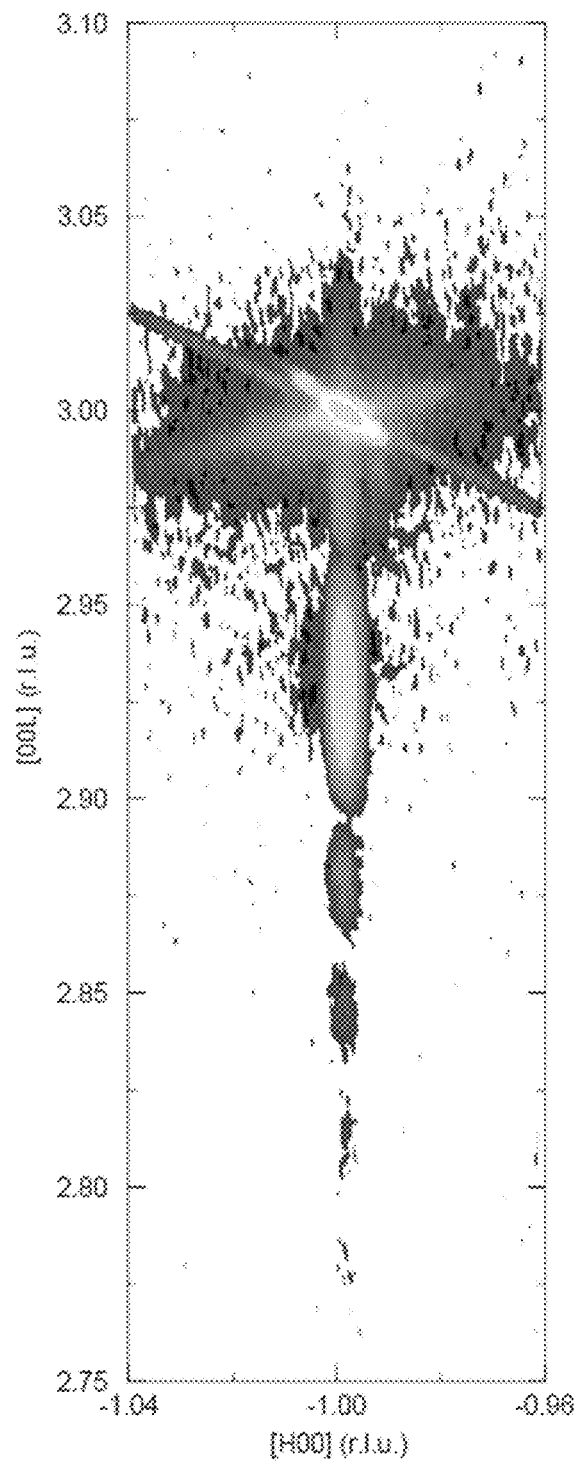

In FIGS. 6A, 6B, and 6C, the lab-source x-ray diffraction data of a 1 nm $Al_2O_3$/3.5 nm Py/12 nm $SrIrO_3/SrTiO_3$ (001) heterostructure is presented. The 2θ-ω out-of-plan scan aligned to the (002) $SrTiO_3$ peak shows an epitaxial $SrIrO_3$ film without the presence of additional peaks that would indicate that different phases of $SrIrO_3$ exist. The $SrIrO_3$ films show distinct Kiessig fringes around the main (001) and (002) pseudocubic reflections, which indicates a smooth film surface and interfacial structure. The azimuthal φ-scan around the $(101)_{pc}$ pseudocubic reflection shows that the $SrIrO_3$ film shares the same pseudocubic arrangement with the underlying $SrTiO_3$ substrate. From the reciprocal space mapping around the (103) $SrTiO_3$ peak shown in FIG. 6C, it is shown that the $SrIrO_3$ films are fully coherent with the underlying $SrTiO_3$ substrate.

Crystallographic Domain Structure of $SrIrO_3$ on $SrTiO_3$ (001)

Figure 7A:
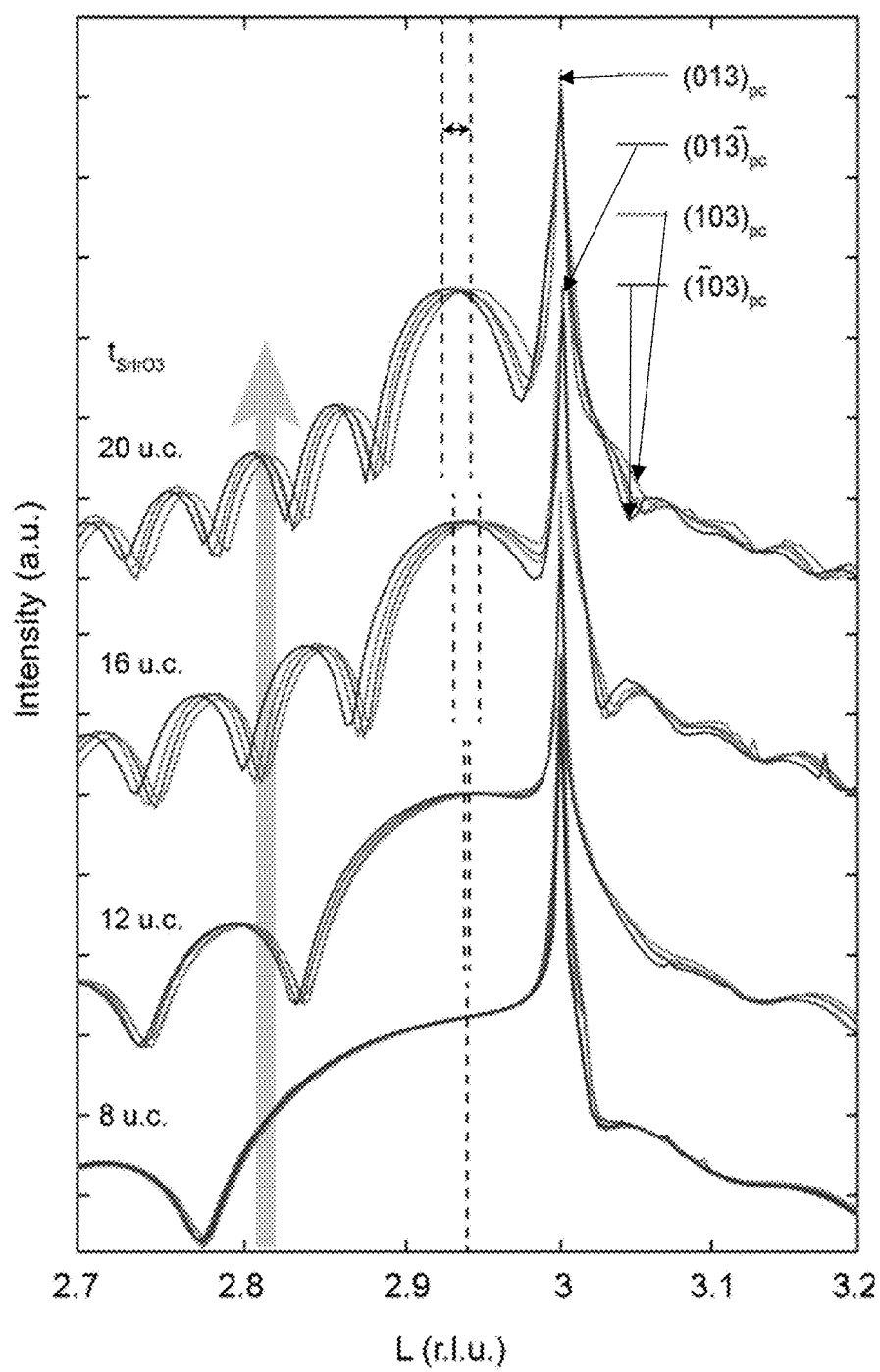
FIGS. 7A-7C depict determination of $SrIrO_3$ symmetry by synchrotron x-ray diffraction.

Synchrotron x-ray diffraction experiments were performed to determine the tilt and symmetry of a series of $SrIrO_3$ films on $SrTiO_3$ (001) capped with 3 nm of Py. Orthorhombic perovskites like $SrIrO_3$ with Pbnm space group symmetry orient themselves on cubic substrates with $[110]_o$ out of plane along $[001]_{pc}$ with $[-110]_o$ and $[001]_o$ in-plane along $[100]_{pc}$ and $[010]_{pc}$, respectively. Such epitaxial arrangement produces a distortion of the orthorhombic unit cell due to the compressive/tensile strain along $[-110]_o$, which causes the orthorhombic film to assume a slightly distorted monoclinic structure with $\alpha=\beta=90°\neq\gamma$. By examining the $\{103\}_{pc}$ reflection at 90° increments, it is possible to determine the pseudocubic tilt of the orthorhombic films by comparing the peak position in L at each φ angle, as their film peak positions will show deviations in the surface-normal component of $Q_z$, the surface normal component of the x-ray scattering vector. This will shift the peak position in L along 2 of the φ-angle peaks, whereas the other 2 alignments will have identical peak positions in L. The L-shifts will exist along the $[103]_{pc}$ and $[-103]_{pc}$ peaks since the in-plane direction of the strain that creates the distorted tilt lies along $[100]_{pc}$. Therefore, the [013] and [0-13] reflections should exhibit the same film peak position in L, since no tilt exists along this direction. As can be seen in FIG. 7A, the splitting from [103] and [-103] was pronounced at 20 uc but was slowly suppressed as the film thickness decreased. At 8 uc, the $\{103\}_{pc}$ family showed no deviation in L, indicating that relatively no tilt from the strain existed, which means that a global tetragonal symmetry was established. From the position of these L peaks, geometrical analysis was performed to calculate the a/b ratio presented in FIG. 4B. (See, Vailionis, A. et al. Misfit strain accommodation in epitaxial $ABO_3$ perovskites: Lattice rotations and lattice modulations. *Phys. Rev. B* 83, 064101 (2011).)

Figure 7B:
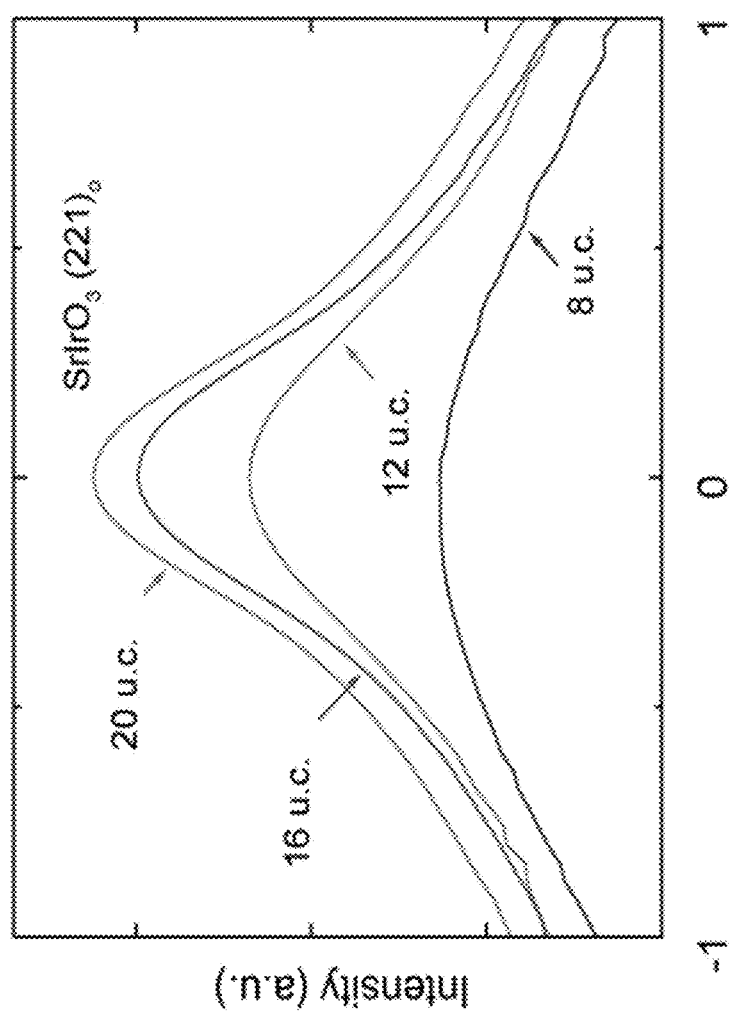
Figure 7C:
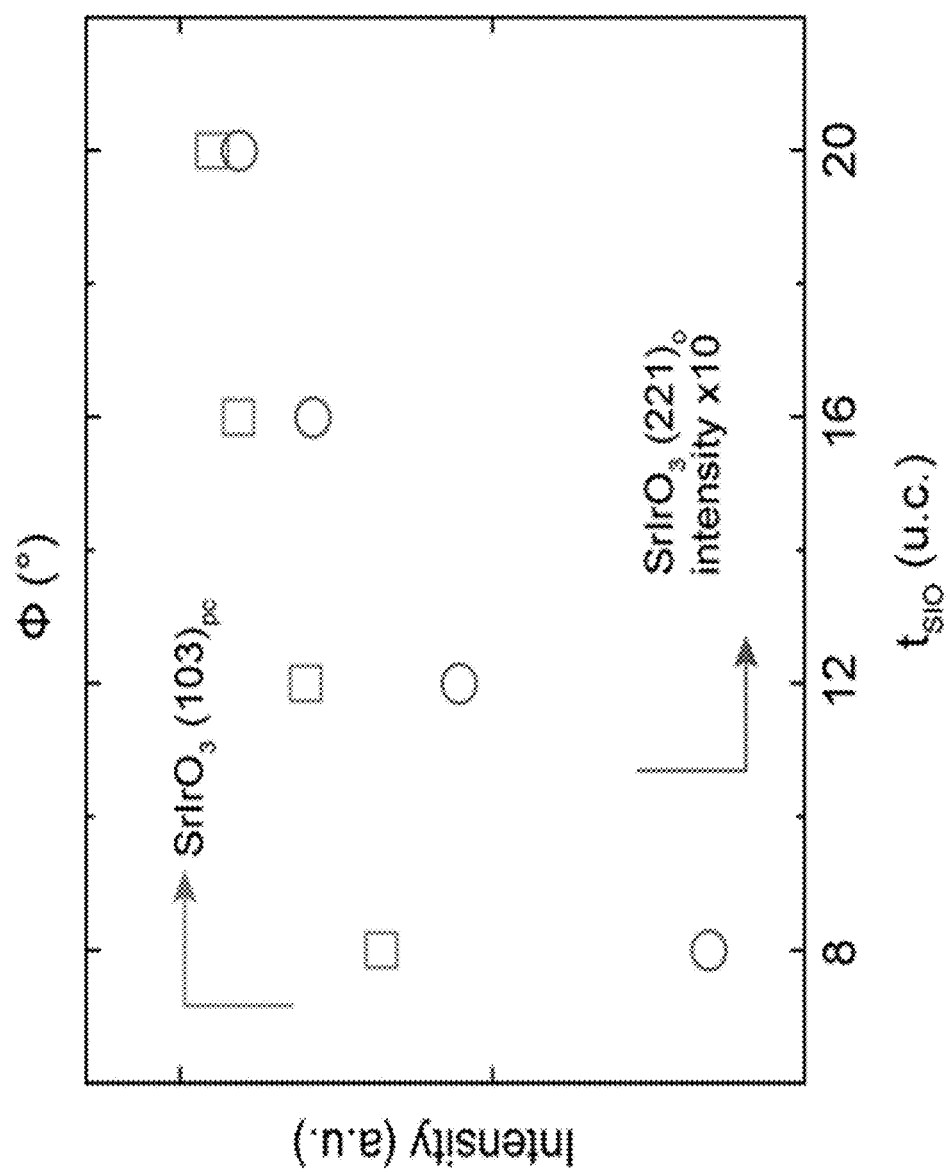

However, while such scans are effective for determining the tilt from epitaxial strain, they ignore tilting of the octahedral from small orientations of orthorhombic domains. Since lower symmetry perovskites like orthorhombic $SrIrO_3$ show tilts and rotation patterns in their octahedra along different pseudocubic directions, they will exhibit extra x-ray reflections between pseudocubic peaks that arise from doubling the unit cell along particular crystallographic directions. Therefore, based on the bulk tilt pattern of $SrIrO_3$, scans to look for the $(221)_o$ reflection were performed to check if the films were completely tetragonal. This reflection corresponds to a half-order pseudocubic {½02} family of reflections that do not exist in non-tilted perovskite system. Thus, any measured intensity from the (221) peak would indicate the presence of small orthorhombic domains in the films. FIG. 7B shows that intensity from the measured $(221)_o$ reflection in the SrIrO$_3$ films persisted even in the 8 uc film that showed no tilt from the {103} work. It should be noted however, that although the (221) orthorhombic peak was still observable in the thin 8 uc film, the intensity of this peak dropped much more quickly with decreasing thickness than the primary (103) peak from 20 to 8 uc. If this (221) intensity change were solely due to the progressively thinner SrIrO$_3$ films, the (103) should have decreased at the same rate, which was not the case, as shown in FIG. 7C. Thus, this signifies a global suppression of the orthorhombic tilt, and from there, the suppression of octahedral tilts and rotations. Thus, while the 8 uc film may have retained small orthorhombic domains (this was also verified from RHEED experiments along the (1,0) and (0,1) pseudocubic directions), these domains were greatly suppressed as the global structure clearly tends towards the tetragonal symmetry from 20 to 8 uc.

ST-FMR Line Shape Analysis and the Frequency Dependent Spin Torque Ratio

Figure 8A:
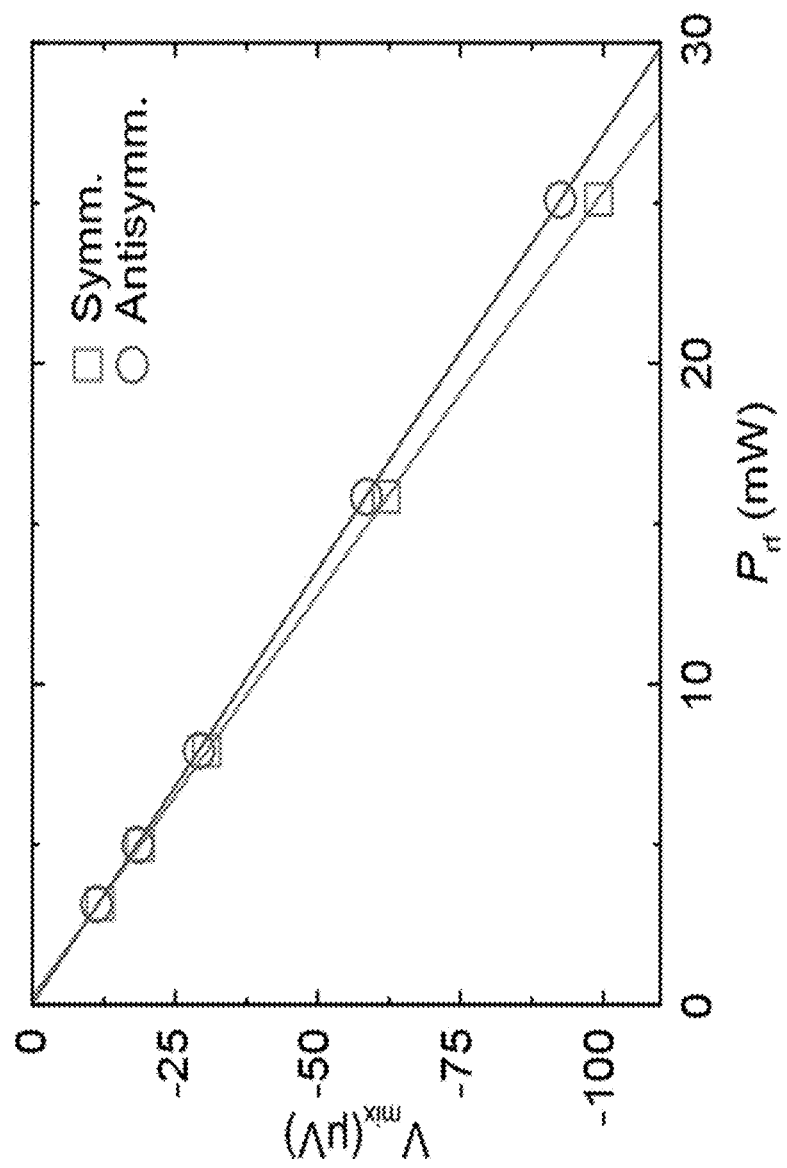
FIGS. 8A-8D show a calculation of spin-Hall angle with ST-FMR line shape and the calibration of microwave current.
Figure 8B:
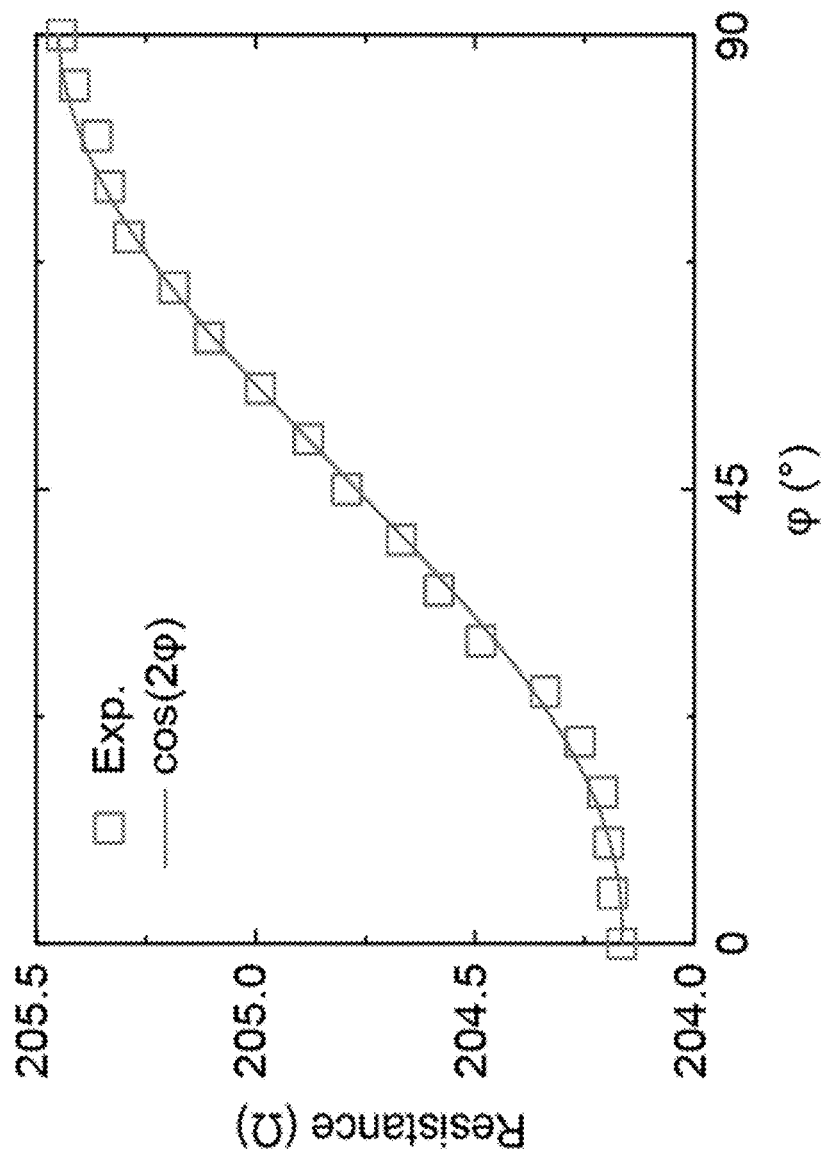
Figure 8C:
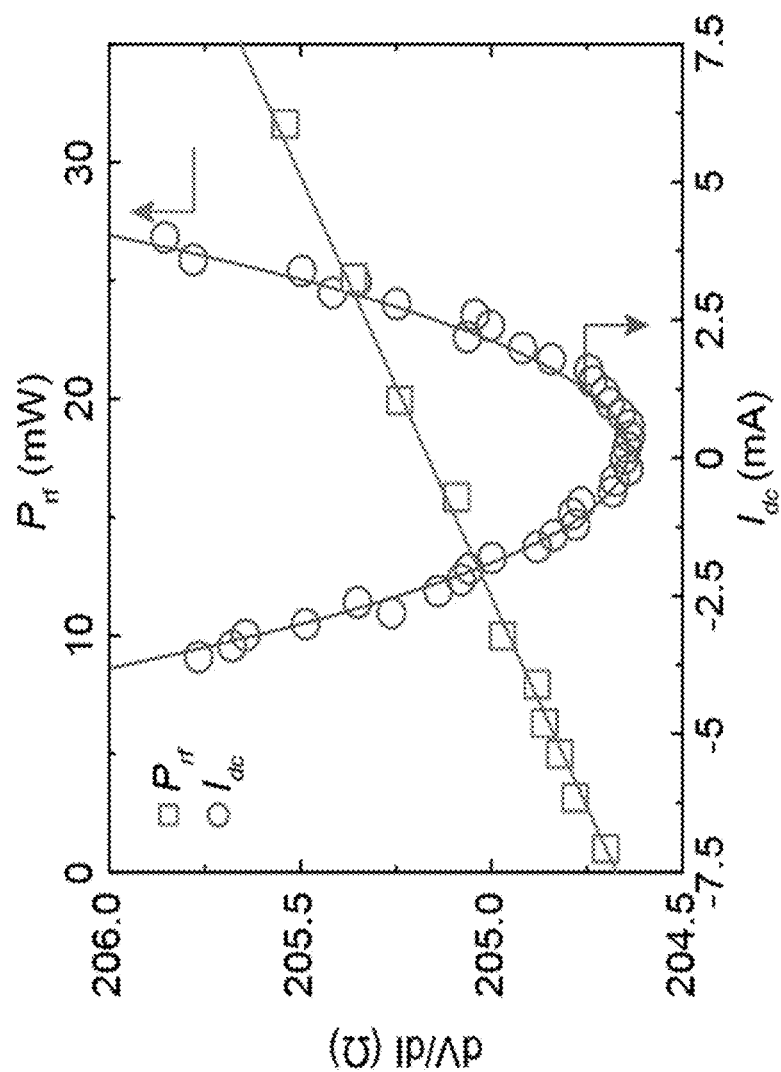

The ST-FMR signal with the current-induced in-plane and out-of-plane torque components can be described by the Landau-Lifshitz-Gilbert-Slonczewski equation, $$\frac{d\vec{m}}{dt} = -\gamma \vec{m} \times \mu_0 \vec{H}_{eff} + \alpha \vec{m} \times \frac{d\vec{m}}{dt} + \tau_\perp \vec{\sigma} \times \vec{m} + \tau_\parallel \vec{m} \times (\vec{\sigma} \times \vec{m}) \quad (S1)$$

where $\gamma$ is the gyromagnetic ratio, $\mu_0$ is the permeability in vacuum, $\vec{H}_{eff}$ is the effective magnetic field including the external magnetic field $\vec{H}_{ext}$ and the demagnetization field, a is the Gilbert damping coefficient, and $\tau_\perp$ and $\tau_\parallel$ are the out-of-plane and in-plane torque components shown in FIG. 2A. (See, Slonczewski, J. C. Current-driven excitation of magnetic multilayers. *J. Magn. Magn. Mater.* 159, L1-L7 (1996).) The ST-FMR mixing voltage can be then written in the form as:

$$V_{mix} = S \frac{W^2}{(\mu_0 H_{ext} - \mu_0 H_{FMR})^2 + W^2} + A \frac{W(\mu_0 H_{ext} - \mu_0 H_{FMR})}{(\mu_0 H_{ext} - \mu_0 H_{FMR})^2 + W^2} \quad (S2)$$

where W is the half-width-at-half-maximum resonance linewidth, and $H_{FMR}$ is the resonance field. S and A are the symmetric and antisymmetric amplitude of the Lorentzian, and can be expressed as, $$S = -\frac{I_{rf}}{2}\left(\frac{dR}{d\varphi}\right)\frac{1}{\alpha(2\mu_0 H_{FMR} + \mu_0 M_{eff})}\tau_\parallel \quad (S3)$$

$$A = -\frac{I_{rf}}{2}\left(\frac{dR}{d\varphi}\right)\frac{\sqrt{1 + M_{eff}/H_{FMR}}}{\alpha(2\mu_0 H_{FMR} + \mu_0 M_{eff})}\tau_\perp, \quad (S4)$$

where $I_{rf}$ is the microwave current, $R(\varphi)$ is the device resistance as a function of in-plane magnetic field angle $\varphi$ due to the anisotropic magnetoresistance of Py, and $\mu_0 M_{eff}$ is the effective magnetization. The S and A amplitudes are proportional to the microwave power (FIG. 8A), which indicates that the measurement is within the linear regime to the driving field. In this study, the $V_{mix}$ was directly measured by a dc voltmeter without any amplitude modulation of the microwave power. To calibrate $dR/d\varphi$, the device resistance was measured as a function of magnetic field angle by rotating an in-plane magnetic field of 0.08 T produced by a rotary electromagnet (FIG. 8B). By fitting the $\Delta R$ to $\cos(2\varphi)$, $dR/d\varphi$ at a certain $\varphi$ angle could be calculated. The microwave current $I_{rf}$ was calibrated by measuring the device resistance change due to Joule heating effect. (See, Tshitoyan, V. et al., Electrical manipulation of ferromagnetic NiFe by antiferromagnetic IrMn. *Phys. Rev. B* 92, 214406 (2015); Zhang, W. et al., All-electrical manipulation of magnetization dynamics in a ferromagnet by antiferromagnets with anisotropic spin Hall effects. *Phys. Rev. B* 92, 144405 (2015).) This same amount of heating can be obtained with an injection of dc current $I_{dc}$ by comparing the change of the device resistance. Therefore, the rf current can be determined as $I_{rf} = \sqrt{2}I_{dc}$, since Joule heating from ac and dc current are $\frac{1}{2}I^2R$ and $I^2R$. FIG. 8C shows a typical device resistance change curve due to dc (circles) and if (squares 5.5 GHz) currents, in which they are fitted to a quadratic and a linear function, respectively. The if current was estimated for different rf frequencies and powers.

Figure 8D:
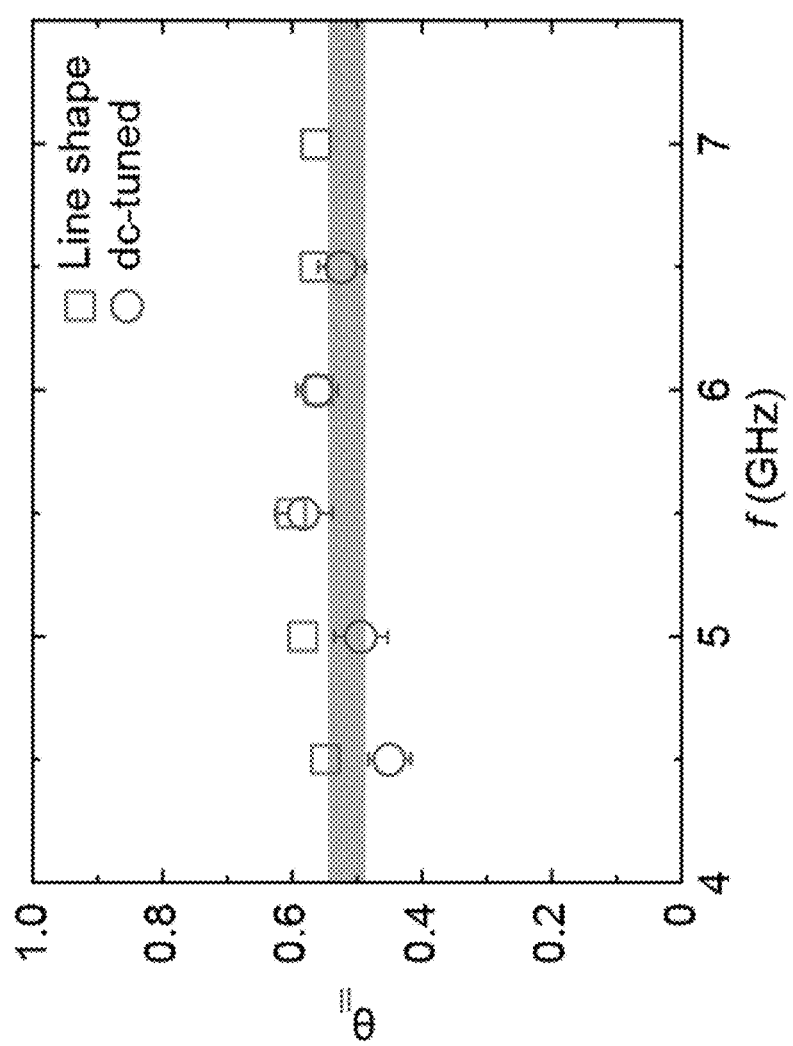
Figure 9A:
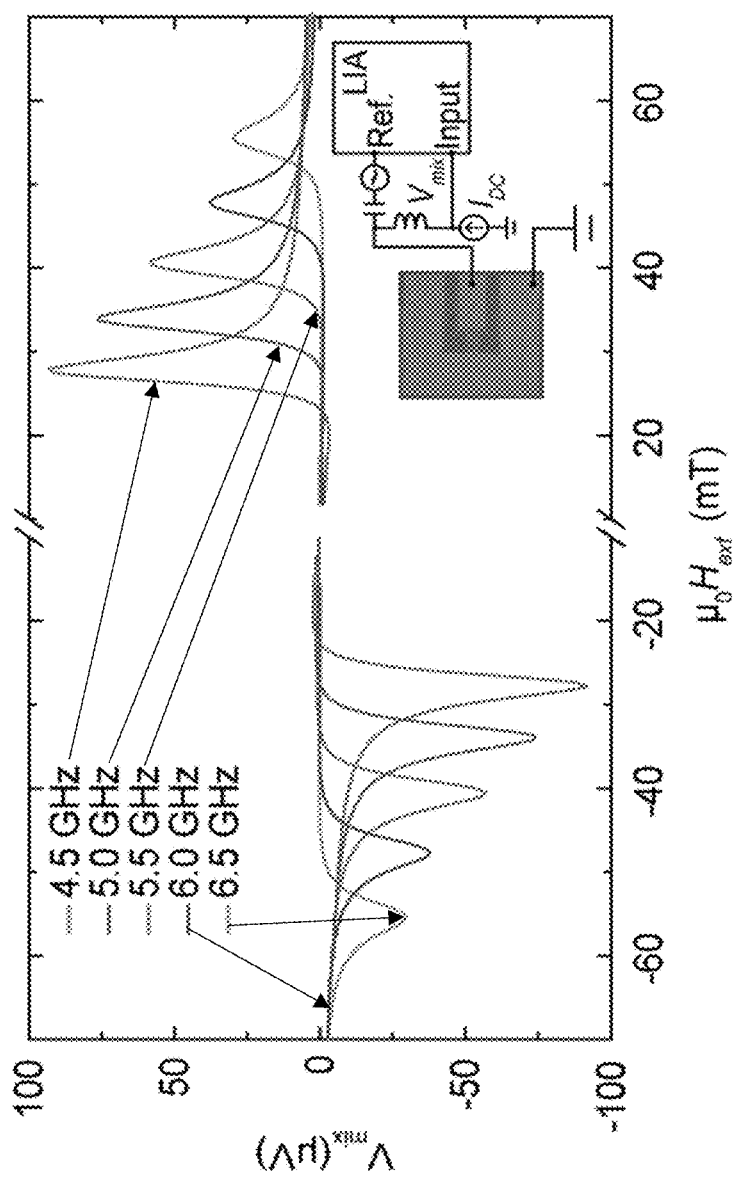
FIGS. 9A-9C show spin-torque ferromagnetic resonance (ST-FMR) in 3.5 nm Py/20 u.c. $SrIrO_3$ bilayer at different frequency f
Figure 9C:
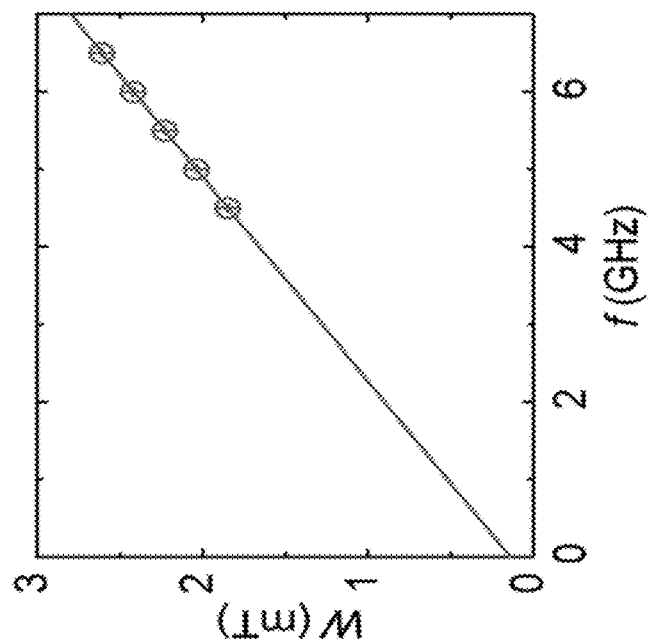
Figure 9B:
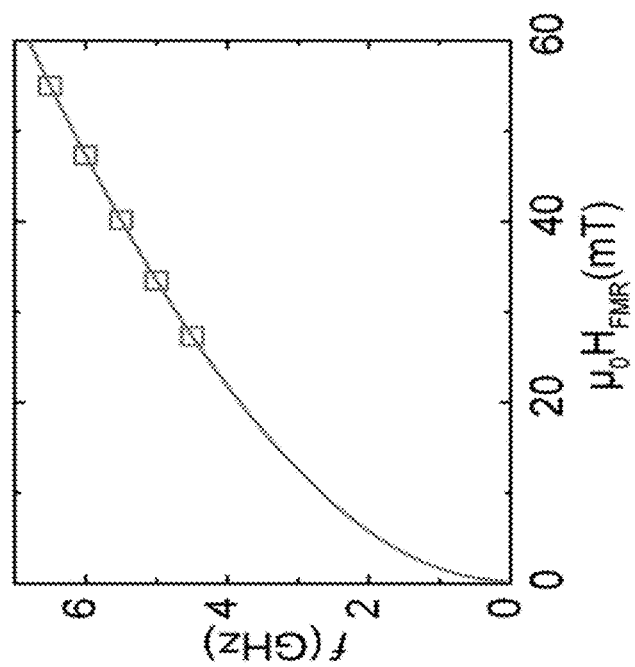

Then the magnitude of torque components could be determined by extracting the symmetric and antisymmetric amplitude from Eq. S3 and Eq. S4. The two torque ratios could be calculated as $$\theta_{\parallel/\perp} = \tau_{\parallel/\perp} M_s t \frac{I_{rf} R}{I\cos(\varphi)}\left(\frac{2e}{\hbar}\right)\rho,$$

where $M_s$ and t are the saturation magnetization and the thickness of Py; l is the length of the device bar, $\hbar$ is the reduced Planck's constant, e is the electron charge. The saturation magnetization $M_s$ was measured by vibration sample magnetometry. The effective magnetization $M_{eff}$ was obtained by measuring the frequency dependent $H_{FMR}$ with a fit to Kittel equation, $$2\pi f = \gamma \sqrt{\mu_0 H_{FMR}(\mu_0 H_{FMR} + \mu_0 H_K)(\mu_0 H_{FMR} + \mu_0 H_K + \mu_0 M_{eff}))} \quad (S5)$$

where $\mu_0 H_K$ is the in-plane magnetic anisotropy field. It was found that $M_{eff} \approx M_s$ for all samples with 3.5 nm Py, indicating negligible perpendicular magnetic anisotropy. FIG. 9A shows the frequency dependent ST-FMR spectra for a 3.5 nm Py/20 uc SrIrO$_3$ bilayer sample, in which the Py effective magnetization $M_{eff}$ (FIG. 9B) and Gilbert damping parameter $\alpha$ (FIG. 9C) were determined. The spin torque ratio $\theta_\parallel$ of a 20 uc SrIrO$_3$ sample was then calculated at various frequencies (4.5-7 GHz), since the spin torque ratio is expected to be independent of frequency. (See, Nan, T. et al. Comparison of spin-orbit torques and spin pumping across NiFe/Pt and NiFe/Cu/Pt interfaces. *Phys. Rev. B* 91, 214416 (2015).) FIG. 8D shows the frequency dependent spin torque ratio determined from both ST-FMR line shape (squares) and dc-tuned analysis (circles). Both methods yielded a small frequency variation.

ST-FMR Dc-Tuned Analysis and the Thickness Dependent Spin Torque Ratio

Alternatively, the spin torque ratio was obtained by inserting a dc $I_{dc}$ current superimposed on the microwave current, which induced a subtle change in the ST-FMR line shape.

(See, Liu, L., et al., Spin-torque ferromagnetic resonance induced by the spin Hall effect. *Phys. Rev. Lett.* 106, 036601 (2011); Kasai, S. et al., Modulation of effective damping constant using spin Hall effect. *Appl. Phys. Lett.* 104, 2013-2016 (2014); Ganguly, A. et al., Thickness dependence of spin torque ferromagnetic resonance in Co75Fe25/Pt bilayer films. *Appl. Phys. Lett.* 104, 72405 (2014); Demasius, K.-U. et al., Enhanced spin-orbit torques by oxygen incorporation in tungsten films. *Nat. Commun.* 7, 10644 (2016).) In particular, the $\theta_\|$ was quantified by linearly fitting the current dependent resonance linewidth or $\alpha_{eff}$ as $$|\theta_\||= \frac{2|e|}{\hbar}\frac{(H_{FMR}+M_{eff}/2)\mu_0 M_S t}{|\sin\varphi|}\left|\frac{\Delta\alpha_{eff}}{\Delta j_c}\right| \quad (S6)$$

where $\alpha_{eff}$ is the effective magnetic damping of Py and can be related to W as $$\alpha_{eff}=\frac{\gamma}{2\pi f}(W-W_0).$$

To extract resonance linewidth with smaller deviation, the rf current amplitude was modulated and the mixing voltage signal was measured by using a lock-in amplifier. The dc current was restricted to below 2 mA to acquire a good fit curve and minimize Joule heating. The current density in $SrIrO_3$ layer was estimated by using a parallel resistance model.

Figures 10A, 10B:
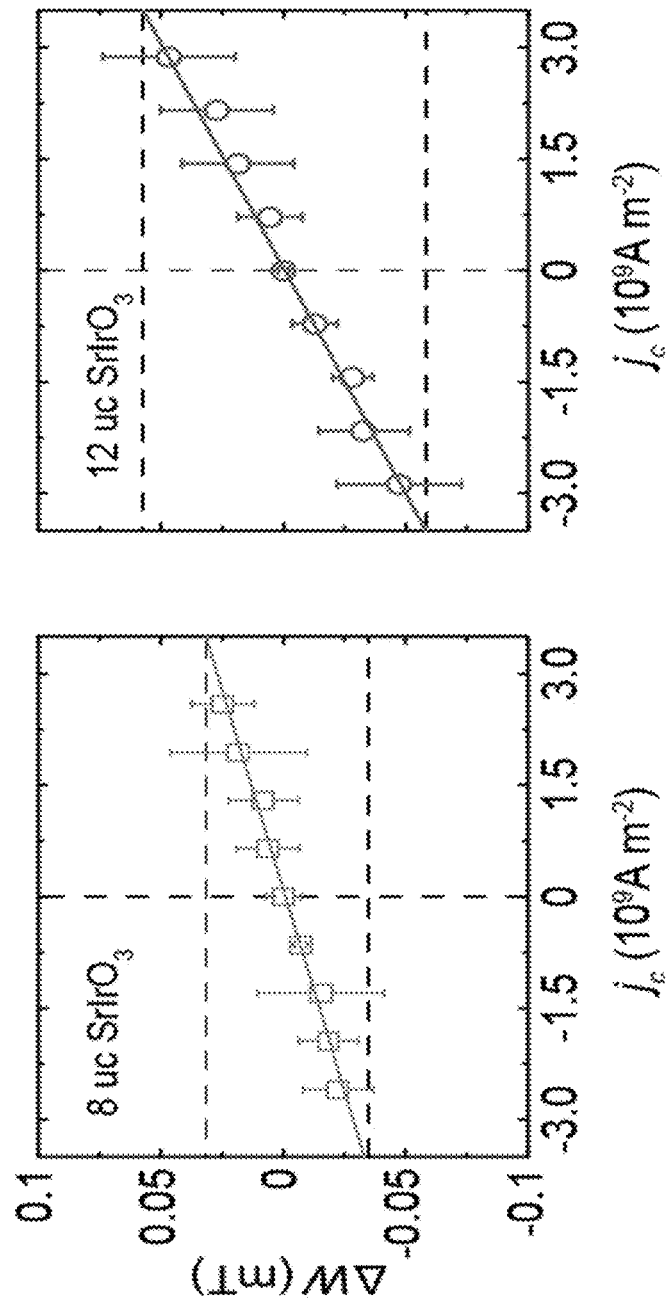
FIGS. 10A-10F depict the $SrIrO_3$ thickness dependent spin orbit ratio and Py Gilbert damping.
Figures 10C, 10D:
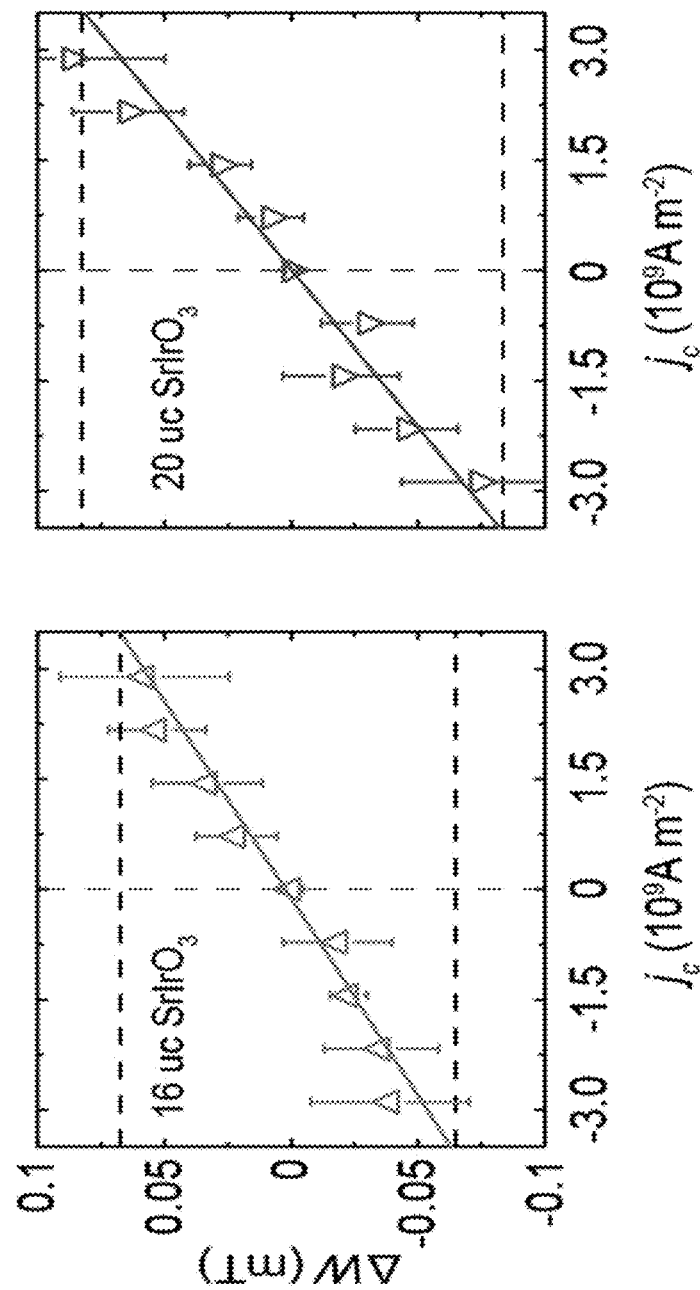
Figure 10E:
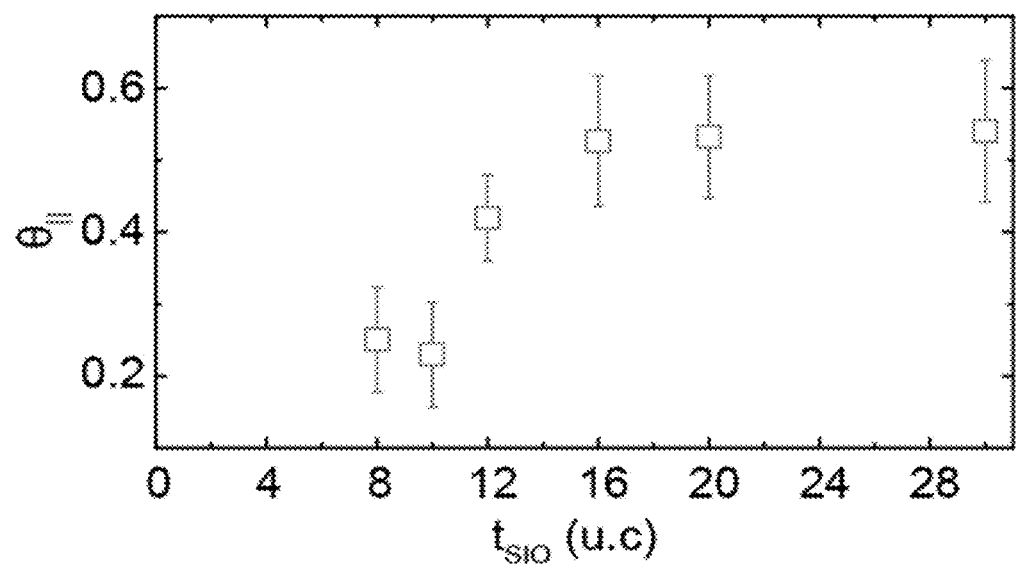

FIGS. 10A, 10B, 10C and 10D show the change of resonance linewidth as the functions of current density in $SrIrO_3$ for the $Py/SrIrO_3$ bilayer, in which the Py thickness is fixed at 3.5 nm and the $SrIrO_3$ thickness varies from 8 uc to 20 uc (at $\varphi=-135°$ only). The thickness dependent spin torque ratio and spin Hall conductivity of $SrIrO_3$ are summarized in FIG. 10E.

Transmission of Spin Current in $Py/SrIrO_3$

Figure 10F:
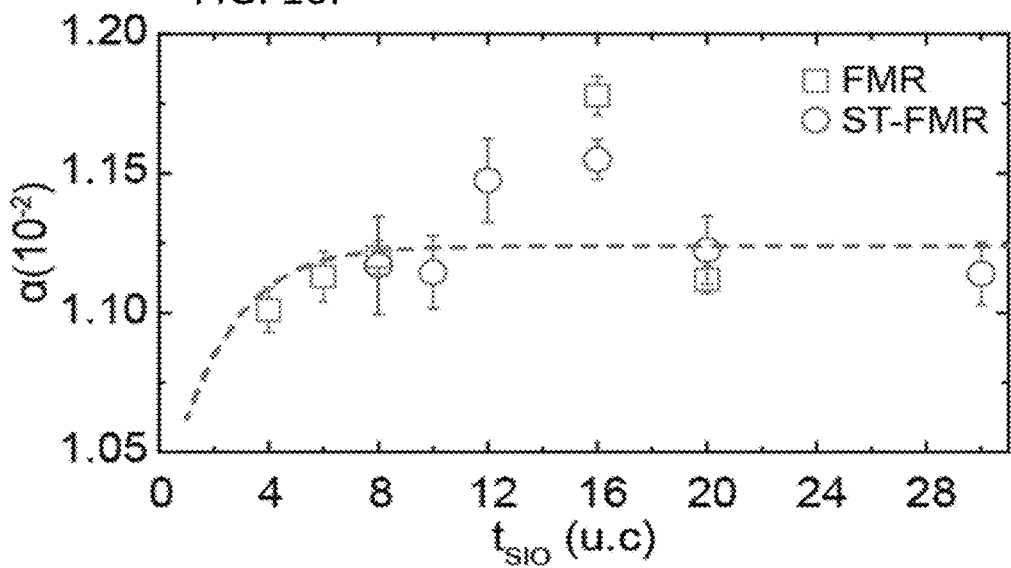

To estimate the spin diffusion length in the $SrIrO_3$ thin film, the Gilbert damping parameter $\alpha$ of Py in $Py/SrIrO_3$ bilayer was characterized with various $SrIrO_3$ thicknesses by using both ST-FMR (on patterned samples) and a broadband FMR (on 5 mm by 5 mm samples). The Gilbert damping parameter $\alpha$ was obtained from the frequency dependent measurement (4.5-6.5 GHz for ST-FMR, and 5-12 GHz for FMR) of the resonance linewidth W. The enhancement of $\alpha$ was observed with the increasing $SrIrO_3$ thickness due to the spin pumping effect as shown in FIG. 10F. The data could be fitted to diffusive spin transport model as, $$\alpha=\alpha_0+\frac{g_{op}\mu_B\hbar}{2e^2 M_s t_{SIO}}\left[\frac{1}{G_{\uparrow\downarrow}}+2\rho\lambda_s\coth\left(\frac{t_{SIO}}{\lambda_s}\right)\right]^{-1} \quad (S7)$$

where $g_{op}$ is Lande g factor, $\alpha_0$ is the Gilbert damping with zero $SrIrO_3$ thickness, $G_{\uparrow\downarrow}$ is the interfacial spin mixing conductance per unit area, and $\lambda_s$ is the spin diffusion length in $SrIrO_3$. (See, Boone, C. T., et al., Spin transport parameters in metallic multilayers determined by ferromagnetic resonance measurements of spin-pumping. *J. Appl. Phys.* 113, 153906 (2013).) A constant $SrIrO_3$ resistivity $\rho$ was used in the fit, which gave a spin mixing conductance $G_{\uparrow\downarrow}$ of $1.8\times10^{14}$ $\Omega^{-1}$ $m^{-2}$ and a spin diffusion length of 1.4 nm. The large spin mixing conductance of $SrIrO_3$ enabled efficient spin transport at the $Py/SrIrO_3$ interface. The spin diffusion length in $SrIrO_3$ suggests that the spin accumulation in $SrIrO_3$ can take place in a very short thickness length scale. The measured changes in the $SrIrO_3$ SHC occurred at a thickness scale well above the $SrIrO_3$ spin diffusion length, allowing it to be concluded that the suppression of the SHC at the thin $SrIrO_3$ sample is due to the change of lattice symmetry rather than due to spin diffusion.

Measurements on Ex-Situ $Py/SrIrO_3$, Single-Layer Py and Pt/Py Control Samples

Figure 11B:
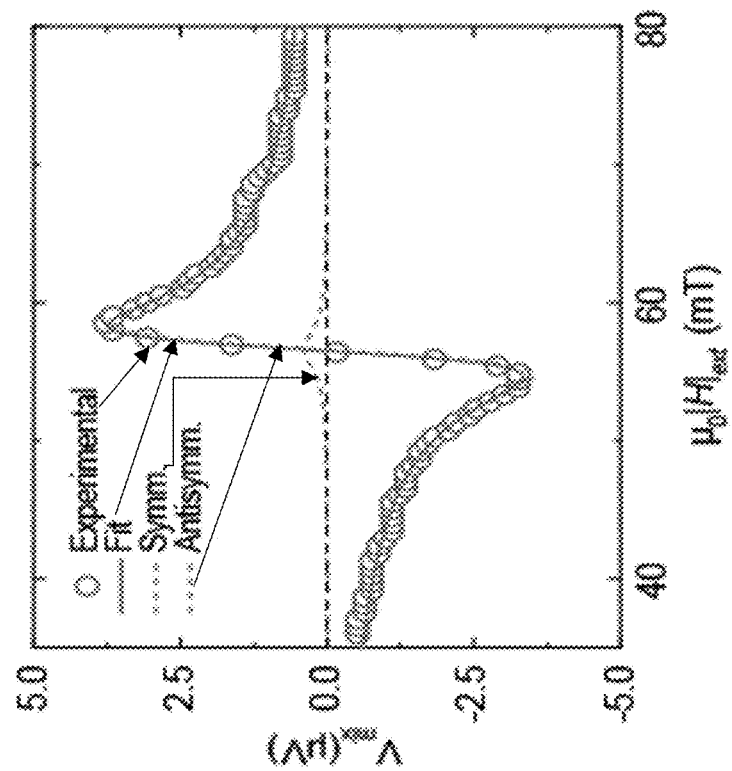
FIGS. 11A and 11B show ST-FMR measurements on an ex-situ Py deposition and a bare Py control sample.
Figure 11A:
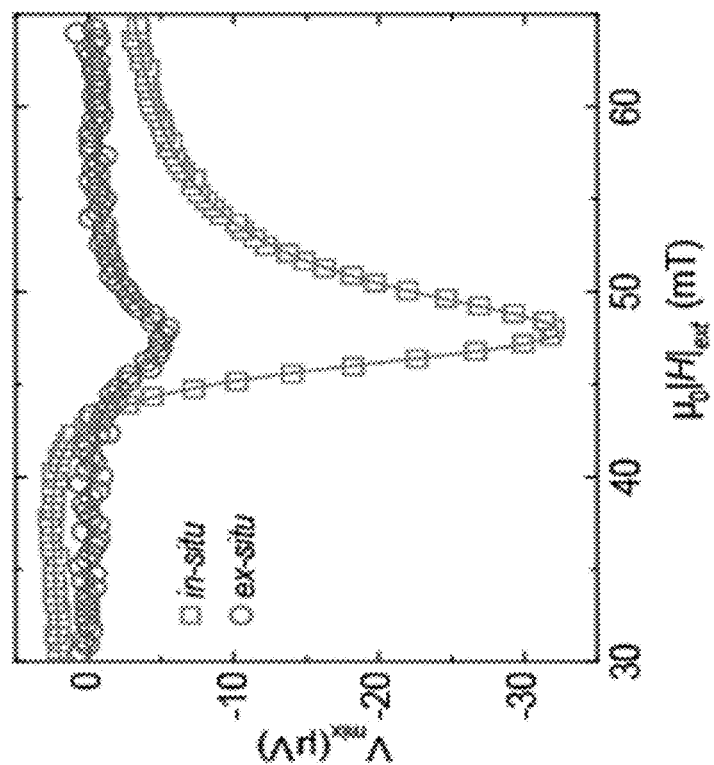

ST-FMR measurements were also performed on an ex-situ grown $Py/SrIrO_3$ sample since the $Py/SrIrO_3$ interfacial transparency plays an important role in the spin current transmission and the spin torque generation. FIG. 11A shows the ST-FMR spectra for the ex-situ and in-situ grown $Py/SrIrO_3$ sample. For the ex-situ sample, Py was deposited after breaking the chamber vacuum for 2 minutes. Two samples have the same layered structure (3.5 nm Py/20 uc $SrIrO_3$) and similar $SrIrO_3$ film quality characterized with XRD and AFM. At the same ST-FMR measurement condition (12 dBm, 6 GHz), the in-situ sample shows a much higher S and A amplitudes. Assuming both samples have the same microwave current flow during the measurements, the in-situ sample would exhibit much higher spin torque ratio. This suggests that the non-idea $Py/SrIrO_3$ interface decreases the spin mixing conductance.

To check any spurious effect from the non-uniform current distribution at microwave frequency, ST-FMR measurements were performed on the single layer Py sample. FIG. 11B shows the ST-FMR spectrum of a 10 nm Py/LSAT sample. The symmetric component of the Py sample was negligibly small and opposite to that of $Py/SrIrO_3$ samples. The observed small antisymmetric component could be attributed to the FMR rectification or non-uniform current distribution in Py.

Figure 12A:
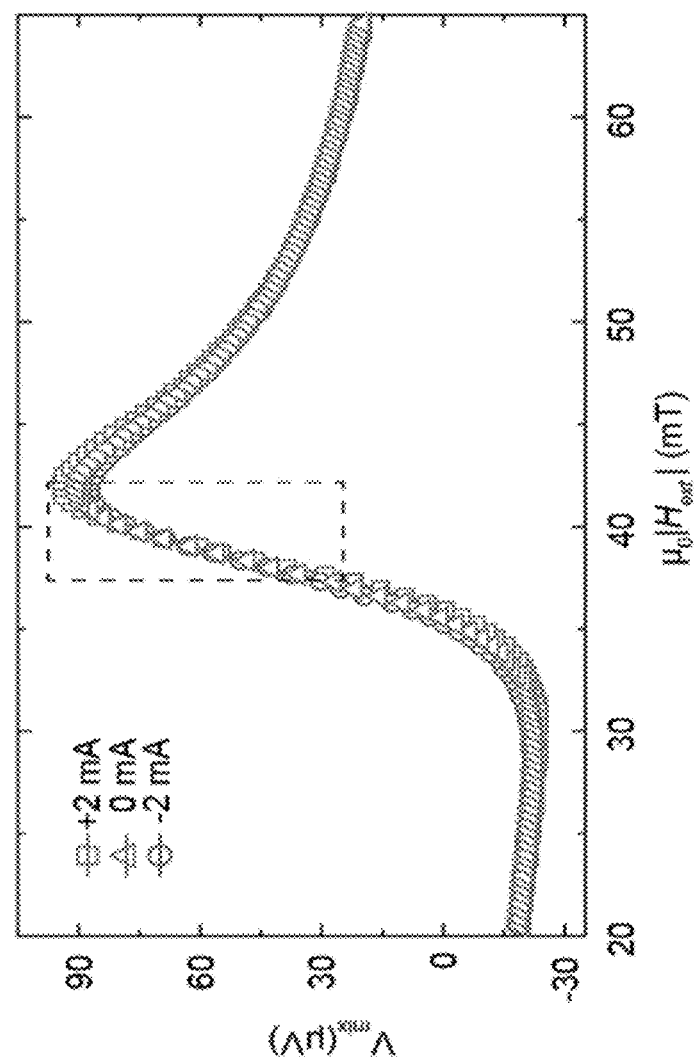
FIGS. 12A-12D show ST-FMR measurements on a Pt/Py control sample.
Figure 12B:
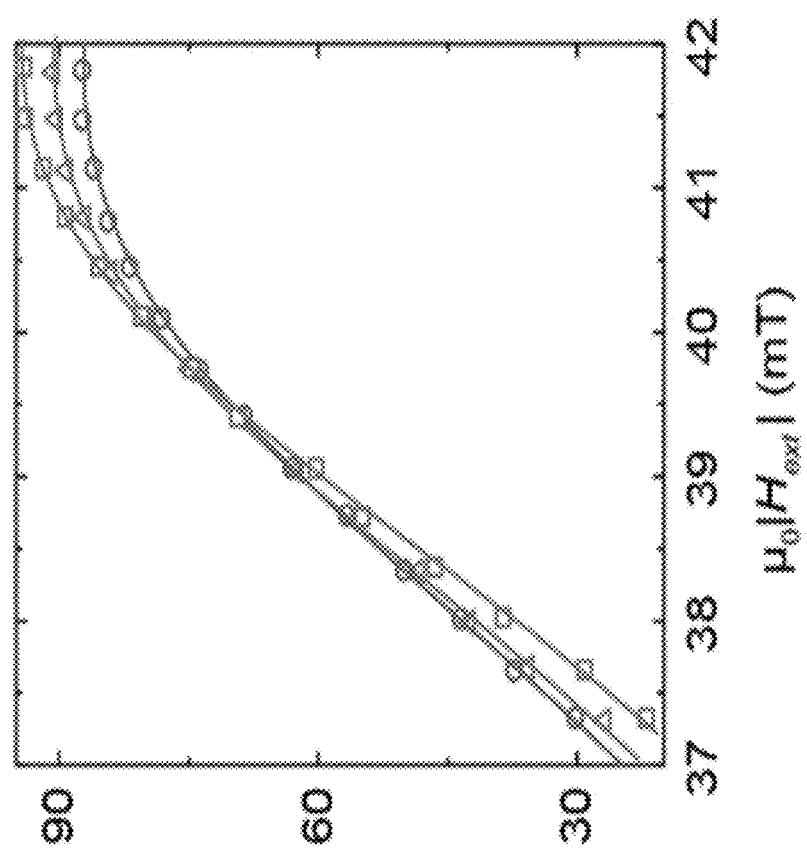
Figure 12C:
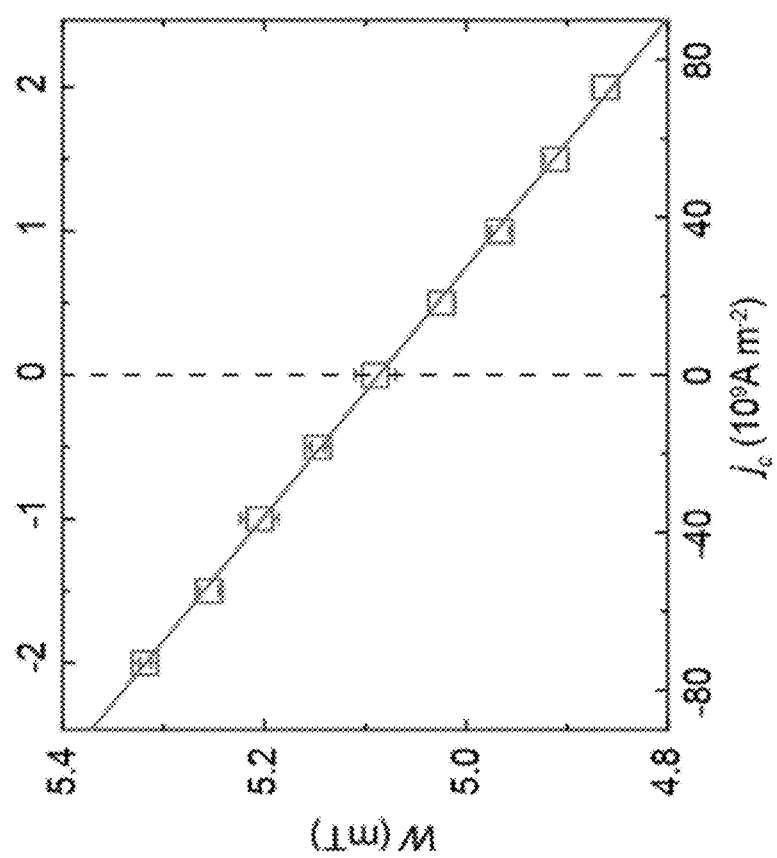
Figure 12D:
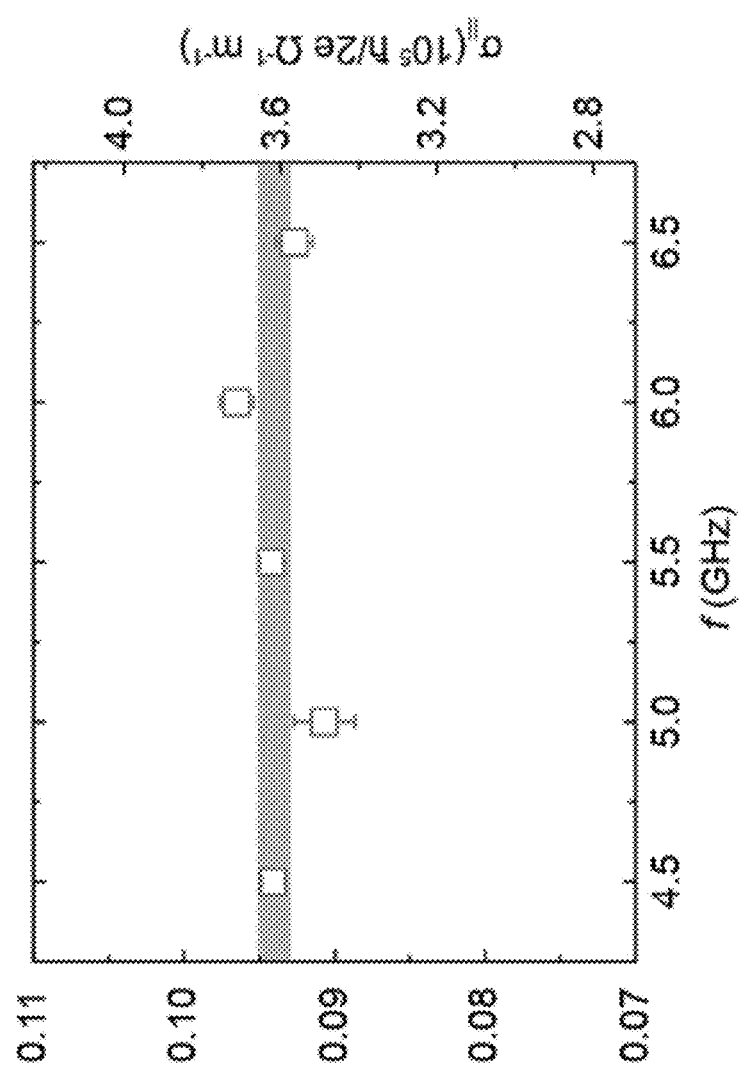

ST-FMR measurement and dc-tuned analysis were also performed on a 4 nm Pt/4 nm $Py/SrTiO_3$ sample as shown in FIGS. 12A, 12B and 12C. The resistivity of Pt is 26 $\mu\Omega$ cm, and its current fraction is 0.73. In a 5 $\mu$m wide, 10 $\mu$m long device, 2 mA dc current were injected, which modified the ST-FMR spectrum (FIG. 12A). By fitting the change of the resonance linewidth as a function of current density in $SrIrO_3$ to a linear function (FIG. 12C), the spin torque ratio was calculated based on Eq. S6. Averaging over various frequencies (FIG. 12D), it was found that the Pt spin torque ratio $\theta_\|=0.093\pm0.002$ and SHC $\sigma_\|=3.57\times10^5$ $\hbar/2e$ $\Omega^{-1}m^{-1}$.

$SrIrO_3$ Transport Property

Figure 13A:
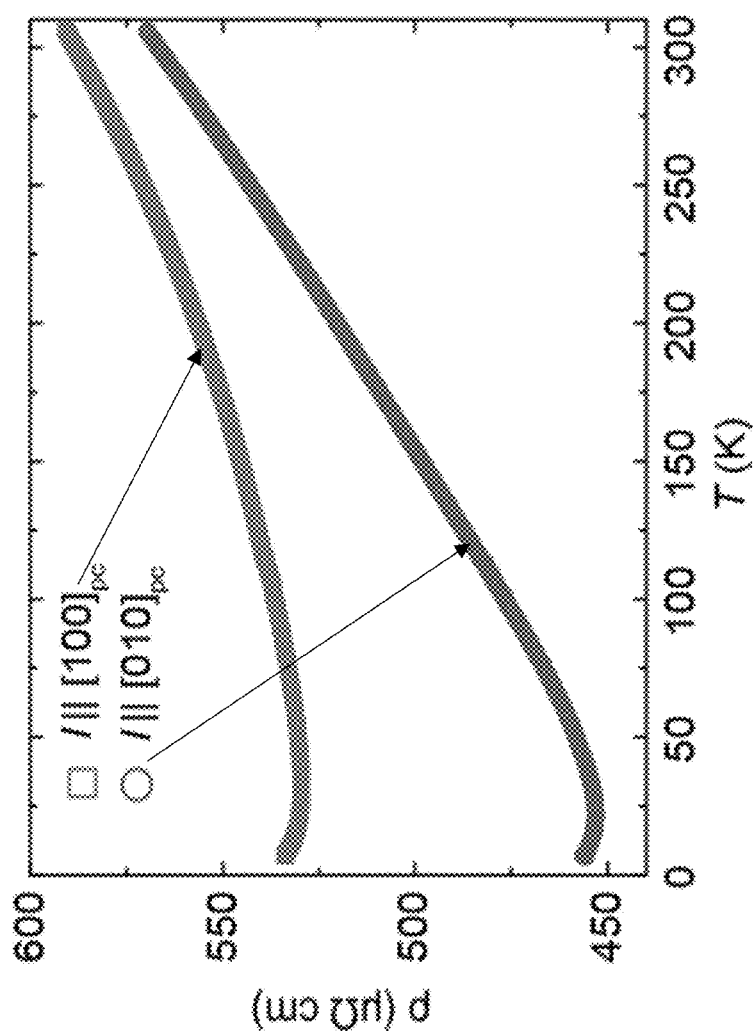
FIGS. 13A and 13B show the transport and dc current fraction of SrIrO$_3$ thin films.

The bare $SrIrO_3$ thin film transport property was measured by using the van der Pauw technique in 5 mm by 5 mm $SrIrO_3/SrTiO_3$ samples. The $SrIrO_3$ room temperature resistivity showed a slight sample-to-sample variation. To determine the anisotropy of the transport property of $SrIrO_3$, the sheet resistance of the $SrIrO_3$ thin film was measured by using a 4-point resistance technique on Hall bars patterned along $[100]_{pc}$ and $[010]_{pc}$ axes. Typical $SrIrO_3$ resistivity versus temperature curves are shown in FIG. 13A exhibiting metallic transport characteristics in both crystalline orientations.

Figure 13B:
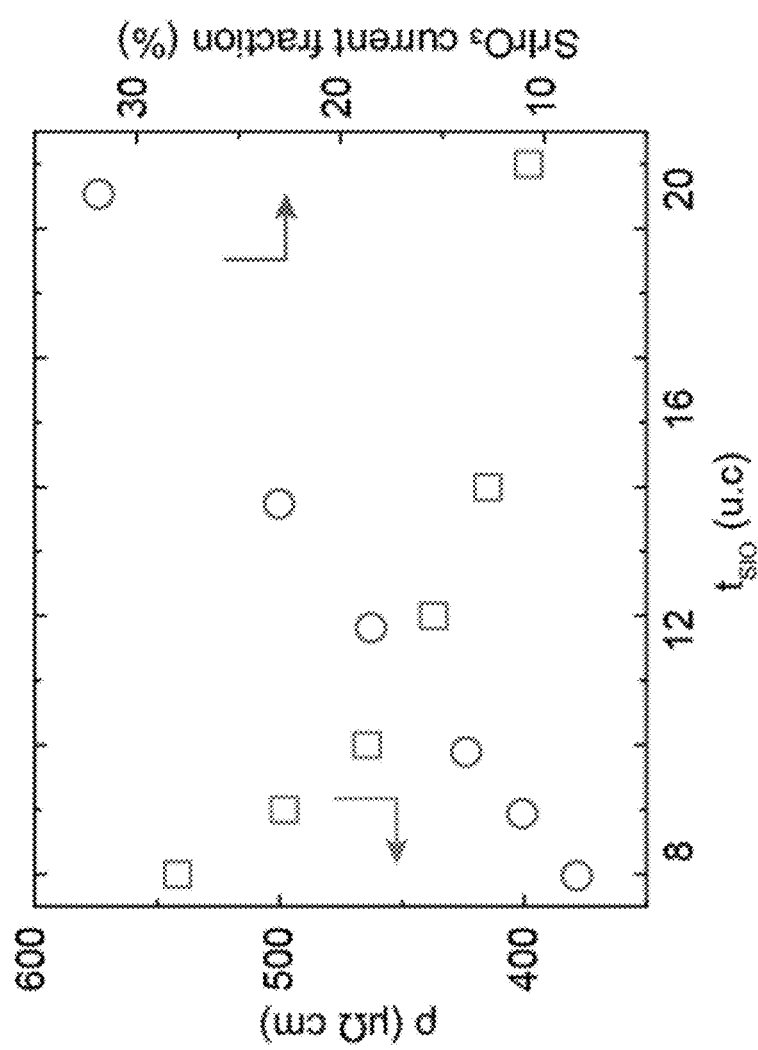

The Py resistivity was measured by using the van der Pauw technique in $Al_2O_3/Py/SrTiO_3$ reference samples. The resistivity for the 3.5 nm Py in this work is 62 $\mu\Omega$ cm. To determine the current fraction of $SrIrO_3$ in each $Py/SrIrO_3$ bilayer samples, the Py and $SrIrO_3$ layers were treated as parallel resistors. The $SrIrO_3$ resistivity and its current fraction were estimated by assuming that the Py resistivity is constant among different samples. FIG. 13B shows the estimated SrIrO$_3$ resistivity and its current fraction as a function of SrIrO$_3$ thickness t$_{SIO}$ in 3.5 nm Py/t$_{SIO}$ SrIrO$_3$/SrTiO$_3$ samples.

Bulk Spin-Hall Conductivity for the Zero Fermi Energy

Figures 14A, 14B, 14C:
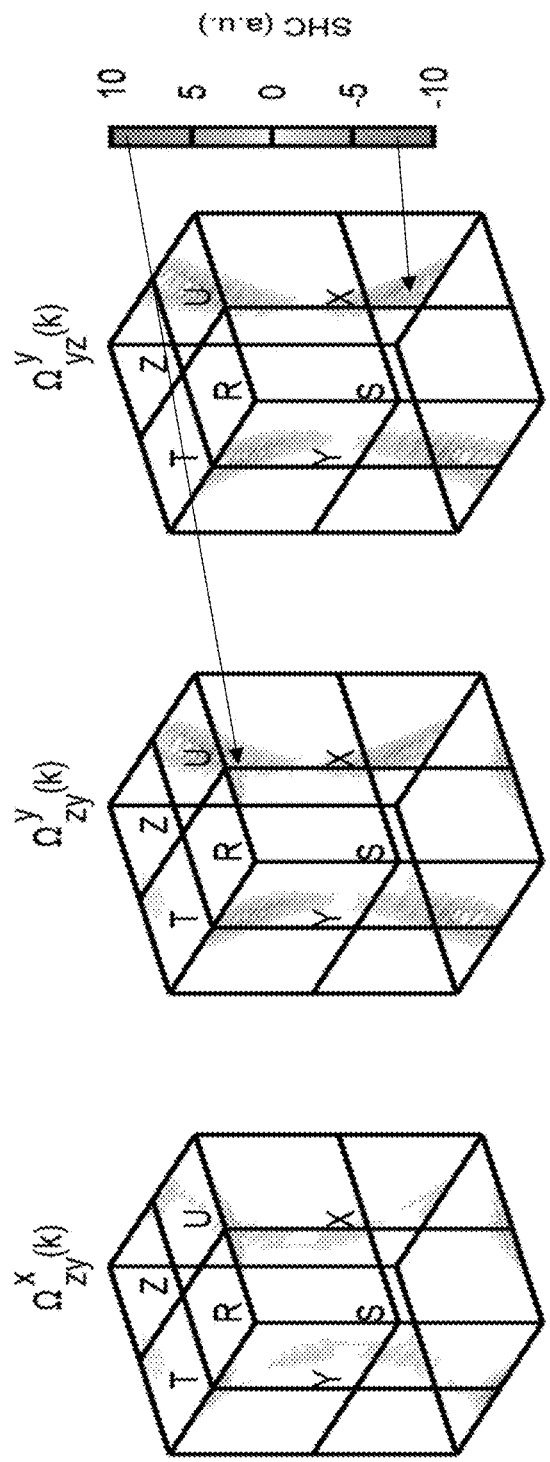
FIGS. 14A-14C depict momentum-resolved spin-Hall conductivity for the zero Fermi energy. The three cases in FIGS. 14A, 14B and 14C correspond to the circles, triangles, and squares curves at the zero energy in FIG. 4D, respectively.

The calculated bulk spin-Hall conductivity is shown in FIG. 4D for the three different measurement geometries in which the system exhibits the largest response. Around the zero Fermi energy (corresponding to charge-neutrality in the bulk system), different patterns of SHC were observed in the three cases. The origin of those patterns can be understood by resolving the SHC in the Brillouin zone as shown in FIGS. 14A, 14B and 14C. Momentum-resolved SHC [$\Omega_{\mu\nu}^{\rho}$(k)] was basically a net Berry curvature of the occupied electron levels at a given k point. The SHC around the zero-energy originated from two different regions of the zone: (i) around the U and T points at the zone boundaries and (ii) interior regions of the zone. Depending on the measurement geometry, these two distinct regions could have a same sign or different signs in the distribution of the net Berry curvature. In the case of $\Omega_{zy}^{y}$(k), the two regions had different signs for the net Berry curvature leading to highly suppressed SHC by cancellation. In the other cases $\Omega_{zy}^{y}$(k) and $\Omega_{yz}^{y}$(k), the overall net Berry curvature had the same sign over the two regions, which resulted in large SHC. Note that the three cases showed very different responses even though they shared the same origin for spin-Hall effect.

Example 2

Figure 17:
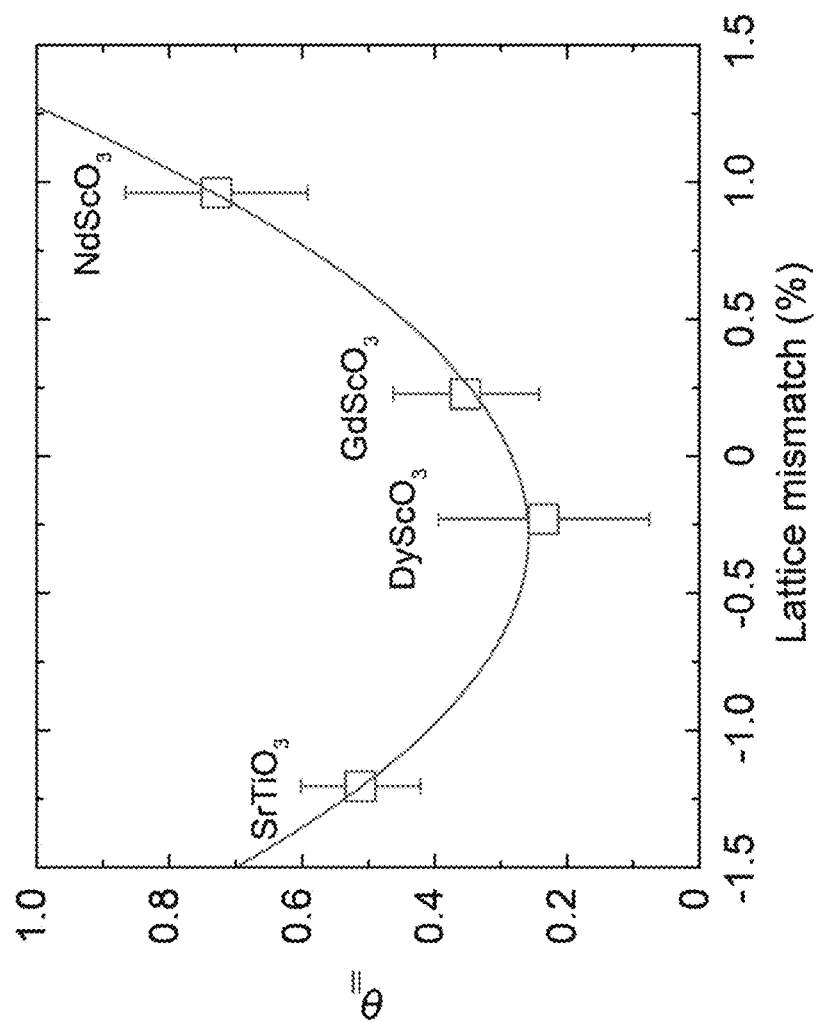
FIG. 17 is a graph of the lattice mismatch-dependent spin-orbit ratio for SrIrO$_3$ films grown on SrTiO$_3$, DyScO$_3$, GdScO$_3$, and NdScO$_3$ with a permalloy (Py) overlayer.

A series of spin-torque studies were also performed for SrIrO$_3$ grown on a DyScO$_3$ substrate, a GdScO$_3$ substrate, and a NdScO$_3$ substrate. The SrIrO$_3$ layers were epitaxially stabilized on all of the substrates, as confirmed by x-ray diffraction. This allowed for a wide range of lattice mismatches between the SrIrO$_3$ and the substrates. The graph in FIG. 17 shows the lattice mismatch-dependent spin-orbit ratio for SrIrO$_3$ films grown to a thickness of 20 unit cells, with the 4 nm permalloy (Py) overlayer. The spin-orbit ratio (as characterized by the spin-torque ferromagnetic resonance) of SrIrO$_3$ on the NdScO$_3$ substrate was comparable to that of SrIrO$_3$ on SrTiO$_3$, but higher than that of SrIrO$_3$ on the DyScO$_3$ and GdScO$_3$ substrates (the data points in the figure are fitted to a parabola function). This indicates that the spin-orbit ratio favors a large compressive/tensile strain. The strong dependency of the spin-orbit ratio on the strain opens a route to design an even higher spin Hall effect in a transition metal perovskite with 5d electrons through band structure engineering.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A magnetic switching device comprising:
    a substrate;
    a layer of electrically conductive, epitaxial, single-crystalline 4d or 5d transition metal perovskite on the substrate, wherein the substrate induces a compressive or tensile strain in the layer of electrically conductive, epitaxial, single-crystalline 4d or 5d transition metal perovskite;
    a layer of ferromagnetic material on the layer of electrically conductive, epitaxial, single-crystalline 4d or 5d transition metal perovskite;
    a first electrode in electrical communication with the layer of electrically conductive, epitaxial, single-crystalline 4d or 5d transition metal perovskite; and
    a second electrode in electrical communication with the layer of electrically conductive, epitaxial, single-crystalline 4d or 5d transition metal perovskite, wherein the first electrode and the second electrode are configured to pass a charge current through the layer of electrically conductive, epitaxial, single-crystalline 4d or 5d transition metal perovskite.

2. The device of claim 1, wherein the 4d or 5d transition metal perovskite is a 5d transition metal perovskite.

3. The device of claim 2, wherein the 5d transition metal perovskite is a 5d iridate perovskite.

4. The device of claim 3, wherein the 5d transition metal perovskite has the crystal structure SrIrO$_3$.

5. The device of claim 4, wherein the SrIrO$_3$ has an in-plane crystallographic orientation of [010].

6. The device of claim 1, wherein the 4d or 5d transition metal perovskite is a 4d transition metal perovskite.

7. The device of claim 6, wherein the 4d transition metal perovskite has the crystal structure SrRuO$_3$.

8. The device of claim 1, further comprising a metal oxide capping layer over the layer of ferromagnetic material.

9. The device of claim 1, wherein the layer of ferromagnetic material comprises a polycrystalline metal alloy.

10. The device of claim 1, wherein the device is a spin-torque magnetic memory device in which the ferromagnetic layer provides a first ferromagnetic layer of a magnetic tunnel junction and the magnetic tunnel junction further comprises a dielectric spacer layer over the first ferromagnetic layer and a second ferromagnetic layer over the dielectric spacer layer.

11. The device of claim 1, further comprising a resistance measuring device configured to measure the resistance of the magnetic tunnel junction.

12. A method of switching the magnetic moment of a layer of ferromagnetic material in a magnetic switching device, the magnetic switching device comprising:
    a substrate;
    a layer of electrically conductive, epitaxial, single-crystalline 4d or 5d transition metal perovskite on the substrate, wherein the substrate induces a compressive or tensile strain on the layer of electrically conductive, epitaxial, single-crystalline 4d or 5d transition metal perovskite;
    a layer of ferromagnetic material on the layer of electrically conductive, epitaxial, single-crystalline 4d or 5d transition metal perovskite;
    the method comprising passing a charge current through the layer of electrically conductive, epitaxial, single-crystalline 4d or 5d transition metal perovskite, whereby a perpendicular spin polarized current is generated in layer of electrically conductive, epitaxial, single-crystalline 4d or 5d transition metal perovskite and directed into the layer of ferromagnetic material, producing a spin-orbit torque in the ferromagnetic material that switches the magnetic moment of the ferromagnetic material.

13. A method of reading and writing memory in a spin-torque magnetoresistance random access memory cell, the spin-torque magnetoresistance random access memory cell comprising:
 a substrate;
 a layer of electrically conductive, epitaxial, single-crystalline 4d or 5d transition metal perovskite on the substrate, wherein the substrate induces a compressive strain on the layer of electrically conductive, epitaxial, single-crystalline 4d or 5d transition metal perovskite; and
 a magnetic tunnel junction on the layer of electrically conductive, epitaxial, single-crystalline 4d or 5d transition metal perovskite, the magnetic tunnel junction comprising:
  a free layer interfaced with the layer of electrically conductive, epitaxial, single-crystalline 4d or 5d transition metal perovskite, the free layer comprising an epitaxial layer of ferromagnetic material;
  a dielectric spacer layer on the free layer; and
  a fixed layer comprising a ferromagnetic material on the dielectric spacer layer,
 the method comprising:
 passing an in-plane charge current through the layer of electrically conductive, epitaxial, single-crystalline 4d or 5d transition metal perovskite, whereby a perpendicular spin polarized current is generated in the layer of electrically conductive, epitaxial, single-crystalline 4d or 5d transition metal perovskite and directed into the free layer, producing a spin-orbit torque in the free layer that switches the magnetic moment of the free layer; and
 measuring the resistance of the magnetic tunnel junction.

* * * * *

UNITED STATES PATENT AND TRADEMARK OFFICE
CERTIFICATE OF CORRECTION

PATENT NO. : 10,566,521 B2
APPLICATION NO. : 16/019831
DATED : February 18, 2020
INVENTOR(S) : Chang-Beom Eom et al.

It is certified that error appears in the above-identified patent and that said Letters Patent is hereby corrected as shown below:

In the Specification

Column 3, Line 35:
Delete the phrase "($\sigma_{zy}{}^x$, $\sigma_{zy}{}^y$, $\sigma_{yz}{}^y$,)" and replace with --$(\sigma_{zy}^x, \sigma_{zy}^y, \sigma_{yz}^y,)$--.

Column 3, Line 37:
Delete the phrase "$\sigma_{\mu\nu}{}^{\rho s}$: υ" and replace with --$\sigma_{\mu\nu}^{\rho_s} \cdot \upsilon$--.

Column 3, Lines 42, 44, 46, and 47:
Delete each instance of the phrase "$\Omega_{zy}{}^x(k)$" and replace with --$\Omega_{zy}^x(k)$--.

Column 12, Line 9:
Delete the phrase "This strong dependency of a on lattice symmetry" and replace with --This strong dependency of $\sigma_\parallel$ on lattice symmetry--.

Column 12, Line 35:
Delete the phrase "$\sigma_{\mu\nu}^{\rho_s}$" and replace with --$\sigma_{\mu\nu}^{\rho_s}$--.

Column 12, Line 41:
Delete the phrase "$\sigma_{zy}{}^x$" and replace with --$\sigma_{zy}^x$--.

Column 12, Lines 45-46:
Delete the phrase "$\sigma_{zy}{}^y$ (triangles) and $\sigma_{yz}{}^y$ (squares)" and replace with --$\sigma_{zy}^y$ (triangles) and $\sigma_{yz}^y$ (squares)--.

Column 12, Lines 50-51:

Signed and Sealed this
Nineteenth Day of May, 2020

Andrei Iancu
*Director of the United States Patent and Trademark Office*

Delete the phrase "the momentum-resolved SHC [$\sigma_{\mu\nu}^{\rho} = \Sigma_k \Omega_{\mu\nu}^{\rho}(k)$]" and replace with --the momentum-resolved SHC [$\sigma_{\mu\nu}^{\rho} = \Sigma_k \Omega_{\mu\nu}^{\rho}(k)$]--.

Column 12, Lines 52-54:
Delete the phrase "distribution of $\Omega_{zy}^{x}(k)$ changed within the Brillouin zone as the Fermi level increased. High intensity of $\Omega_{zy}^{x}(k)$" and replace with --distribution of $\Omega_{zy}^{x}(k)$ changed within the Brillouin zone as the Fermi level increased. High intensity of $\Omega_{zy}^{x}(k)$--.

Column 12, Line 59:
Delete the phrase "were also observed in $\Omega_{zy}^{y}(k)$ and $\Omega_{yz}^{y}(k)$." and replace with --were also observed in $\Omega_{zy}^{y}(k)$ and $\Omega_{yz}^{y}(k)$--.

Column 13, Line 1:
Delete the phrase "the $\sigma_{zy}^{x}$ (circles)" and replace with --the $\sigma_{zy}^{x}$ (circles)--.

Column 14, Line 59:
Delete the phrase "the if current amplitude was modulated" and replace with --the rf current amplitude was modulated--.

Column 15, Line 11:
Delete the phrase "$H = \Sigma_k \psi_k^{\dagger} H_k \psi_k$" and replace with --$H = \Sigma_k \psi_k^{\dagger} H_k \psi_k$--.

Column 15, Line 22:
Delete the phrase "$\sigma_{\mu\nu}^{\rho}$" and replace with --$\sigma_{\mu\nu}^{\rho}$--.

Column 15, Line 25:
Delete the phrase "$\sigma_{\mu\nu}^{\rho} = \Sigma_k \Omega_{\mu\nu}^{\rho}(k)$" and replace with --$\sigma_{\mu\nu}^{\rho} = \Sigma_k \Omega_{\mu\nu}^{\rho}(k)$--.

Column 15, Line 44:
Delete the phrase "$J_{\mu}^{\rho}(= \frac{1}{4}\{\sigma^{\rho}, J^{\mu}\})$" and replace with --$J_{\mu}^{\rho}(= \frac{1}{4}\{\sigma^{\rho}, J_{\mu}\})$--.

Column 15, Line 48:
Delete the phrase "energy $\in_{mk}$." and replace with --energy $\epsilon_{mk}$.--.

Column 15, Line 49:
Delete the phrase "$\Omega_{\mu\nu}^{\rho}(k)$" and replace with --$\Omega_{\mu\nu}^{\rho}(k)$--.

Column 17, Lines 37-38:
Delete the phrase "a is the Gilbert damping coefficient," and replace with --α is the Gilbert damping coefficient,--.

Column 18, Lines 22-24:

CERTIFICATE OF CORRECTION (continued)

Delete the phrase
"and if (squares5.5 GHz) currents, in which they are fitted to a quadratic and a linear function, respectively. The if current was estimated" and replace with
--and rf (squares5.5 GHz) currents, in which they are fitted to a quadratic and a linear function, respectively. The rf current was estimated--.

Column 19, Lines 53-55:

Delete the phrase "$\alpha = \alpha_0 + \frac{g_{op}\mu_B \hbar}{2e^2 M_s t_{SIO}} [\frac{1}{G_{\uparrow\downarrow}} + 2\rho\lambda_s \coth(\frac{t_{SIO}}{\lambda_s})]^{-1}$," and replace with
--$\alpha = \alpha_0 + \frac{g_{op}\mu_B \hbar}{2e^2 M_s t_{SIO}} [\frac{1}{G_{\uparrow\downarrow}} + 2\rho\lambda_s \coth(\frac{t_{SIO}}{\lambda_s})]^{-1}$--.

Column 21, Lines 12-13:
Delete the phrase "Momentum-resolved SHC [$\Omega_{\mu\nu}{}^\rho(k)$]" and replace with --Momentum-resolved SHC [$\Omega^\rho_{\mu\nu}(k)$]--.

Column 21, Line 21:
Delete the phrase "In the case of $\Omega_{zy}{}^x(k)$," and replace with --In the case of $\Omega^x_{zy}(k)$,--.

Column 21, Lines 23-24:
Delete the phrase "In the other cases $\Omega_{zy}{}^y(k)$ and $\Omega_{yz}{}^y(k)$" and replace with --In the other cases $\Omega^y_{zy}(k)$ and $\Omega^y_{yz}(k)$,--.